(12) United States Patent
Ishii et al.

(10) Patent No.: US 9,761,501 B2
(45) Date of Patent: Sep. 12, 2017

(54) METHOD OF MANUFACTURING A SEMICONDUCTOR DEVICE AND INSPECTING AN ELECTRICAL CHARACTERISTIC THEREOF USING SOCKET TERMINALS

(71) Applicant: Renesas Electronics Corporation, Koutou-ku, Tokyo (JP)

(72) Inventors: Toshitsugu Ishii, Ibaraki (JP); Naohiro Makihira, Tokyo (JP); Hidekazu Iwasaki, Tokyo (JP); Jun Matsuhashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 10 days.

(21) Appl. No.: 14/783,851

(22) PCT Filed: Apr. 11, 2013

(86) PCT No.: PCT/JP2013/060967
§ 371 (c)(1),
(2) Date: Oct. 10, 2015

(87) PCT Pub. No.: WO2014/167693
PCT Pub. Date: Oct. 16, 2014

(65) Prior Publication Data
US 2016/0064291 A1   Mar. 3, 2016

(51) Int. Cl.
*H01L 21/66* (2006.01)
*H01L 23/00* (2006.01)
(Continued)

(52) U.S. Cl.
CPC .......... *H01L 22/14* (2013.01); *G01R 1/06738* (2013.01); *G01R 31/40* (2013.01);
(Continued)

(58) Field of Classification Search
CPC ......... H01L 24/83; H01L 24/27; H01L 24/73; H01L 24/81; H01L 24/14; H01L 24/92;
(Continued)

(56) References Cited

U.S. PATENT DOCUMENTS 6,344,753 B1 * 2/2002 Takada ................. H05K 7/1023
324/754.11
6,794,890 B1 * 9/2004 Tokumo ............... G01R 1/0466
324/756.02

(Continued)

FOREIGN PATENT DOCUMENTS

CN    101673729 A    3/2010
EP    1 826 575 A2   8/2007
(Continued)

OTHER PUBLICATIONS

Office Action issued Aug. 23, 2016, in Japanese Patent Application No. 2015-511033.
(Continued)

*Primary Examiner* — Benjamin Sandvik
*Assistant Examiner* — Farid Khan
(74) *Attorney, Agent, or Firm* — Shapiro, Gabor and Rosenberger, PLLC

(57) ABSTRACT

Improvement in yield of a semiconductor device is obtained. In addition, increase in service life of a socket terminal is obtained. A projecting portion PJ1 and a projecting portion PJ2 are provided in an end portion PU of a socket terminal STE1. Thus, it is possible to enable contact between a lead and the socket terminal STE in which a large current is caused to flow, at two points by a contact using the projecting portion PJ1 and by a contact using the projecting portion PJ2, for example. As a result, the current flowing from the socket terminal STE1 to the lead flows by being dispersed into a path flowing in the projecting portion PJ1 and a path
(Continued)

flowing in the projecting portion PJ2. Accordingly, it is possible to suppress increase of temperature of a contact portion between the socket terminal STE1 and the lead even in a case where the large current is caused to flow between the socket terminal STE1 and the lead.

15 Claims, 39 Drawing Sheets

(51) Int. Cl.
    *H01L 25/00*  (2006.01)
    *G01R 31/40*  (2014.01)
    *G01R 1/067*  (2006.01)
    *G01R 31/28*  (2006.01)
    *G01R 1/04*   (2006.01)

(52) U.S. Cl.
    CPC .............. *H01L 24/36* (2013.01); *H01L 24/40* (2013.01); *H01L 24/97* (2013.01); *H01L 25/50* (2013.01); *G01R 1/0466* (2013.01); *G01R 1/0483* (2013.01); *G01R 31/2874* (2013.01); *H01L 2224/32245* (2013.01); *H01L 2224/40095* (2013.01); *H01L 2224/40245* (2013.01); *H01L 2224/48137* (2013.01); *H01L 2224/48247* (2013.01); *H01L 2224/73221* (2013.01); *H01L 2224/73265* (2013.01); *H01L 2224/97* (2013.01); *H01L 2924/13091* (2013.01); *H01L 2924/181* (2013.01)

(58) Field of Classification Search
    CPC .............. H01L 23/3185; H01L 23/498; H01L 23/3737; H01L 23/3135; H01L 25/0657; H01L 21/56; H01L 24/36; H01L 24/97; G01R 31/2896; G01R 31/40
    See application file for complete search history.

(56) References Cited

U.S. PATENT DOCUMENTS

| | | | |
|---|---|---|---|
| 2003/0075796 A1 | 4/2003 | Hata et al. | |
| 2005/0099757 A1* | 5/2005 | Lenz .................. | H01L 24/27 361/200 |
| 2006/0075796 A1* | 4/2006 | Hellgren ............. | B21D 26/039 72/61 |
| 2007/0066122 A1* | 3/2007 | Shin .................... | H01R 43/002 439/404 |
| 2007/0077732 A1 | 4/2007 | Ito et al. | |
| 2007/0236236 A1* | 10/2007 | Shell ................... | G01R 1/0466 324/750.3 |
| 2010/0059875 A1* | 3/2010 | Sato .................... | H01L 23/4952 257/690 |
| 2010/0093229 A1 | 4/2010 | Eldridge et al. | |
| 2010/0327879 A1* | 12/2010 | Yasuzawa .......... | G01R 31/2889 324/537 |
| 2012/0049337 A1* | 3/2012 | Uno ..................... | H01L 24/49 257/676 |

FOREIGN PATENT DOCUMENTS

| | | | |
|---|---|---|---|
| JP | H09-223556 | A | 8/1997 |
| JP | 2000-228262 | A | 8/2000 |
| JP | 2002-041748 | * | 3/2002 |
| JP | 2002-071716 | A | 3/2002 |
| JP | 2002-071748 | A | 3/2002 |
| JP | 2005-277168 | A | 10/2005 |
| JP | 2005-310907 | A | 11/2005 |
| JP | 2007-024613 | A | 2/2007 |
| JP | 2007-096196 | A | 4/2007 |
| JP | 2010-067755 | A | 3/2010 |
| JP | 2010-273541 | A | 12/2010 |
| JP | 2012-220438 | A | 11/2012 |

OTHER PUBLICATIONS

Extended European Search Report issued Nov. 18, 2016, in European Patent Application No. 13882020.4.

Office Action, dated Mar. 28, 2017, in Japanese Patent Application No. 2015-511033.

Office Action, dated Jun. 1, 2017, in Chinese Patent Application No. 201380075525.5.

Office Action, dated Jun. 2, 2017, in Taiwanese Patent Application No. 103110927.

\* cited by examiner

FIG. 6
(A)
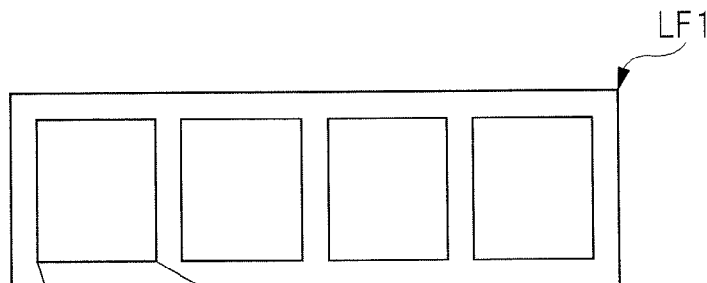
(B)
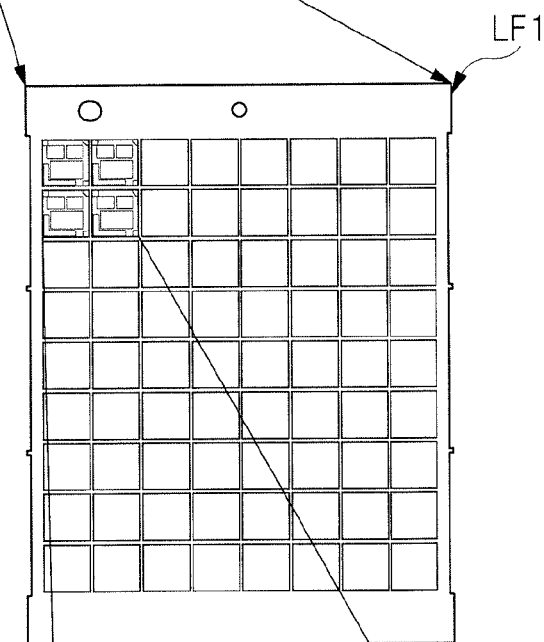
(C)
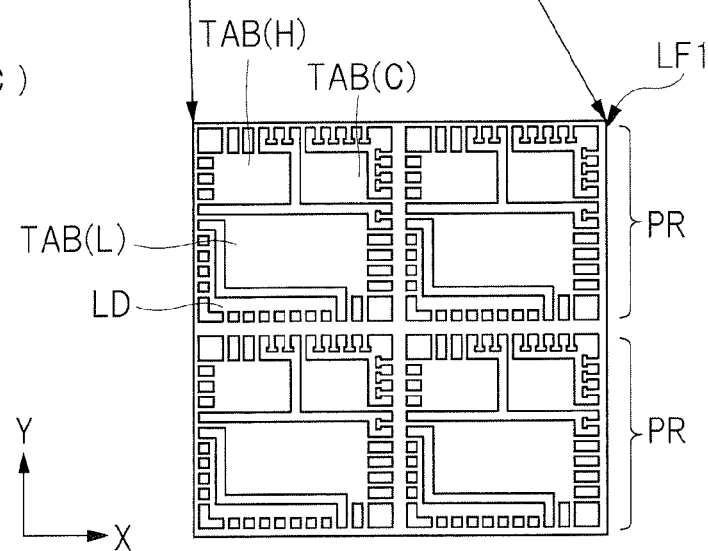

FIG. 11
(A)
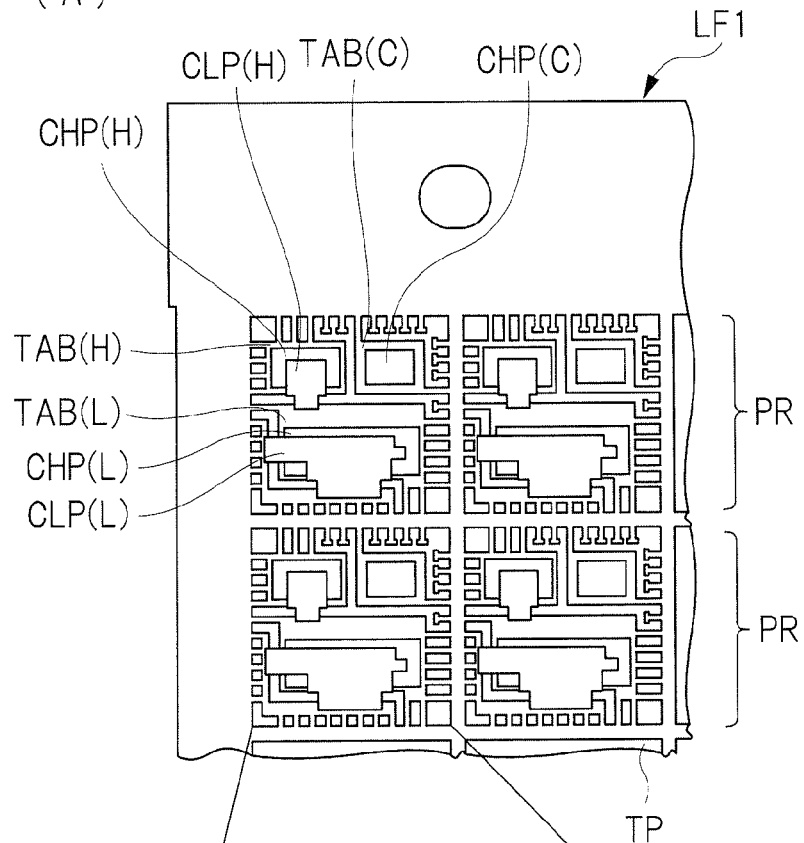
(B)
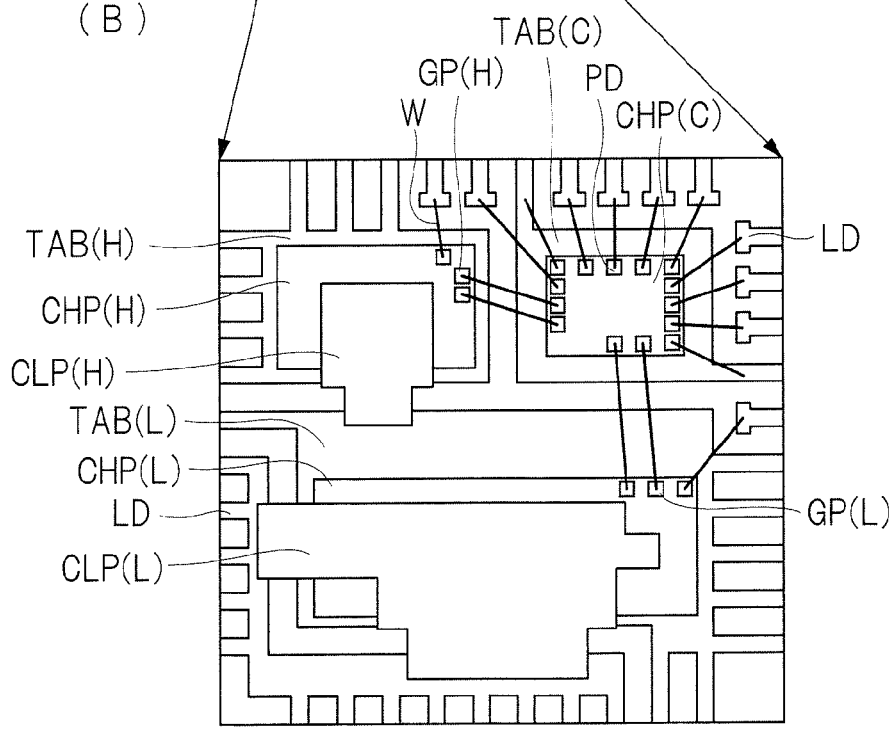

FIG. 12
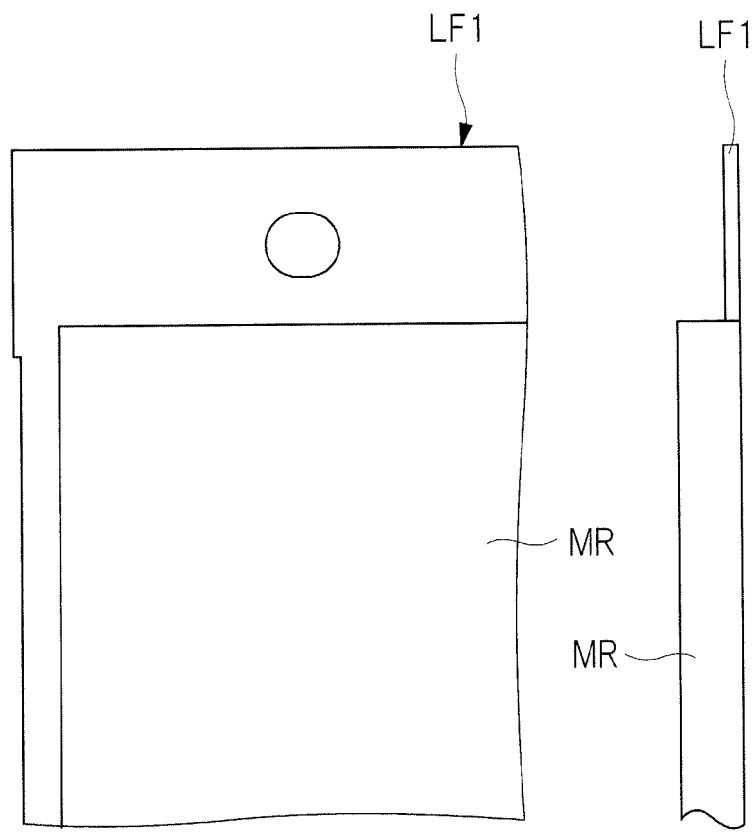
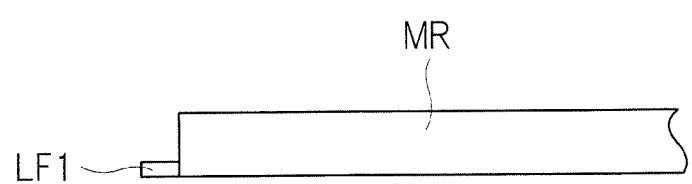

FIG. 14
(A)
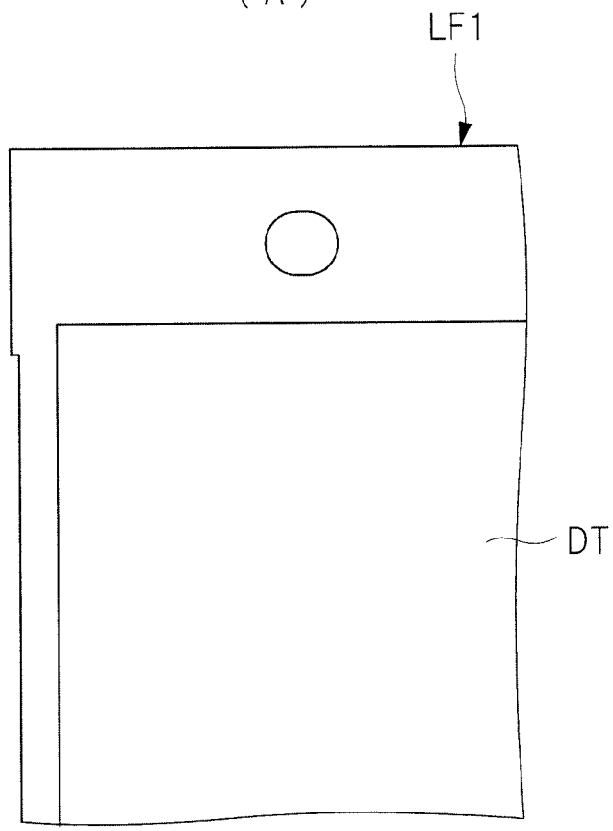
(B)
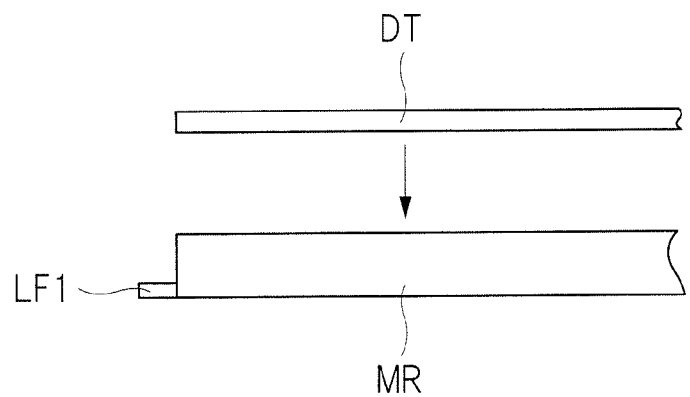

FIG. 15
(A)
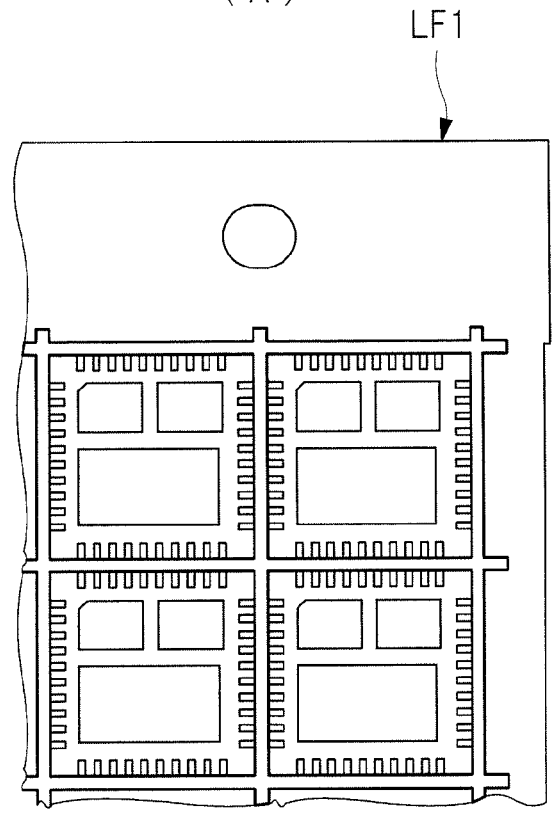
(B)
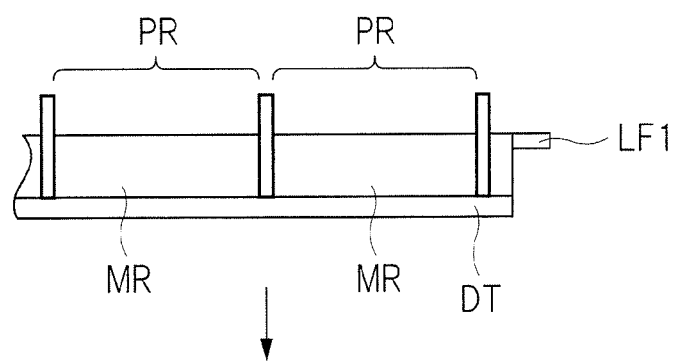
(C)
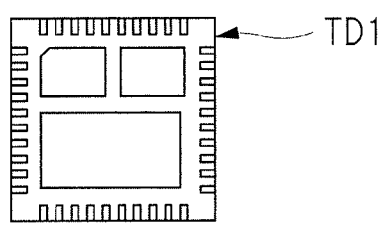

FIG. 31
(A)
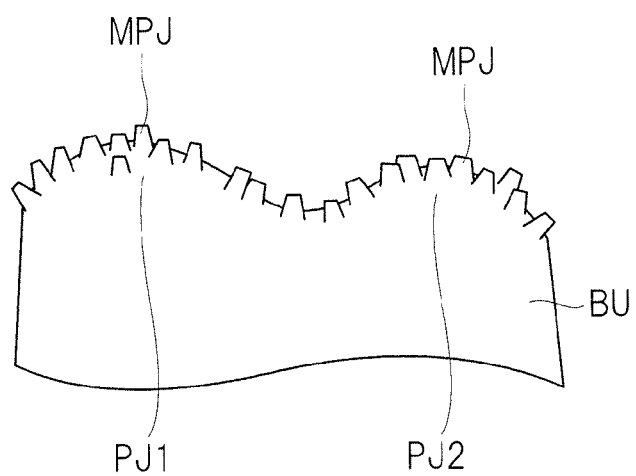
(B)
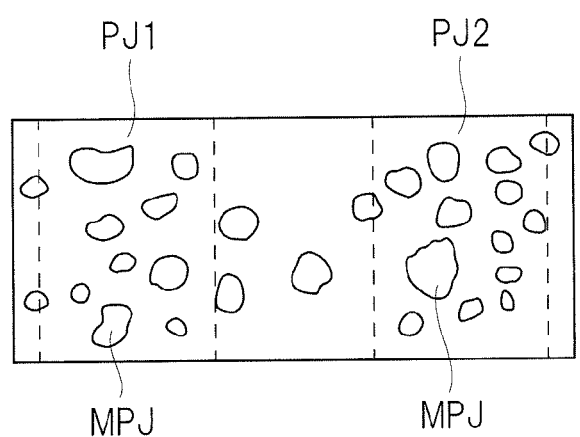

FIG. 33
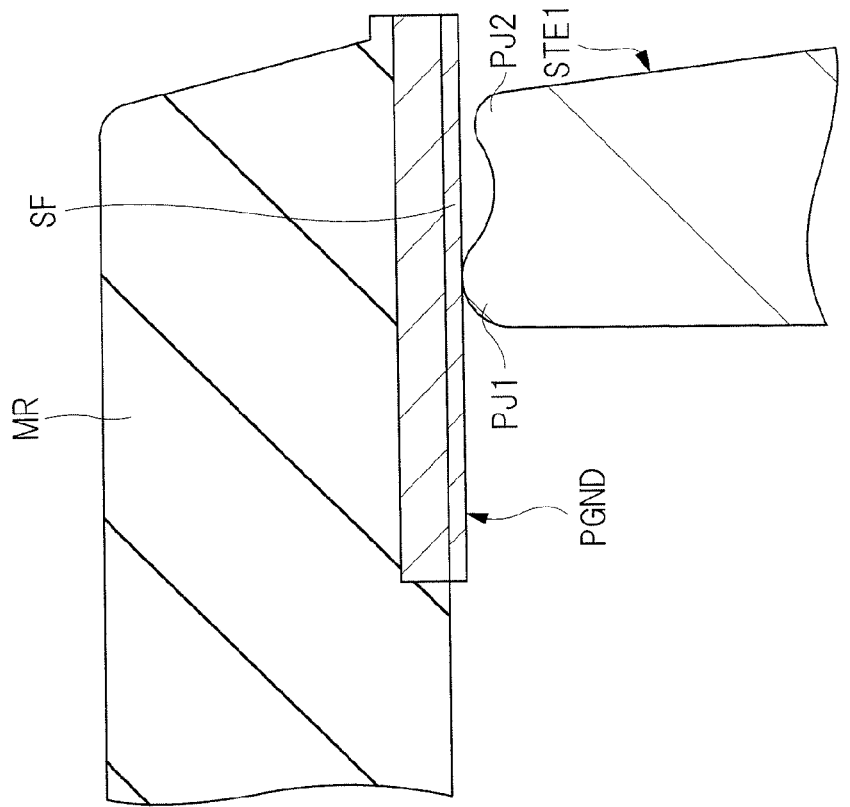
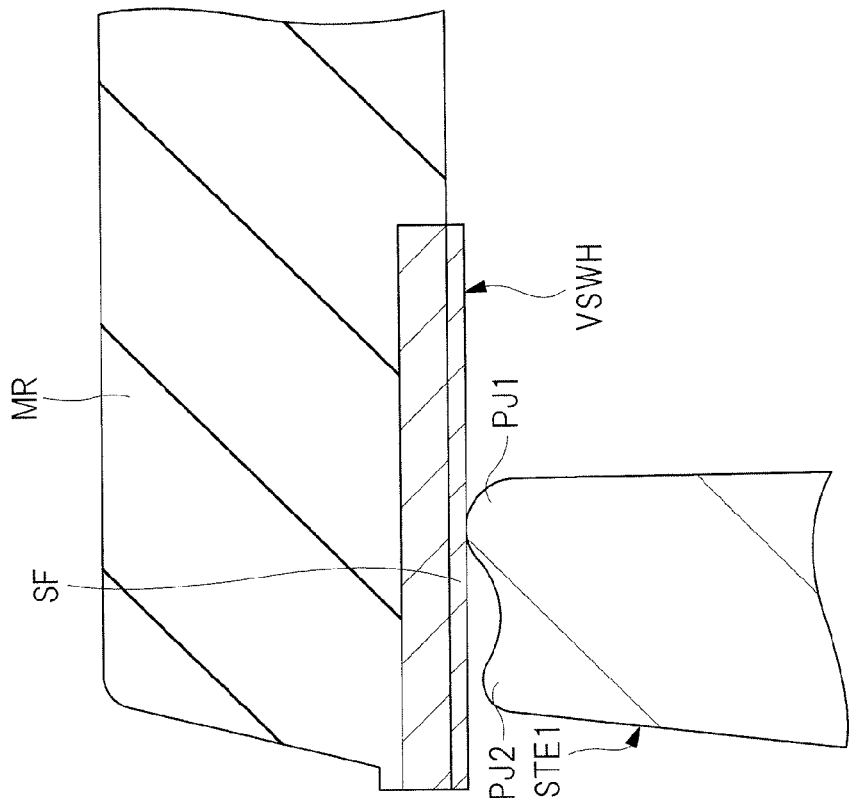

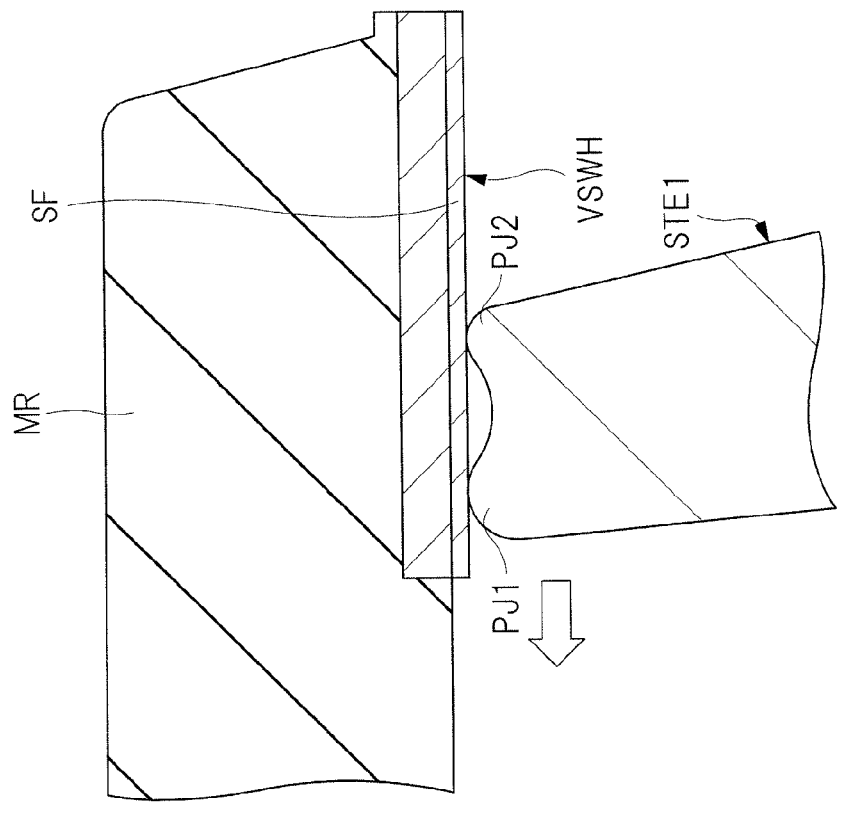
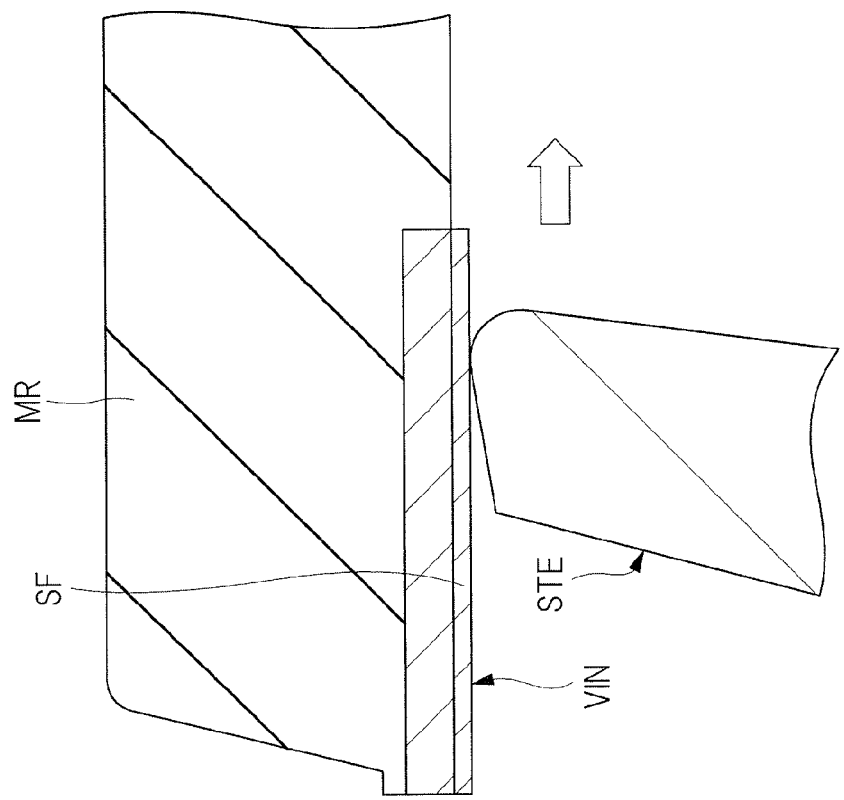
FIG. 35

FIG. 36
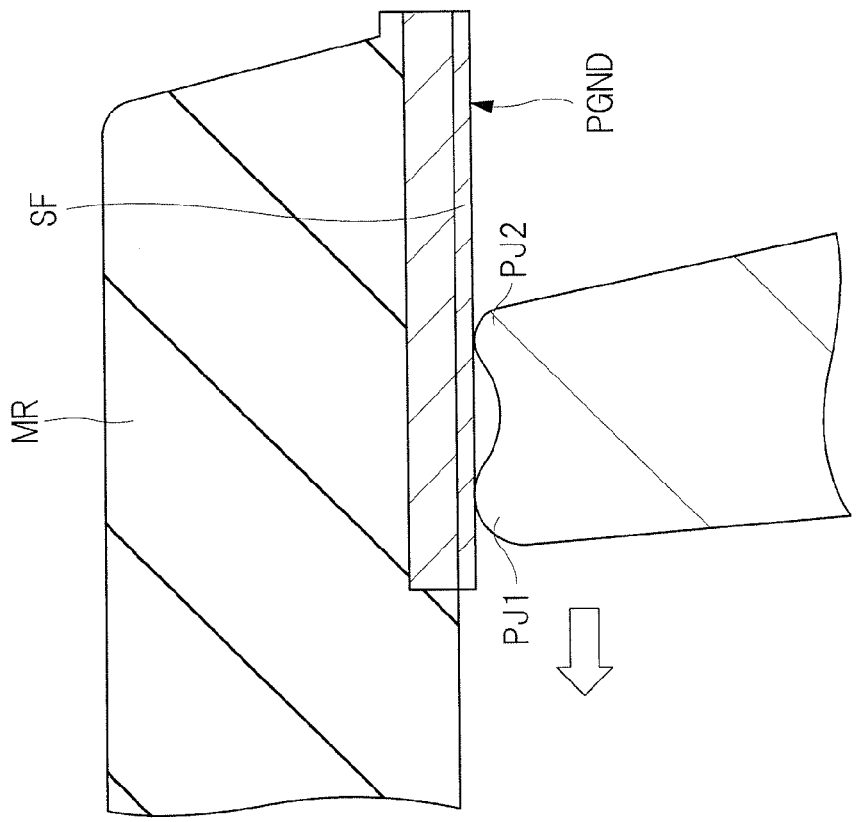
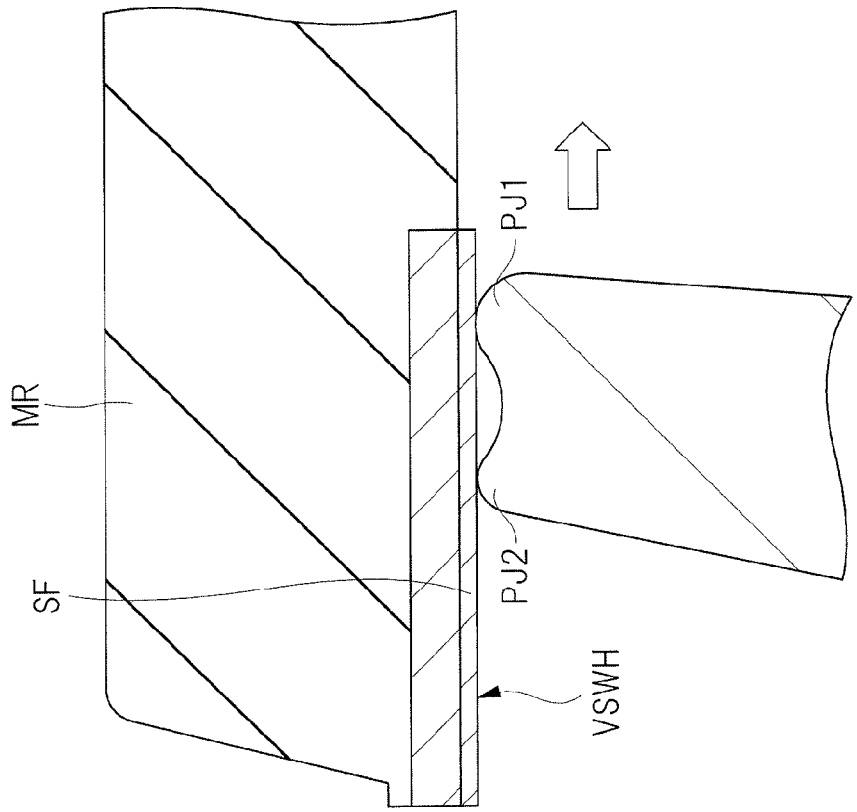

METHOD OF MANUFACTURING A SEMICONDUCTOR DEVICE AND INSPECTING AN ELECTRICAL CHARACTERISTIC THEREOF USING SOCKET TERMINALS

TECHNICAL FIELD

The present invention relates to a method of manufacturing a semiconductor device, and, for example, relates to a method of manufacturing a semiconductor device including a step of inspecting an electrical characteristic of the semiconductor device.

BACKGROUND ART

Japanese Patent Application Laid-Open No. 2010-67755 (Patent Document 1) describes a semiconductor device including a high-side MOSFET (Metal Oxide Semiconductor Field Effect Transistor), a low-side MOSFET and a control circuit which are components of a DC/DC converter.

Japanese Patent Application Laid-Open No. 2002-71716 (Patent Document 2) describes a technique of attaching a compression coil spring in the state of being transversely laid onto a contact pin of an IC socket.

RELATED ART DOCUMENTS

Patent Documents

Patent Document 1: Japanese Patent Application Laid-Open No. 2010-67755
Patent Document 2: Japanese Patent Application Laid-Open No. 2002-71716

SUMMARY OF THE INVENTION

Problems to be Solved by the Invention

There exists an inspection step of inspecting an electrical characteristic of a semiconductor device in a manufacturing process of the semiconductor device. In the inspection process, for example, a socket terminal is contacted with a lead provided in the semiconductor device, and current is caused to flow from the socket terminal to the lead. In this case, the current is supplied to a semiconductor chip to be electrically connected to the lead, and an electrical characteristic of a semiconductor element or the like formed in the semiconductor chip is inspected. As a result of a study of the present inventors, it has been found out that reduction in yield typified by defective appearance of the semiconductor device and reduction in service life of the socket terminal are brought out depending on a mode of connection between the lead and the socket terminal when the amount of current to be supplied increases in particular in the above-described case. Accordingly, it is desired to devise a connection mode between the lead and the socket terminal from a viewpoint of improving the yield of the semiconductor device and obtaining increase in service life of the socket terminal.

The above object and other objects and novel features of the present invention will be apparent from the description of the present specification and the attached drawings.

Means for Solving the Problems

A method of manufacturing a semiconductor device according to an embodiment includes a step of inspecting an electrical characteristic of the semiconductor device. In the step, at least a part of a socket terminal which is contacted with an external terminal provided in the semiconductor device is configured to have a main body portion including a support portion, a plate-like portion connected to the support portion and further including an end portion projected toward a device to be inspected, and a plurality of projecting portions which are integrally provided in the end portion.

Effects of the Invention

According to an embodiment, it is possible to obtain improvement in yield of a semiconductor device.

In addition, according to an embodiment, it is possible to obtain increase in service life of a socket terminal.

BRIEF DESCRIPTIONS OF THE DRAWINGS

FIG. 6(A) schematically illustrates an entire configuration of a lead frame, FIG. 6(B) enlarges and illustrates a part of the lead frame illustrated in FIG. 6(A), and FIG. 6(C) further enlarges and illustrates a part of the lead frame illustrated in FIG. 6(B).

Figure 7:
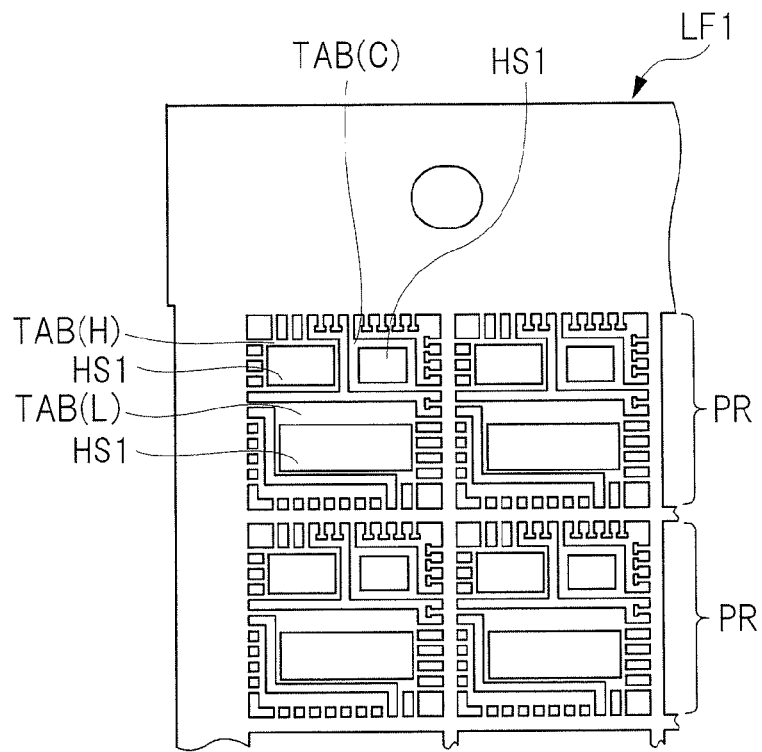

FIG. 7 is a plan view illustrating a manufacturing process of a semiconductor device according to an embodiment.

Figure 8:
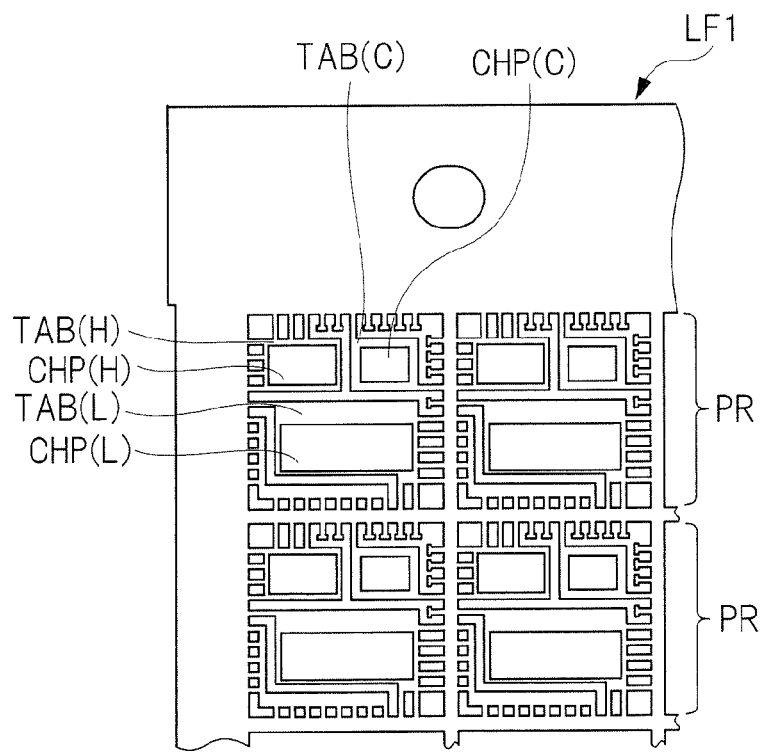

FIG. 8 is a plan view illustrating the manufacturing process of the semiconductor device subsequently to FIG. 7.

Figure 9:
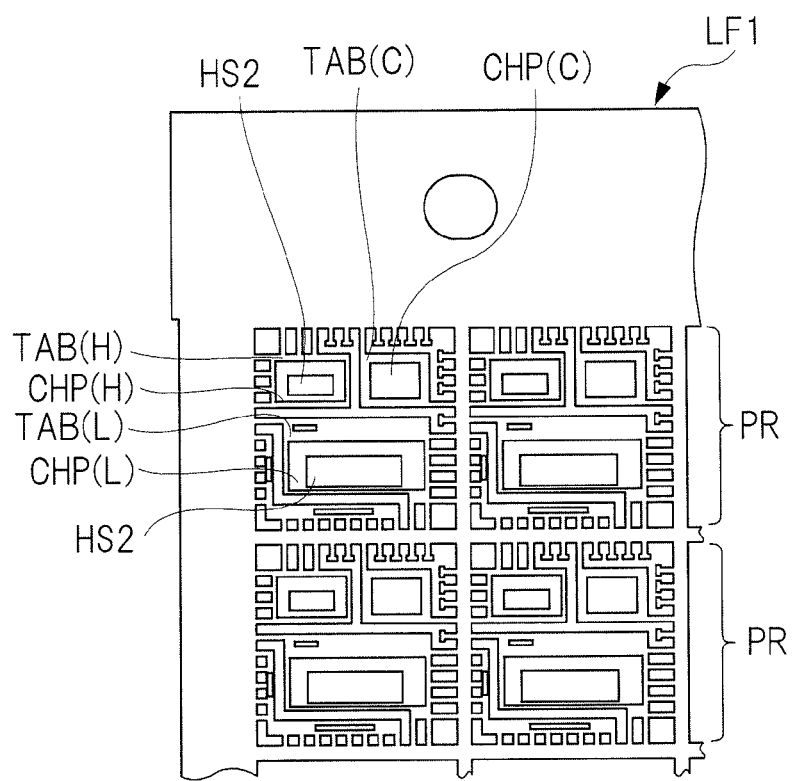

FIG. 9 is a plan view illustrating the manufacturing process of the semiconductor device subsequently to FIG. 8.

Figure 10:
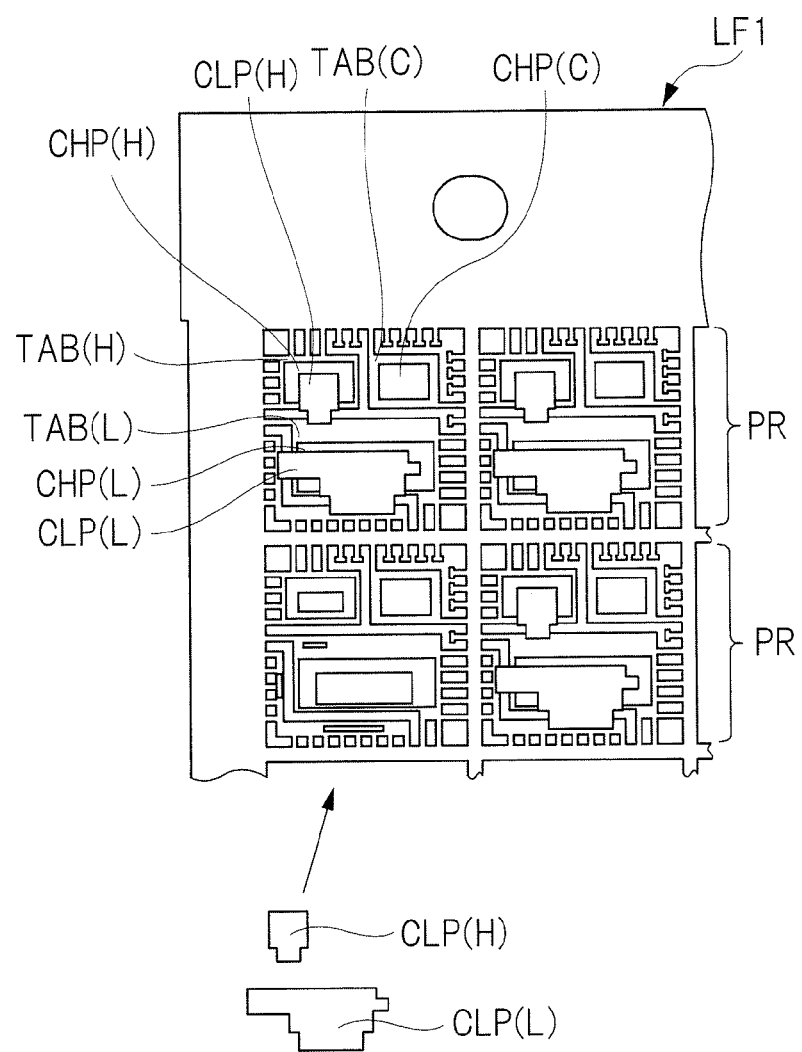

FIG. 10 is a plan view illustrating the manufacturing process of the semiconductor device subsequently to FIG. 9.

FIG. 11(A) is a plan view illustrating the manufacturing process of the semiconductor device subsequently to FIG. 10, and FIG. 11(B) is an enlarged view enlarging a part of FIG. 11(A).

FIG. 12 is a plan view illustrating the manufacturing process of the semiconductor device subsequently to FIG. 11.

Figure 13:
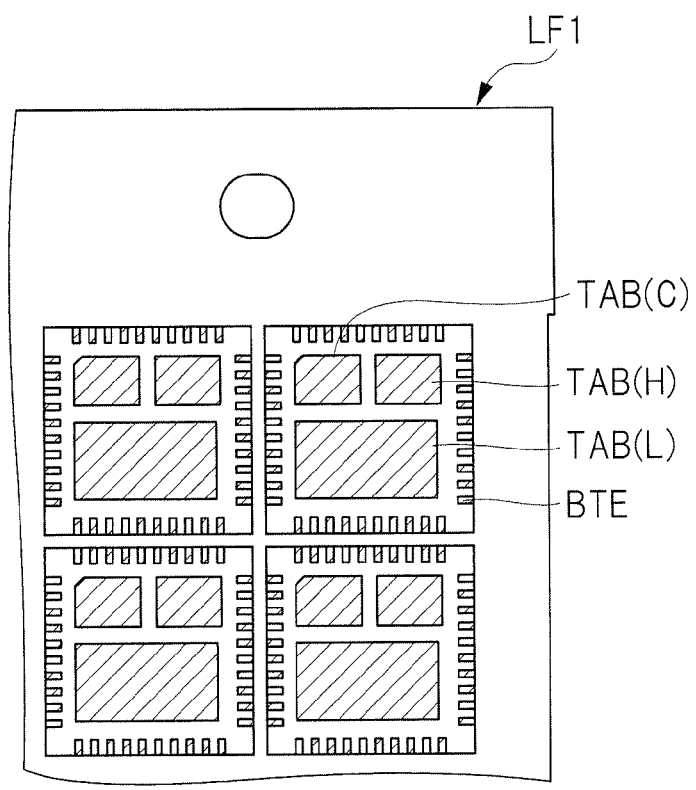

FIG. 13 is a plan view illustrating the manufacturing process of the semiconductor device subsequently to FIG. 12.

FIG. 14(A) is a plan view illustrating the manufacturing process of the semiconductor device subsequently to FIG. 13, and FIG. 14(B) is a side view of FIG. 14(A).

FIG. 15 illustrates the manufacturing process of the semiconductor device subsequently to FIG. 14, and FIG. 15(A) is a plan view illustrating the corresponding process, FIG. 15(B) is a side view illustrating the corresponding process, and FIG. 15(C) is a plan view illustrating the semiconductor device cut into individual pieces through the corresponding process.

Figure 16:
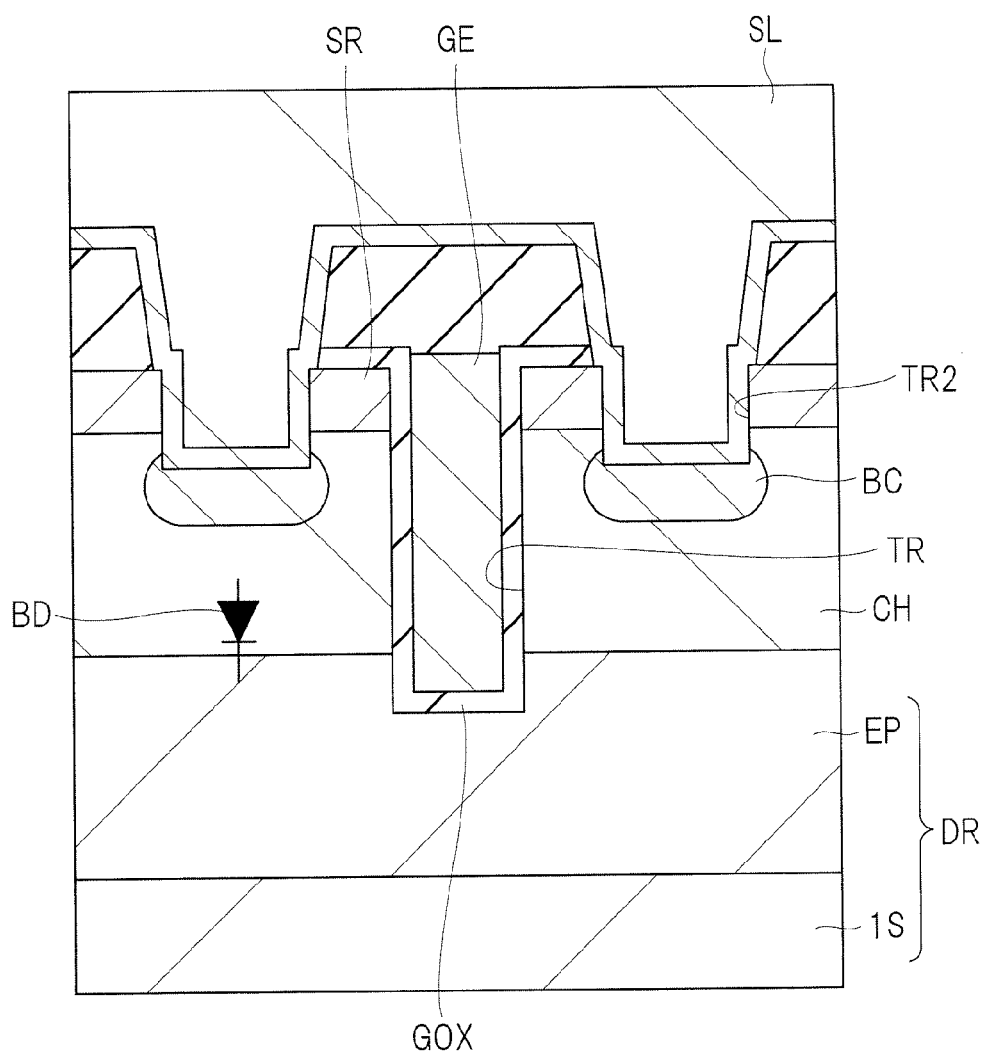

FIG. 16 is a diagram illustrating a cross-sectional configuration example of a power MOS transistor.

Figure 17:
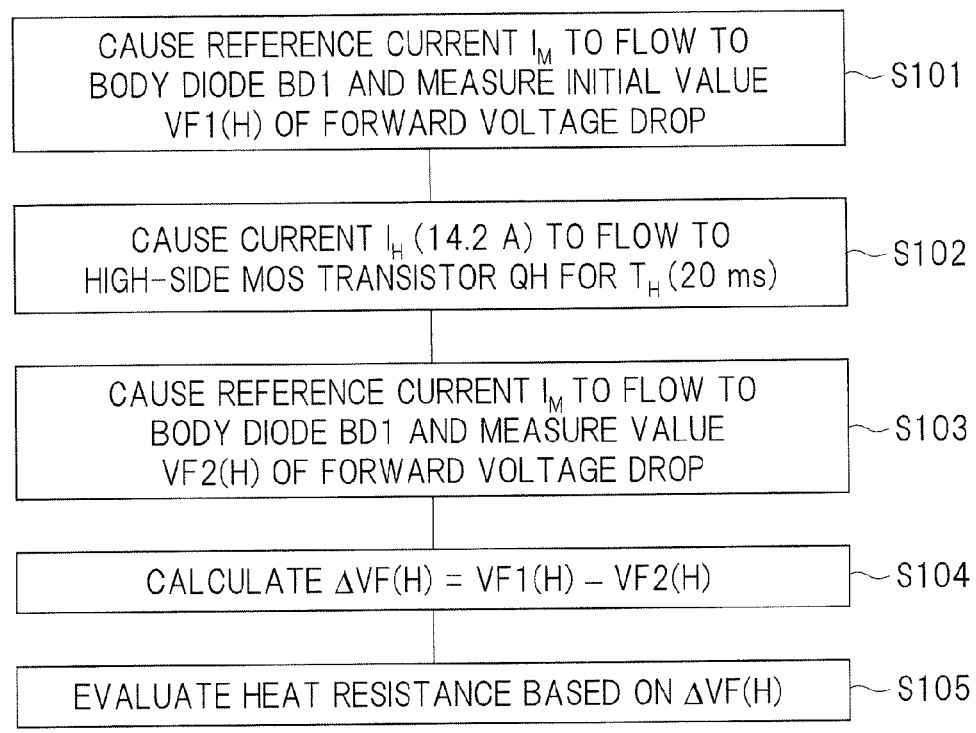

FIG. 17 is a flowchart illustrating a flow of a test process in which a thermal resistance of a high-side MOS chip configuring a DC/DC converter is evaluated.

Figure 18:
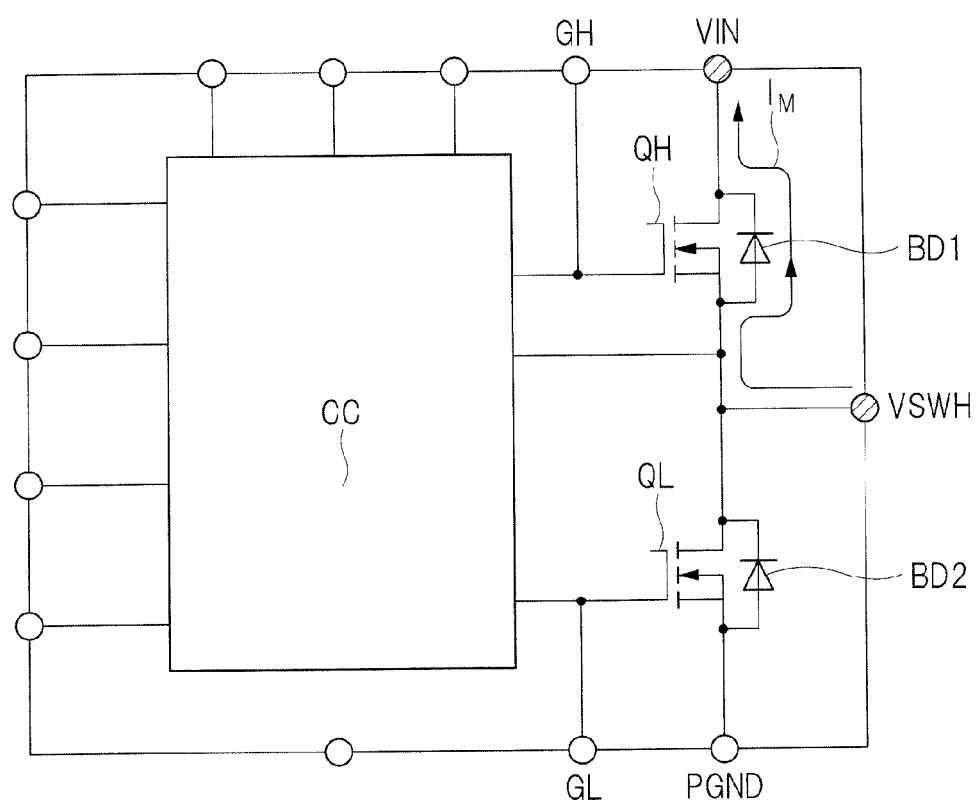

FIG. 18 is a circuit block diagram illustrating a high-side MOS transistor, a low-side MOS transistor and a control circuit, which are components of a DC/DC converter, and is a diagram in which a VF of a body diode in a room temperature state is measured.

Figure 19:
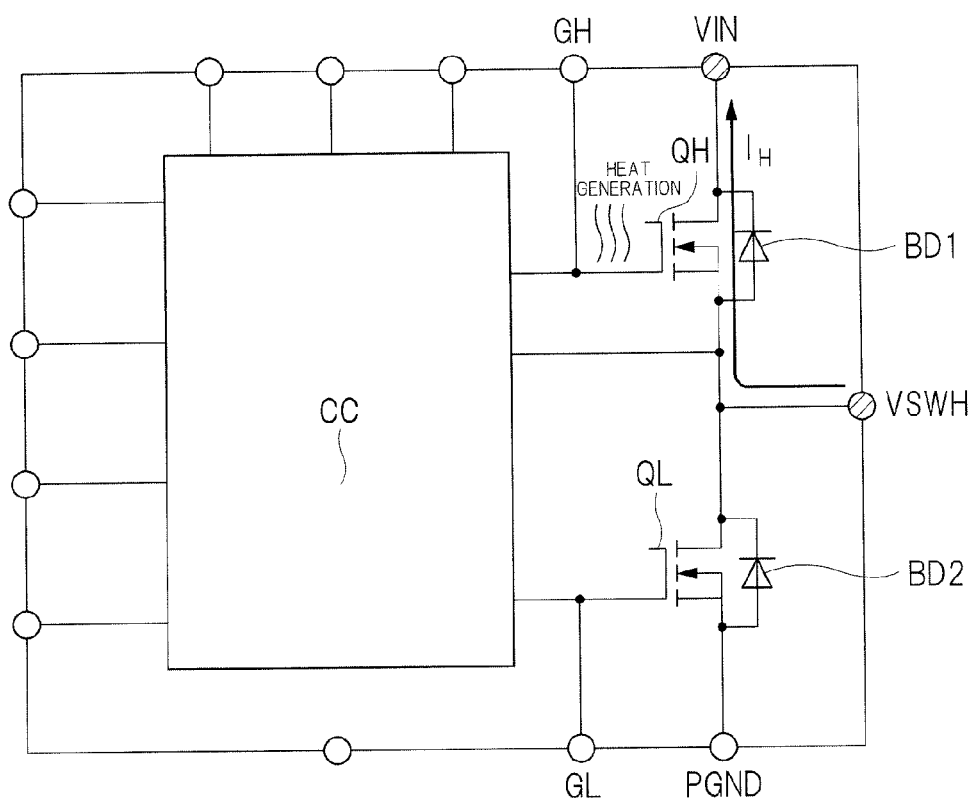

FIG. 19 is a circuit block diagram including the high-side MOS transistor, the low-side MOS transistor and the control circuit, which are the components of the DC/DC converter, and is a diagram in which a heating current is caused to flow to the high-side MOS transistor.

Figure 20:
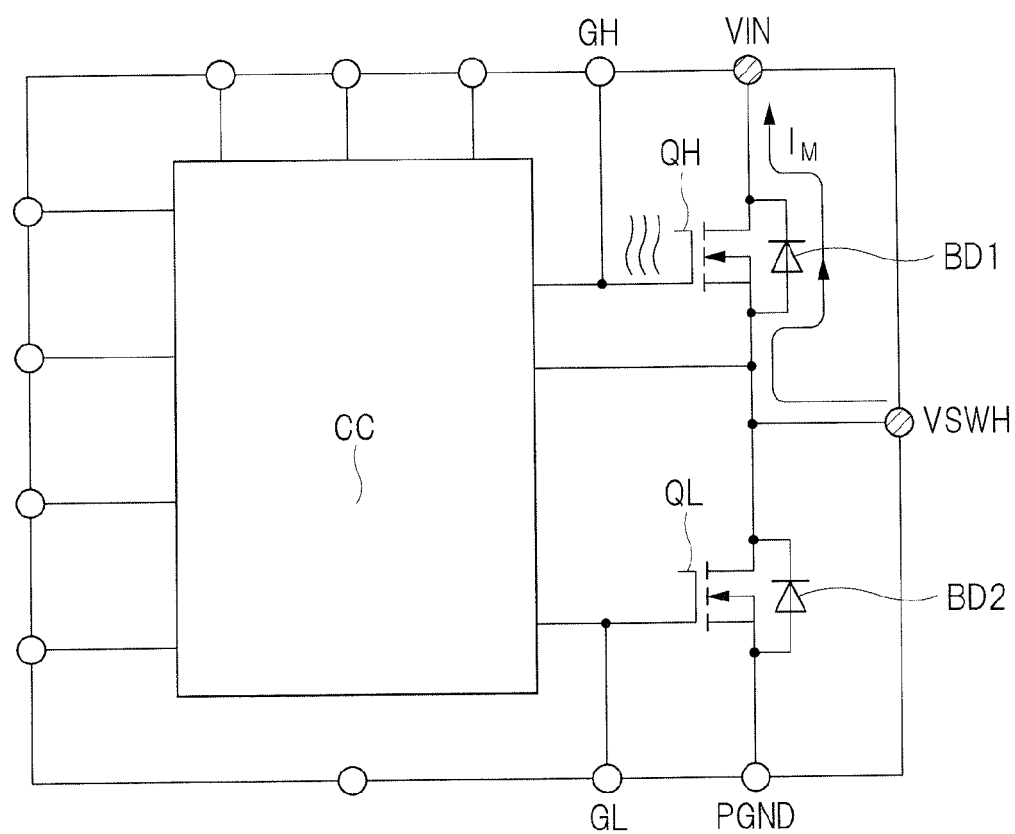

FIG. 20 is a circuit block diagram including the high-side MOS transistor, the low-side MOS transistor and the control circuit, which are the components of the DC/DC converter, and is a diagram in which a VF of the body diode in a heated state is measured.

Figure 21:
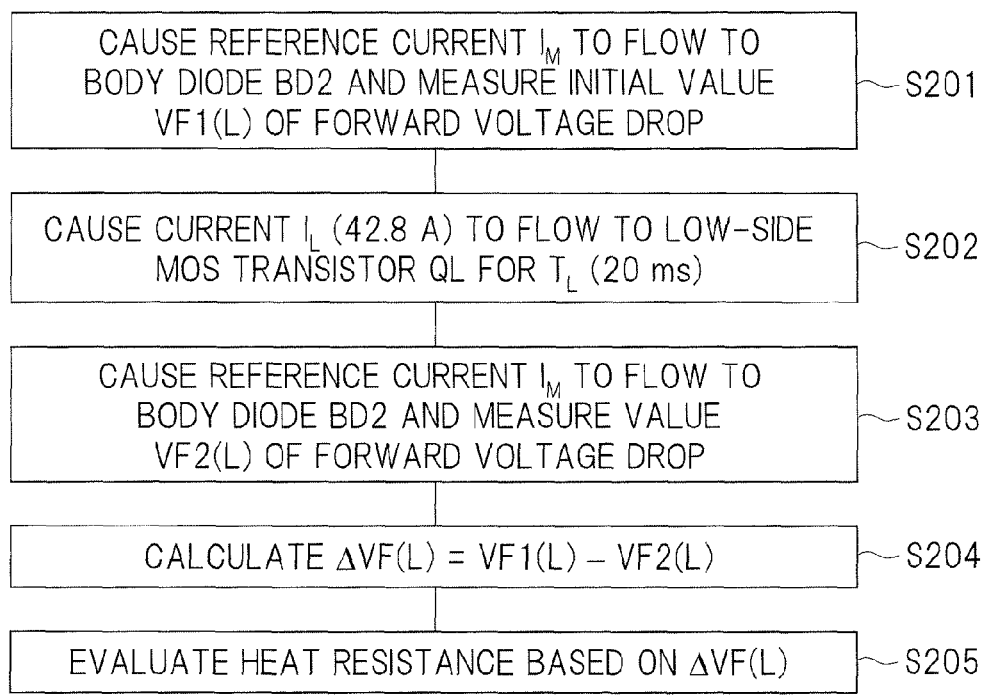

FIG. 21 is a flowchart illustrating a flow of a test process in which a thermal resistance of a low-side MOS chip configuring a DC/DC converter is evaluated.

Figure 22:
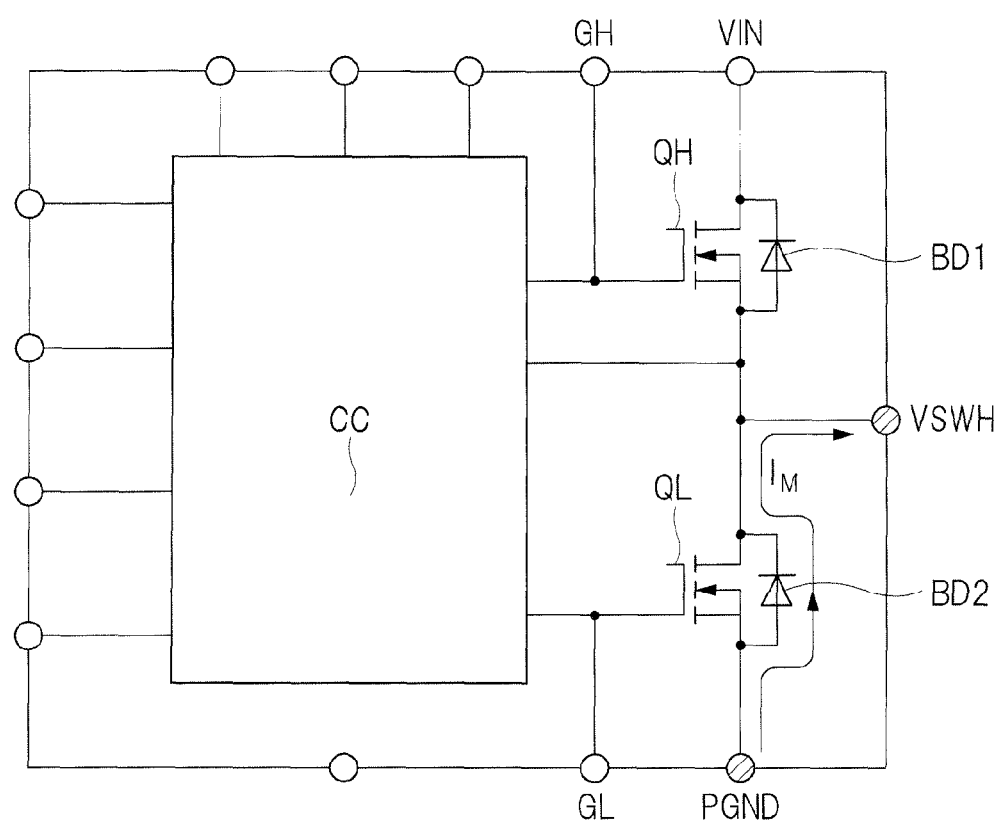

FIG. 22 is a circuit block diagram illustrating the high-side MOS transistor, the low-side MOS transistor and the control circuit, which are the components of the DC/DC converter, and is a diagram in which a VF of the body diode in a room temperature state is measured.

Figure 23:
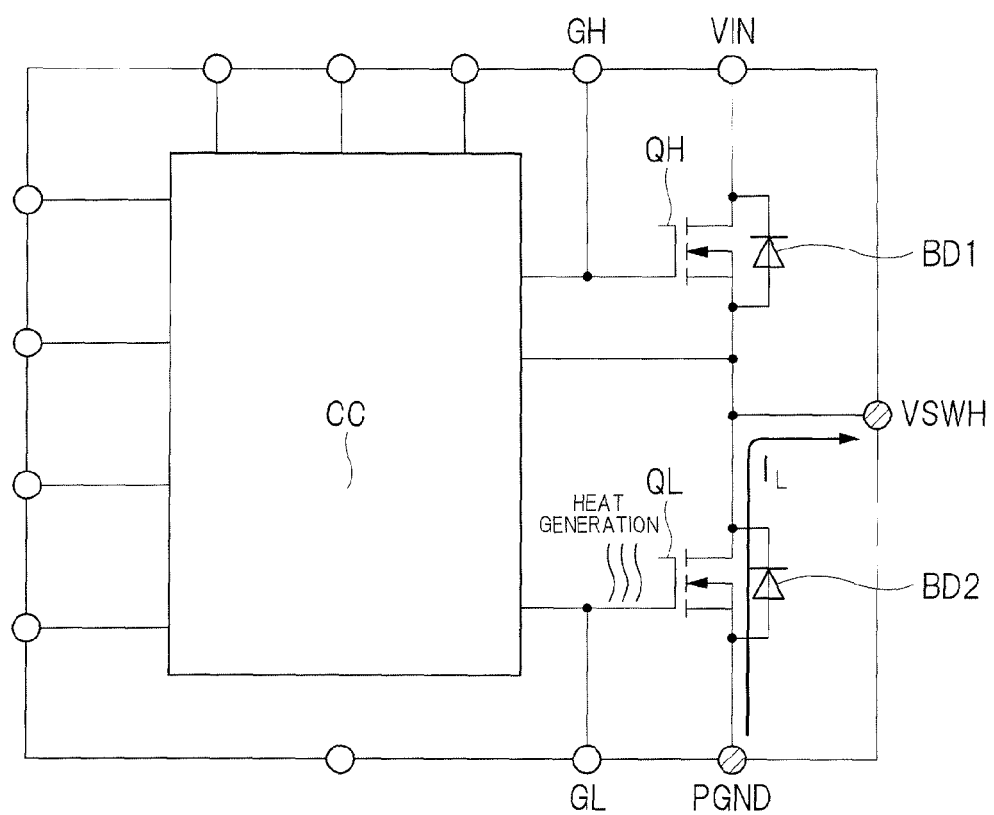

FIG. 23 is a circuit block diagram including the high-side MOS transistor, the low-side MOS transistor and the control circuit, which are the components of the DC/DC converter, and is a diagram in which a heating current is caused to flow to the low-side MOS transistor.

Figure 24:
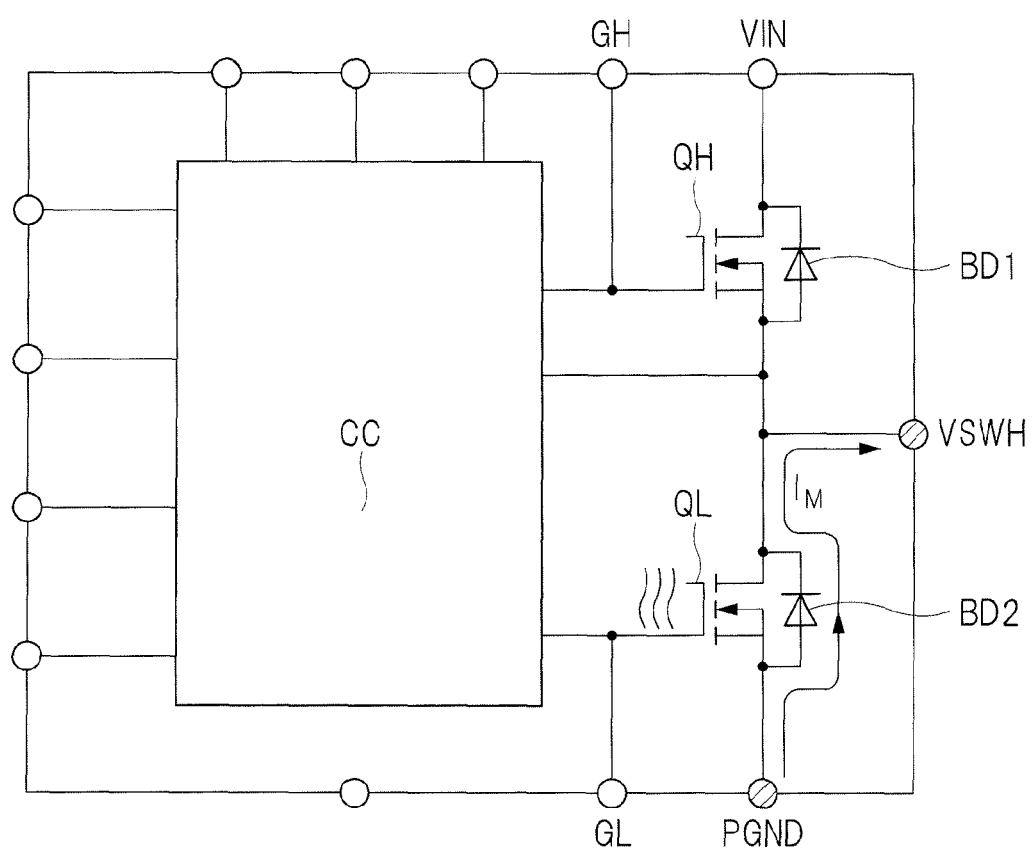

FIG. 24 is a circuit block diagram including the high-side MOS transistor, the low-side MOS transistor and the control circuit, which are the components of the DC/DC converter, and is a diagram in which a VF of the body diode in a heated state is measured.

Figure 25:
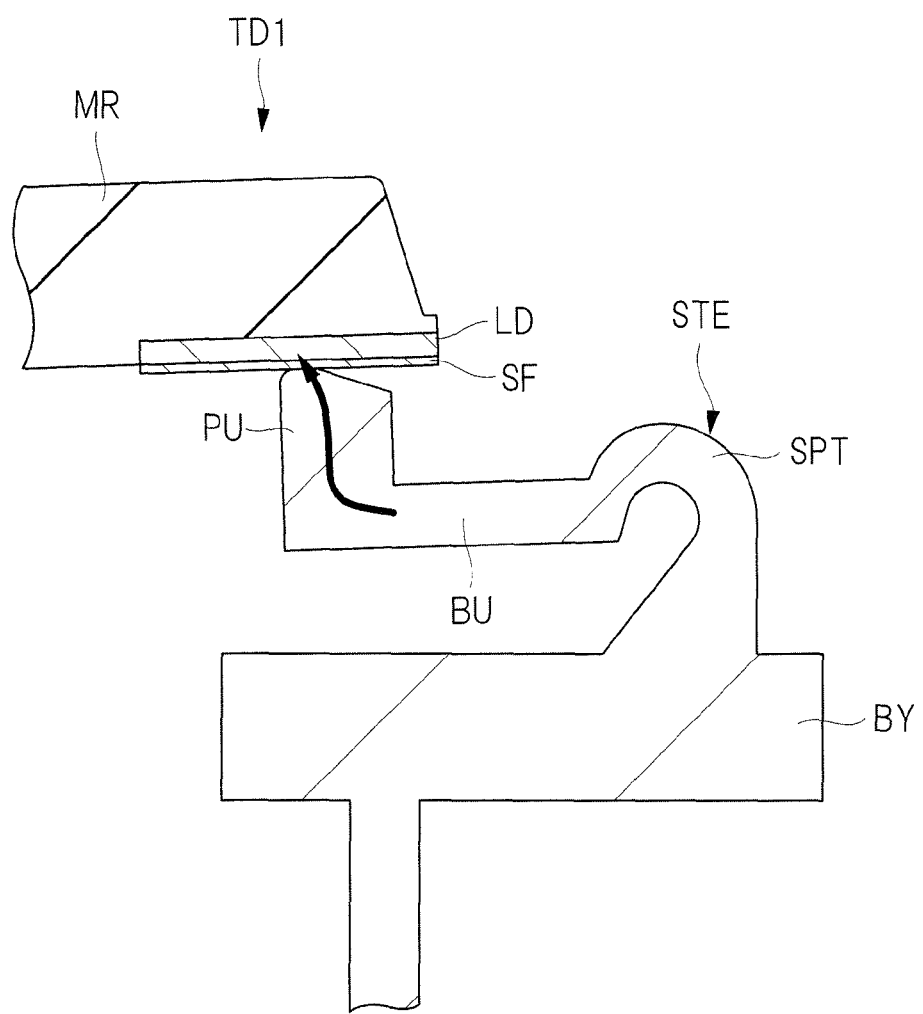

FIG. 25 is a cross-sectional view illustrating a schematic embodiment of the test process.

Figure 26:
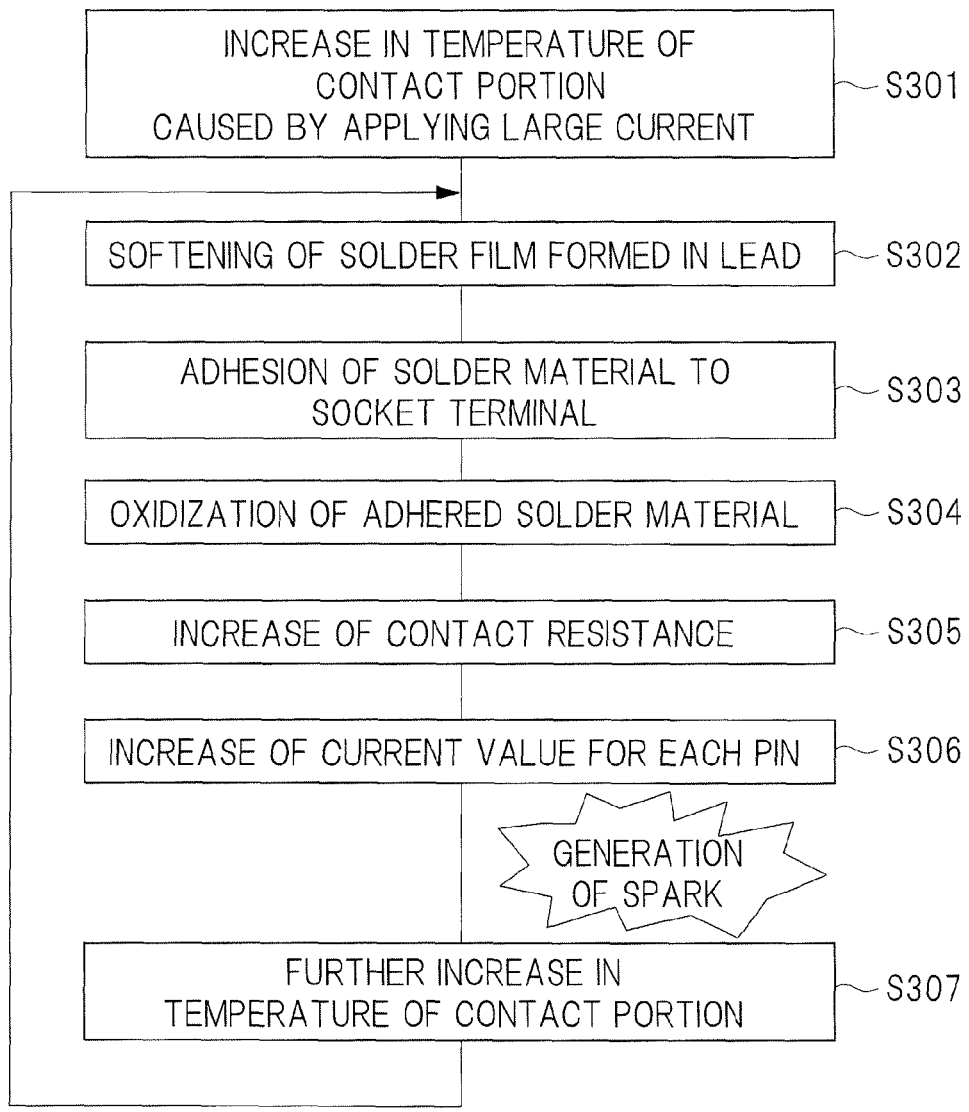

FIG. 26 is a flowchart that describes a mechanism that causes a defective appearance of a lead and a reduction in service life of a socket terminal.

Figure 27:
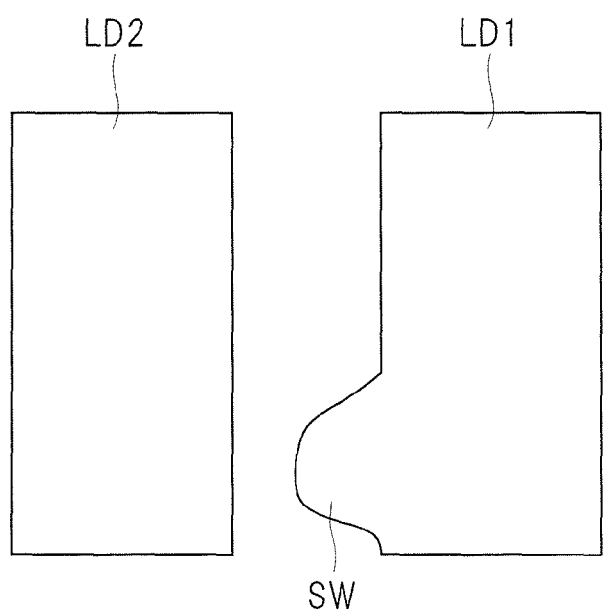

FIG. 27 is a schematic view illustrating an example of the defective appearance of the lead.

Figure 28:
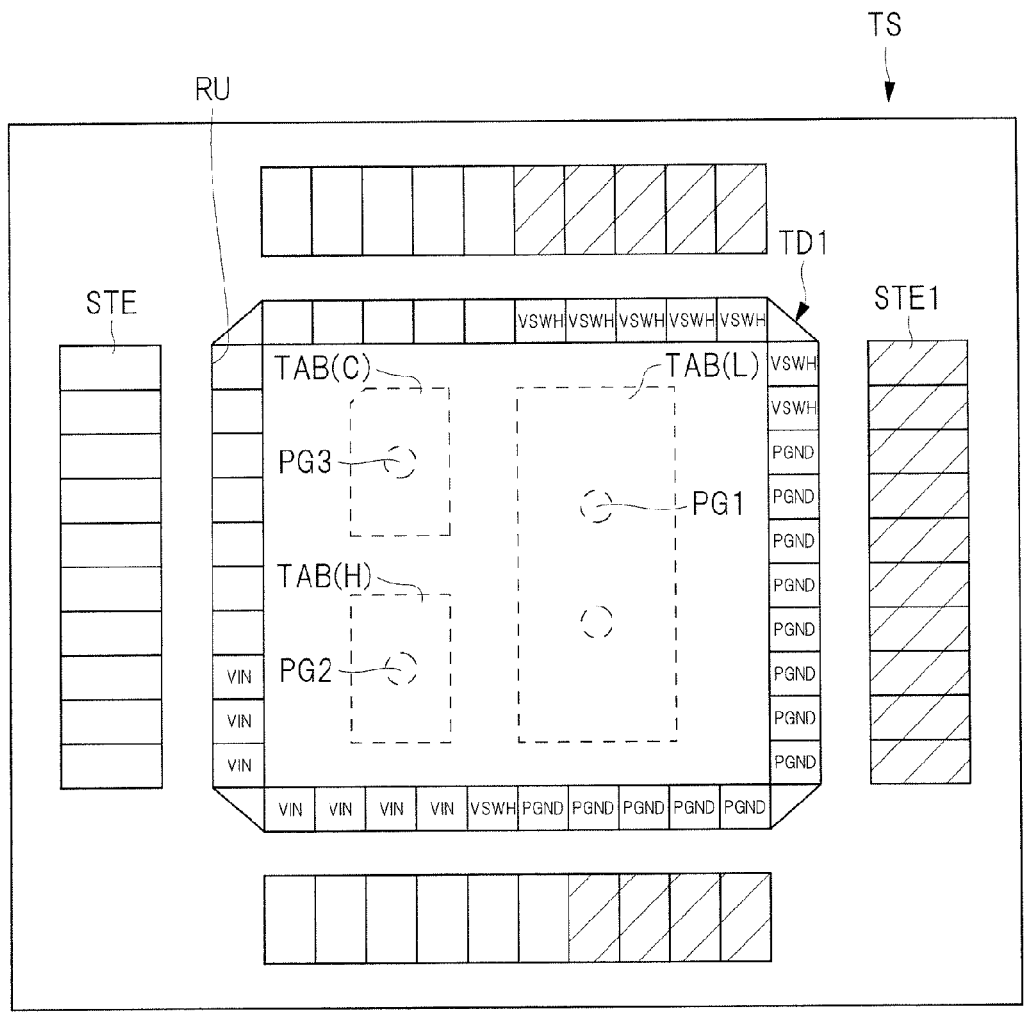

FIG. 28 is a plan view illustrating a configuration of a test socket to be used in the test process according to an embodiment.

Figure 29:
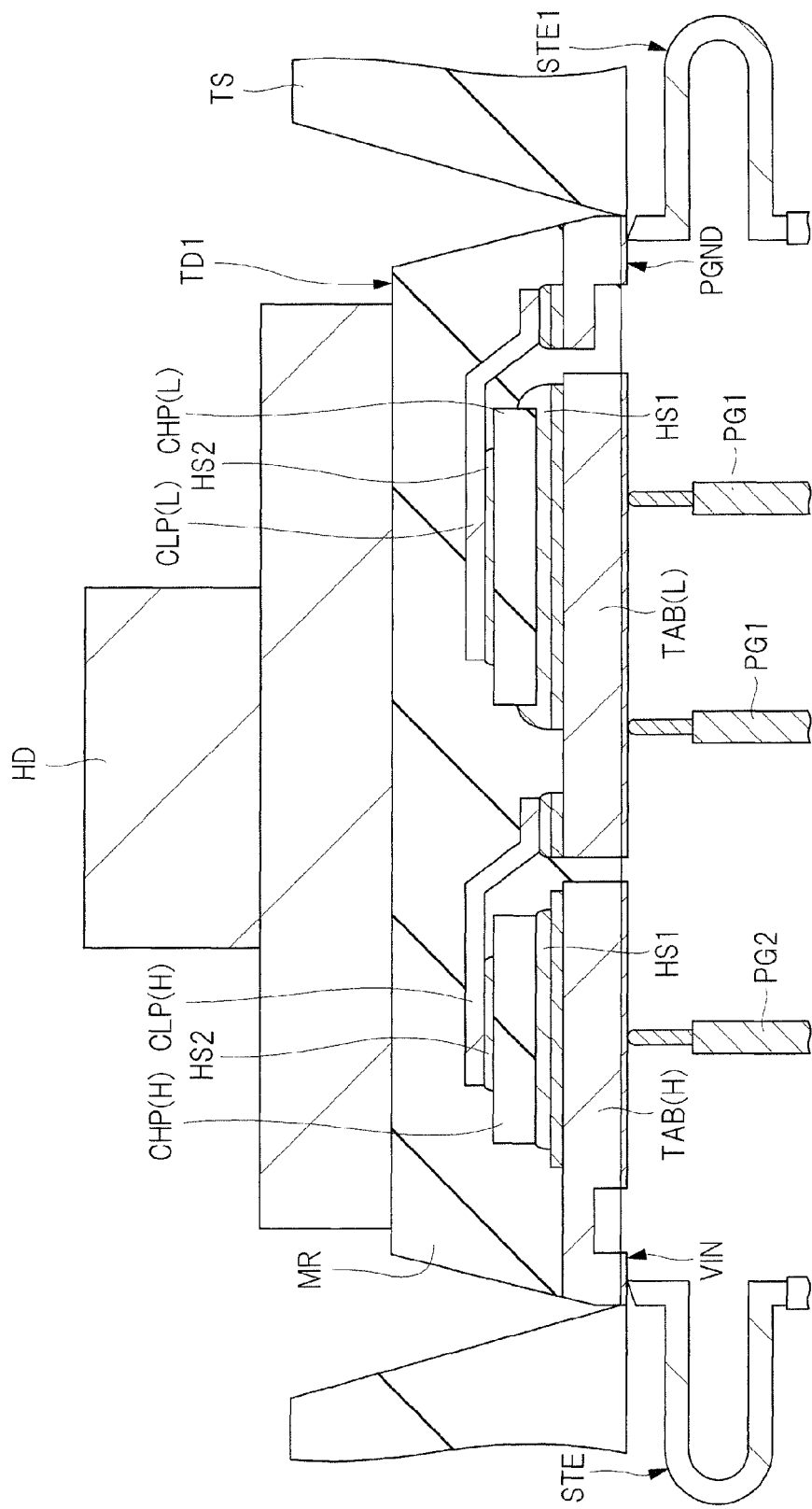

FIG. 29 is a cross-sectional view illustrating a state where a device to be inspected is disposed in the test socket.

Figure 30:
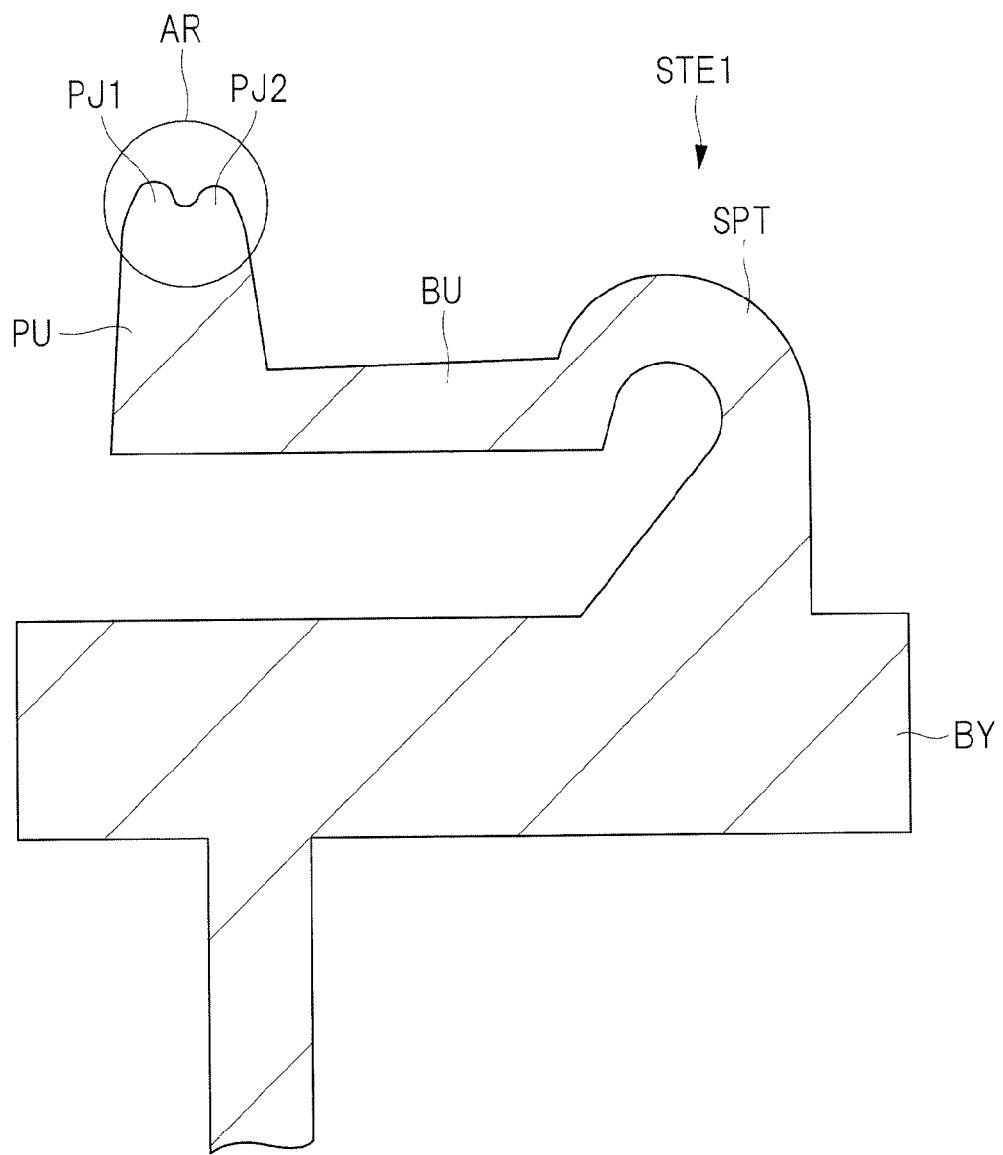

FIG. 30 is a cross-sectional view illustrating a configuration of a socket terminal according to an embodiment.

FIG. 31(A) is a diagram enlarging and illustrating a partial region of FIG. 30, and FIG. 31(B) is a diagram of FIG. 31(A) seen from an upper surface.

Figure 32:
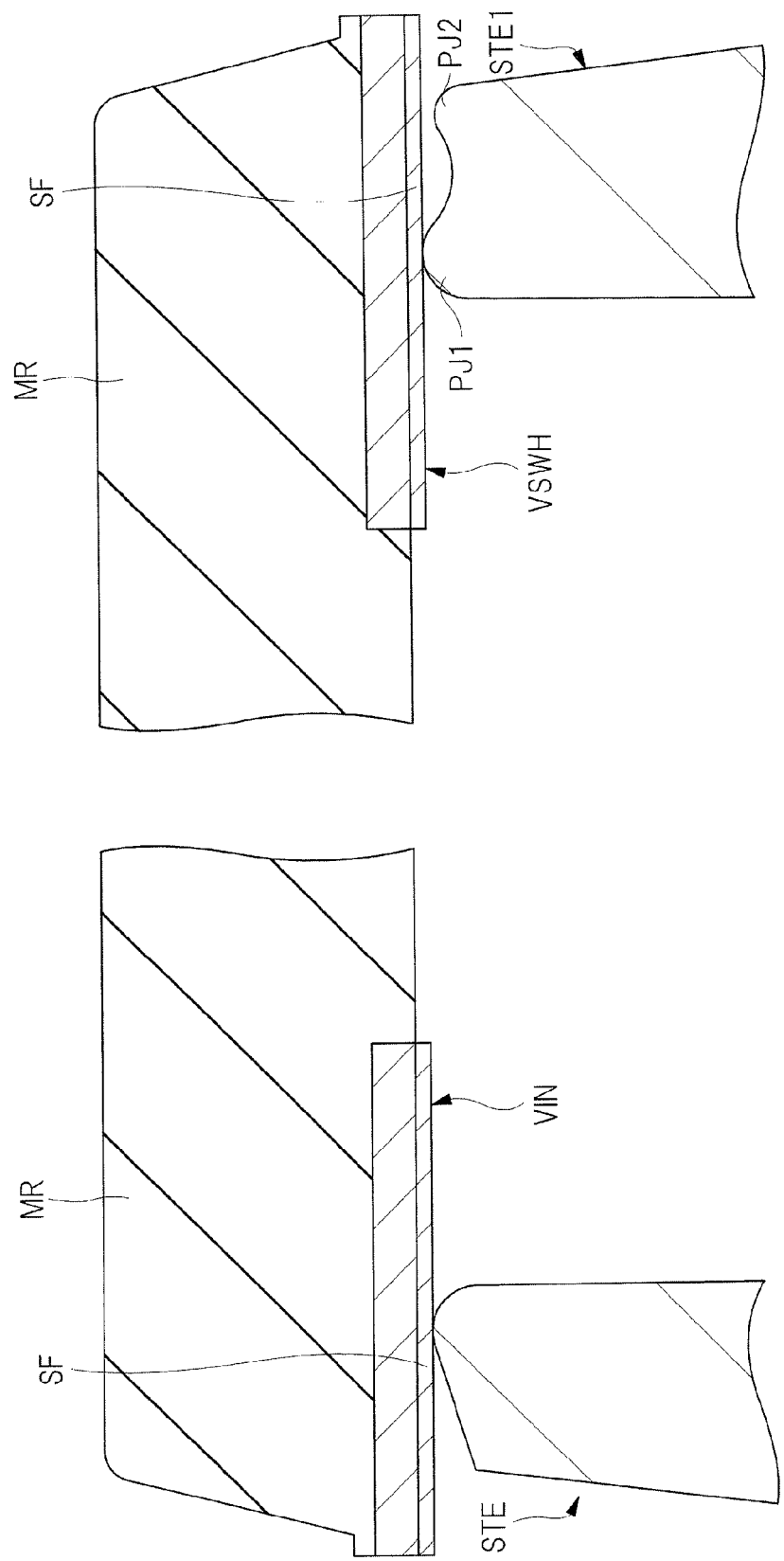

FIG. 32 is a diagram enlarging and illustrating a connection mode between the lead and the socket terminal.

FIG. 33 is a diagram enlarging and illustrating a connection mode between the lead and the socket terminal.

Figure 34:
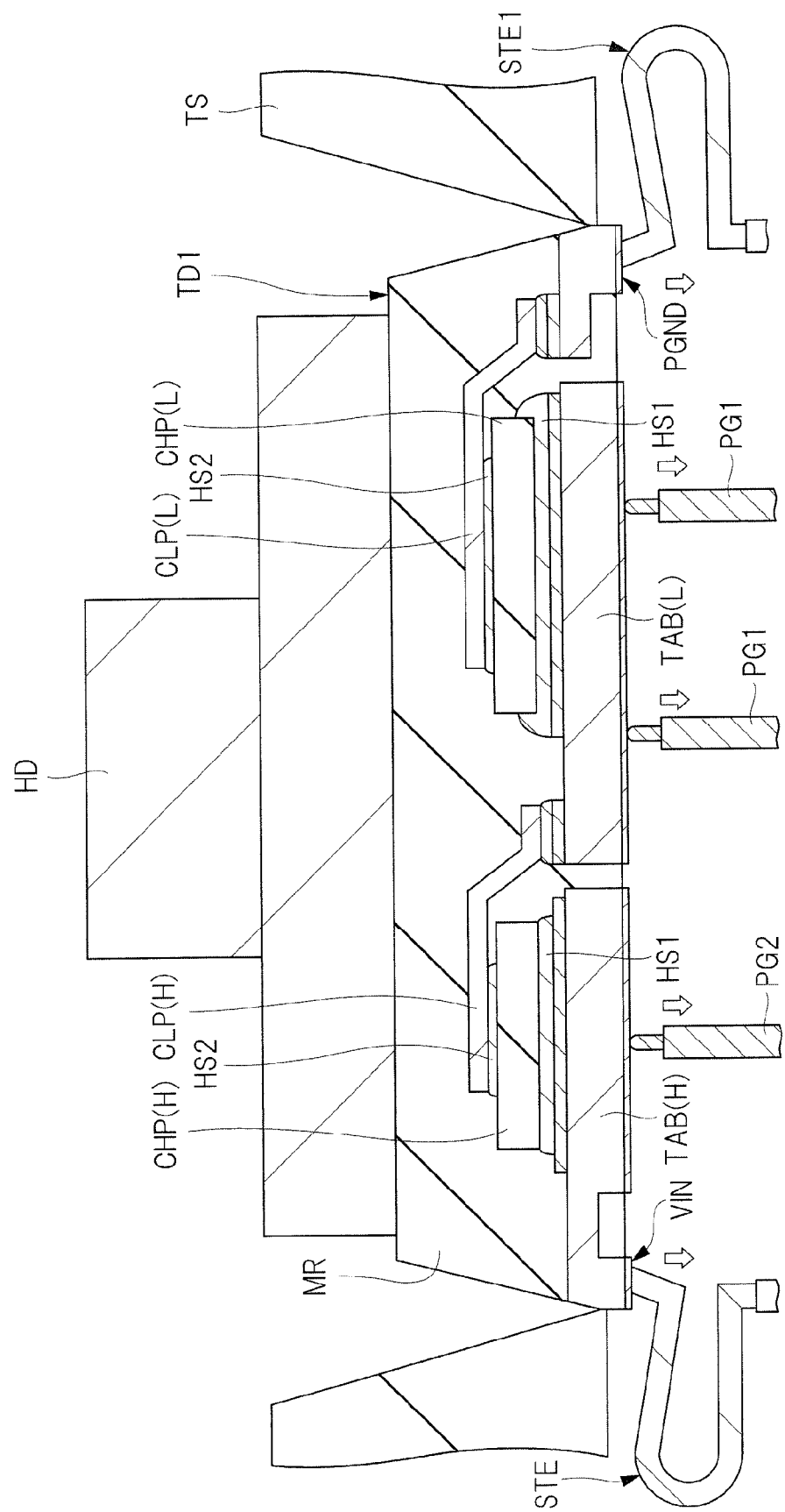

FIG. 34 is a cross-sectional view illustrating a state of pressing a device to be inspected.

FIG. 35 is a diagram enlarging and illustrating a connection mode between the lead and the socket terminal.

FIG. 36 is a diagram enlarging and illustrating a connection mode between the lead and the socket terminal.

Figure 37:
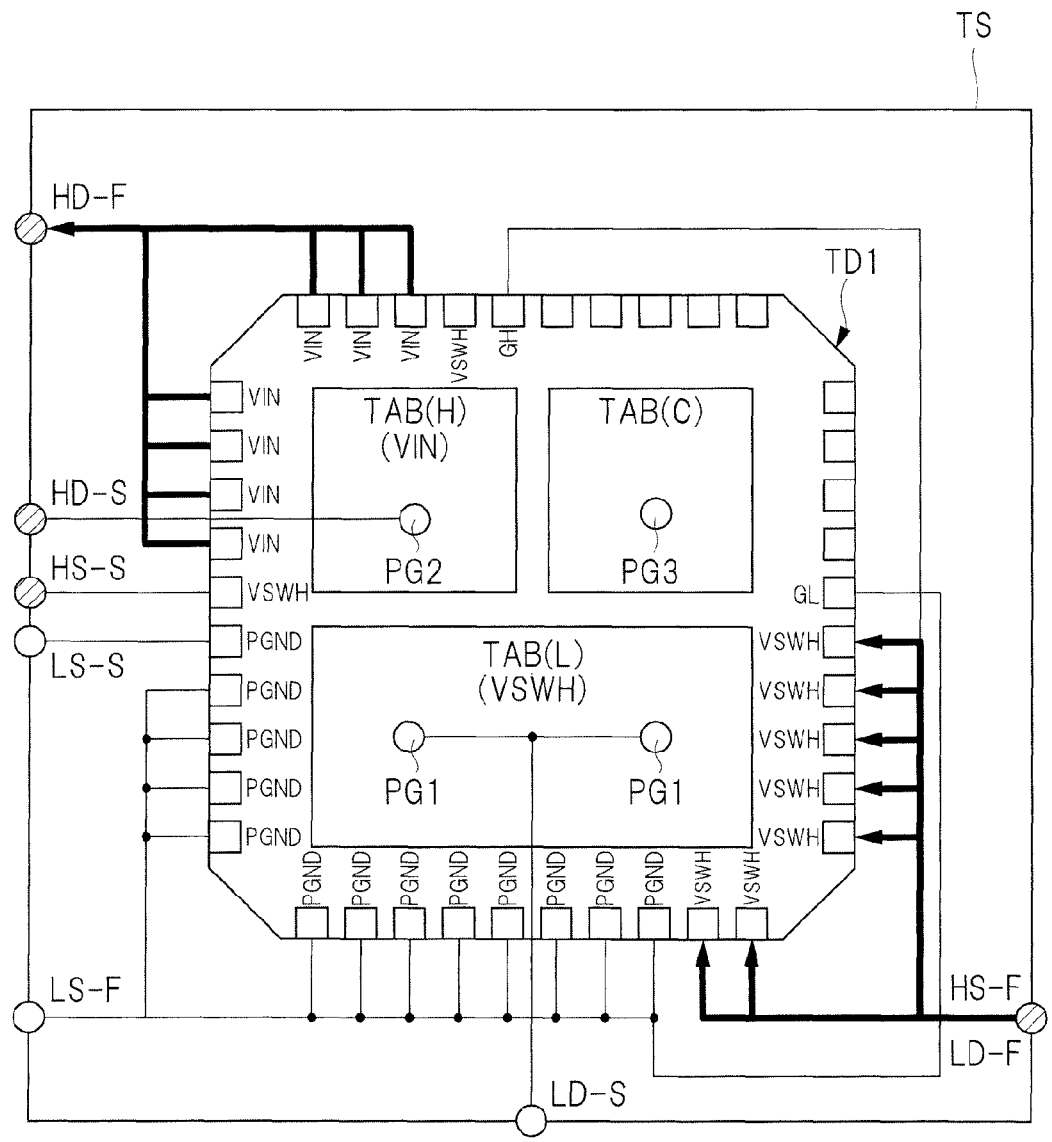

FIG. 37 is a diagram illustrating a current path in a test process of evaluating a thermal resistance of the high-side MOS chip.

Figure 38:
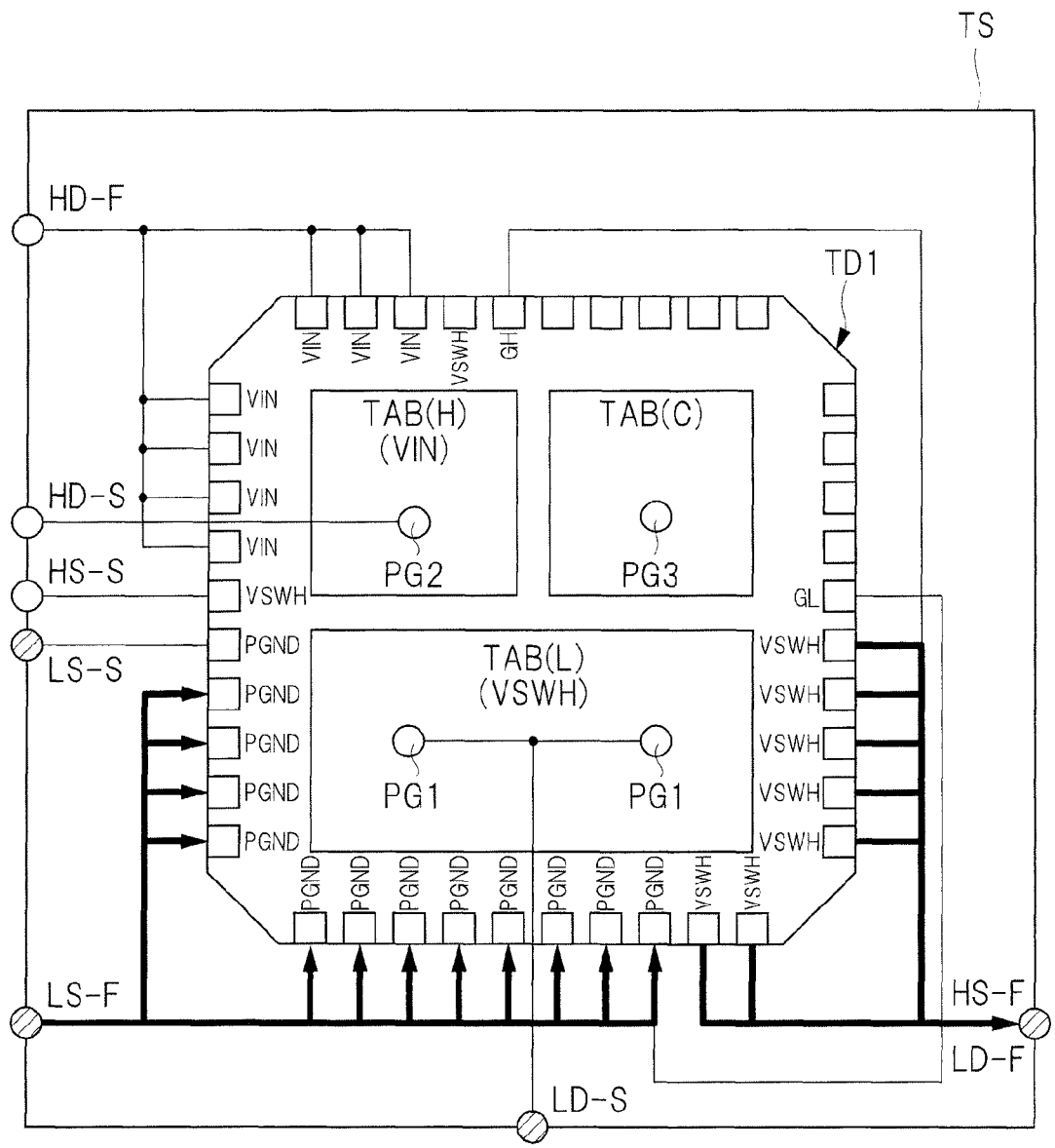

FIG. 38 is a diagram illustrating a current path in a test process of evaluating a thermal resistance of the low-side MOS chip.

Figure 39:
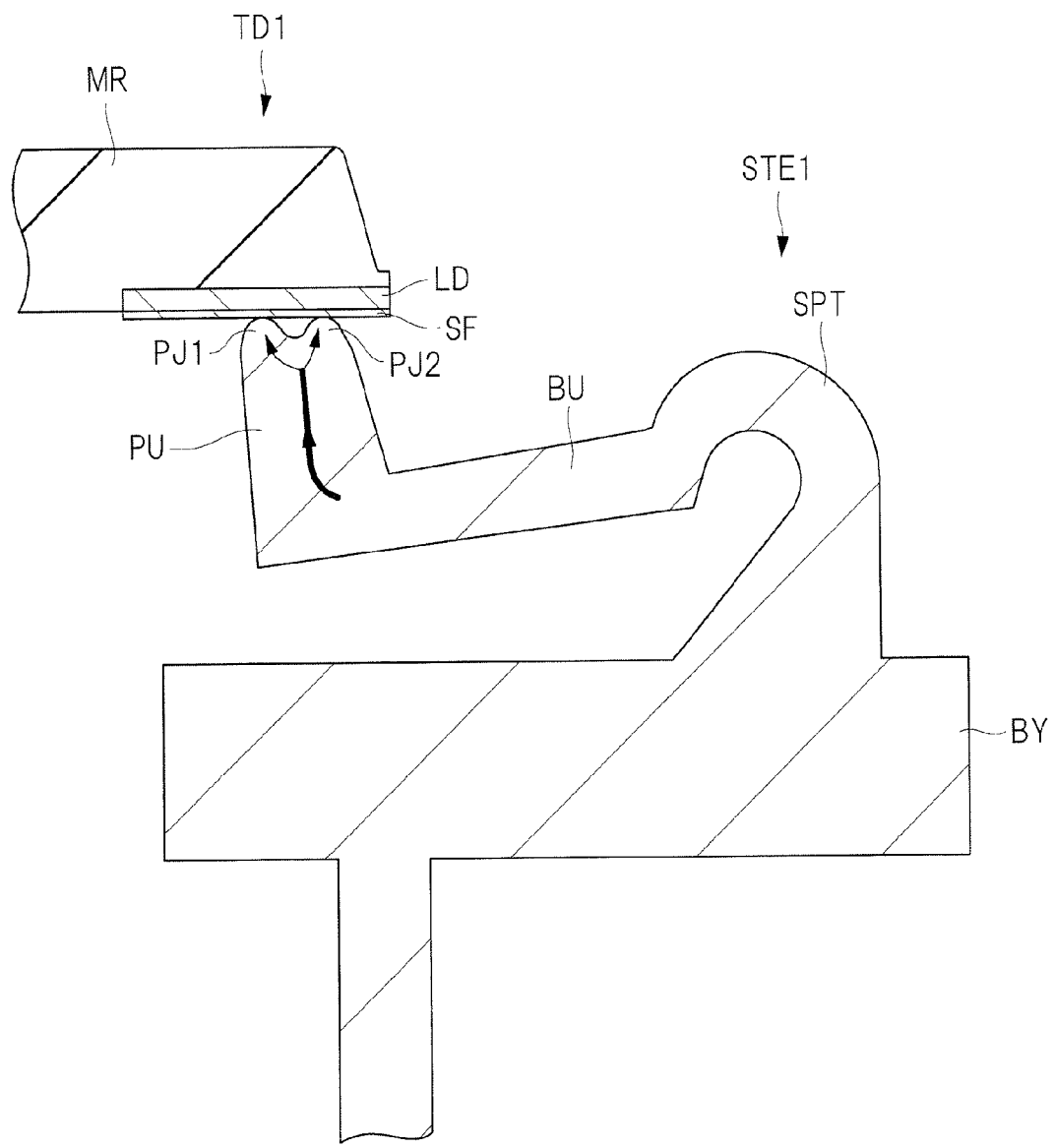

FIG. 39 is a diagram explaining a representative effect according to an embodiment.

Figure 40:
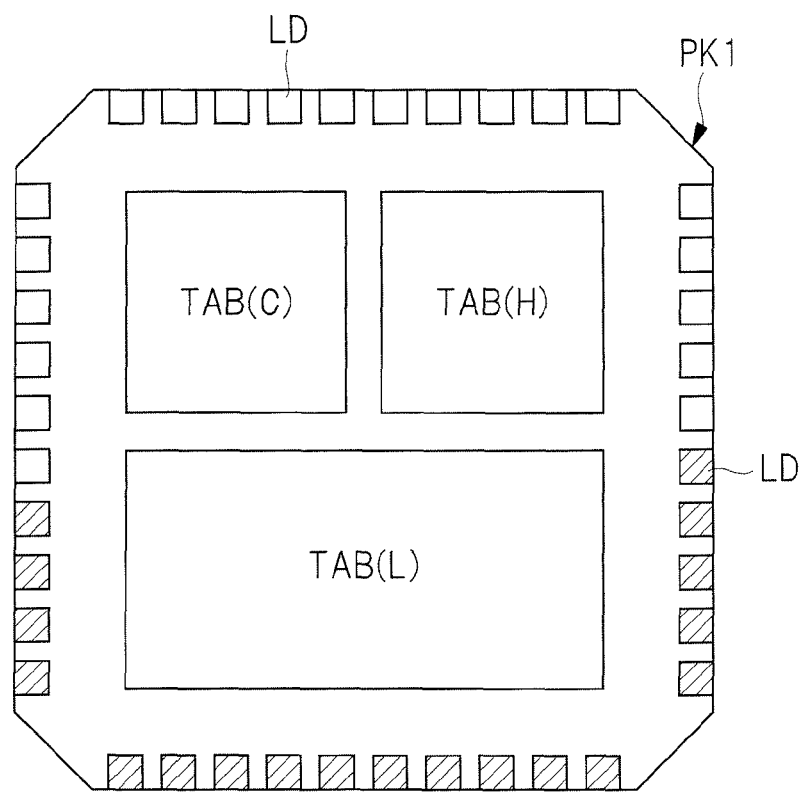

FIG. 40 is a diagram illustrating a rear surface of a semiconductor device after performing the test process according to an embodiment.

Figure 41:
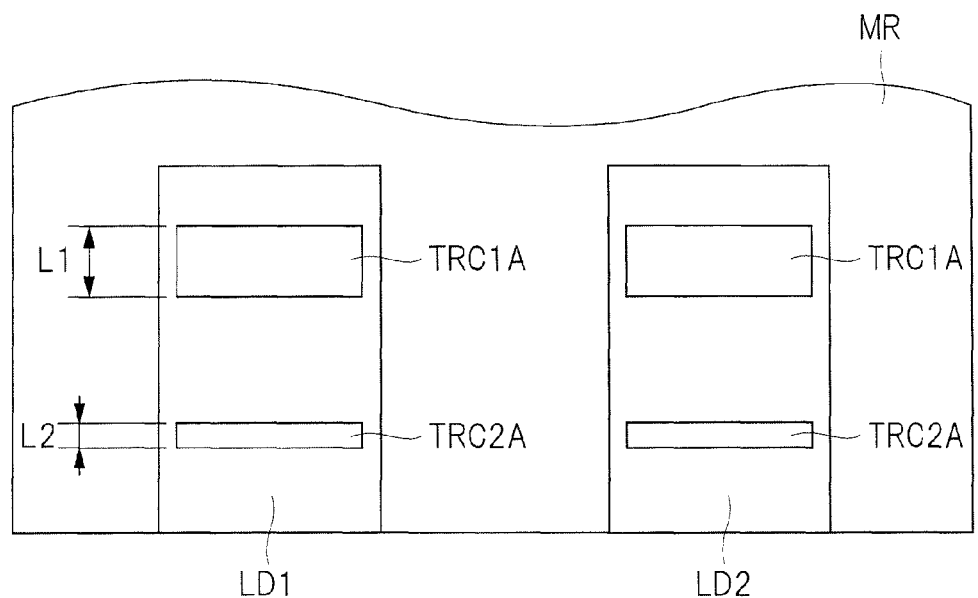

FIG. 41 is a diagram illustrating an example of a state of a top surface of a lead exposed from resin.

Figure 42:
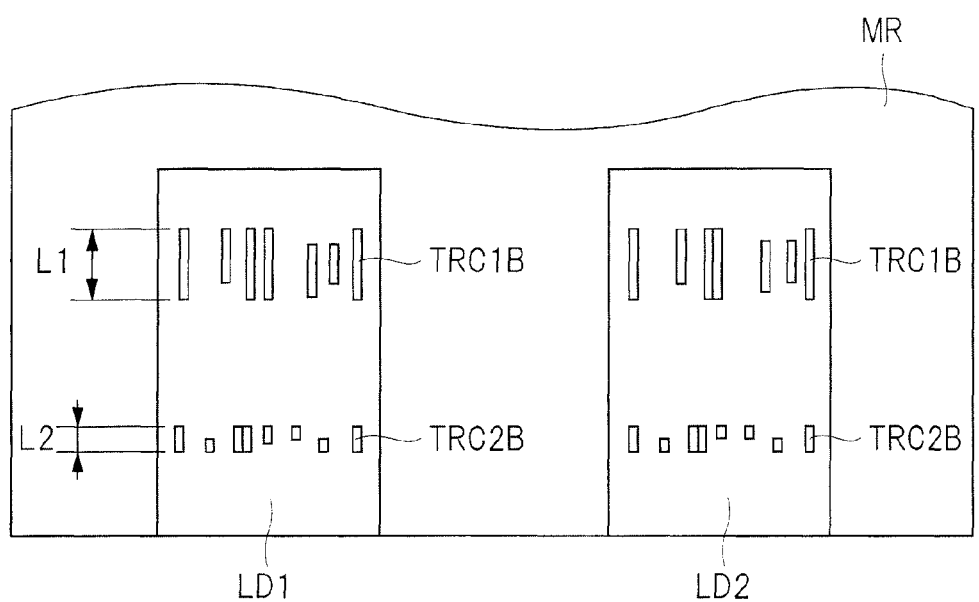

FIG. 42 is a diagram illustrating another example of a state of a top surface of the lead exposed from resin.

Figure 43:
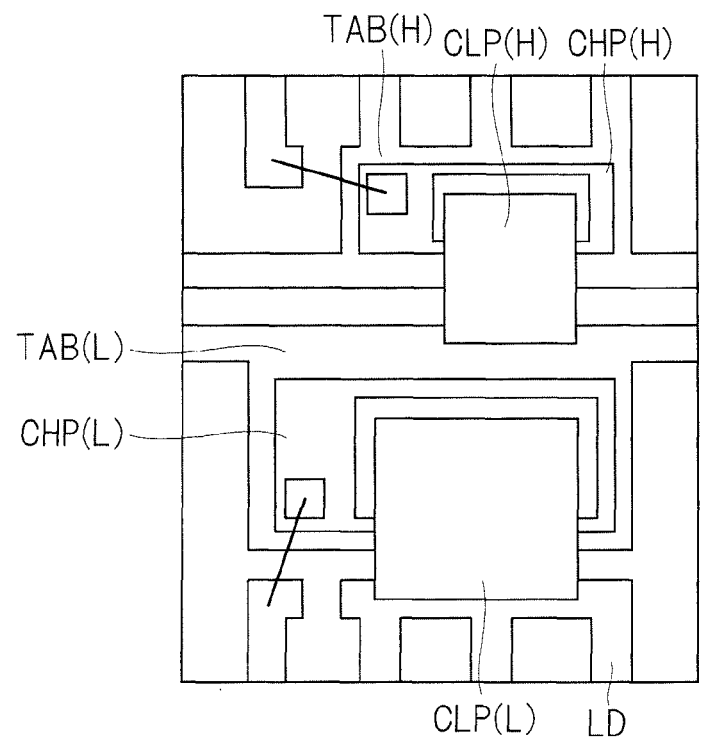

FIG. 43 is a plan view illustrating an internal structure of a semiconductor device in which only the high-side MOS chip and the low-side MOS chip are mounted.

Figure 44:
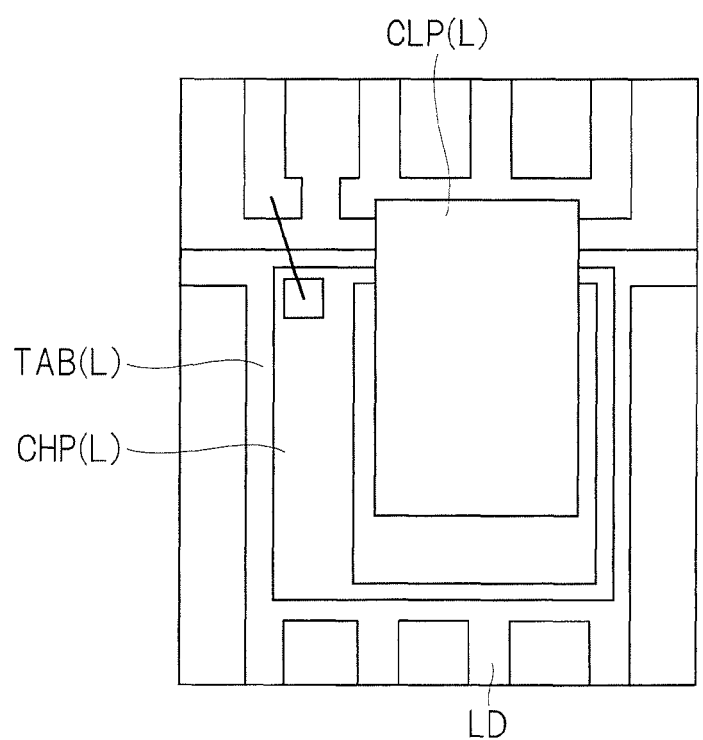

FIG. 44 is a plan view illustrating an internal structure of a semiconductor device in which only the the low-side MOS chip is mounted.

DETAILED DESCRIPTION OF PREFERRED EMBODIMENTS

The following embodiment will be described being divided into a plurality of sections or embodiments for convenience sake if necessary, but unless expressly stated otherwise, these embodiments or sections are not independent from one another, where one thereof is in a relationship with a modification example, details, a supplementary explanation, or the like of a portion or entirety of the other.

Also, in the embodiments described below, when referring to the number of elements (including number of pieces, values, amount, range, etc.), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In the entire diagrams for explaining the embodiments of the present invention, the same or a related symbol is attached to the member which has the same function, and the repeated explanation thereof is omitted. Further, even if the drawing is a plan view, hatching may be attached on the contrary in order to make the drawing easier to see.

EMBODIMENT

<Circuit Configuration and Operation of DC/DC Converter>

Figure 1:
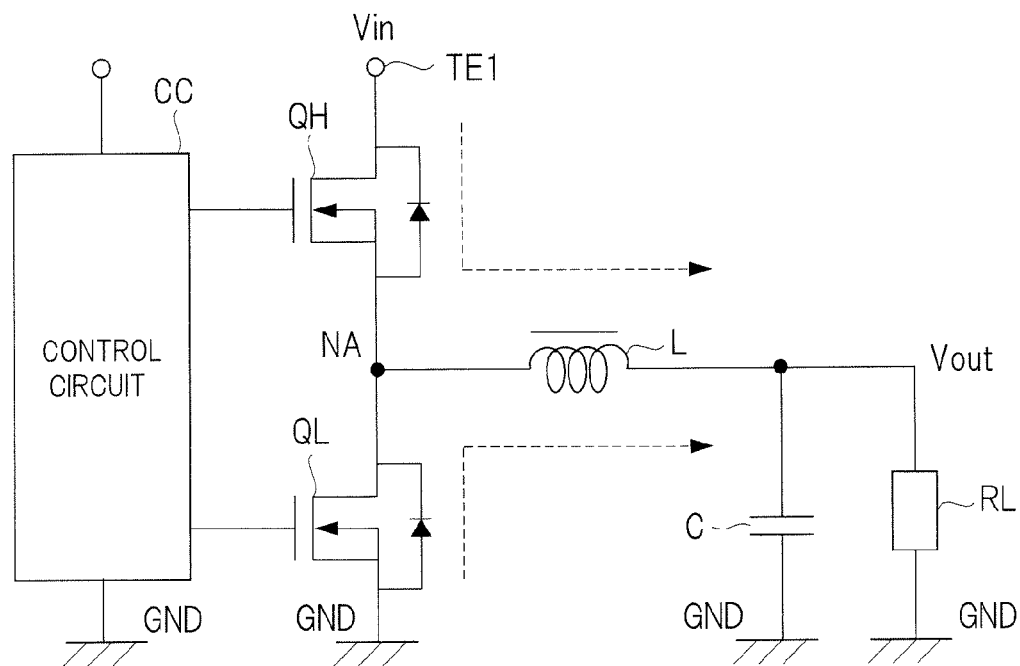
FIG. 1 is a diagram illustrating a circuit configuration of a step-down DC/DC converter.

FIG. 1 is a diagram illustrating a circuit configuration of a step-down DC/DC converter. As illustrated in FIG. 1, in the step-down DC/DC converter, a high-side MOS transistor QH and a low-side MOS transistor QL are connected to each other in series between an input terminal TE1 and a ground (reference potential) GND. Further, an inductor L and a load RL are connected to each other in series between a node NA, between the high-side MOS transistor QH and the low-side MOS transistor QL, and the ground GND at the load RL side, and a capacitor C is connected in parallel with the load RL.

In addition, a gate electrode of the high-side MOS transistor QH and a gate electrode of the low-side MOS transistor QL are connected to the control circuit CC, and an on/off operation of the high-side MOS transistor QH and an on/off operation of the low-side MOS transistor QL are controlled by the control circuit CC. To be specific, the control circuit CC performs control such that the low-side MOS transistor QL is turned off when the high-side MOS transistor QH is turned on, and the low-side MOS transistor QL is turned on when the high-side MOS transistor QH is turned off.

Here, for example, in a case where the high-side MOS transistor QH is turned on and the low-side MOS transistor QL is turned off, current flows from the input terminal TE1 to the load RL via the high-side MOS transistor QH and the inductor L. Thereafter, when the high-side MOS transistor QH is turned off and the low-side MOS transistor QL is turned on, first, the current flowing from the input terminal TE1 to the load RL via the high-side MOS transistor QH and the inductor L is shut off since the high-side MOS transistor QH is turned off. That is, the current flowing to the inductor L is shut off. Meanwhile, when the current is reduced (shut off), the inductor L tries to maintain the current flowing in the inductor L. At this time, since the low-side MOS transistor QL is turned on, the current flows from the ground GND to the load RL via the low-side MOS transistor QL and the inductor L this time. Thereafter, the high-side MOS transistor QH is turned on, and the low-side MOS transistor QL is turned off, again. By repeating such operations, when an input voltage Vin is input to the input terminal TE1, an output voltage Vout, lower than the input voltage Vin, is output to both ends of the load RL in the step-down DC/DC converter illustrated in FIG. 1.

Hereinafter, a description will be made in simple regarding a reason why the output voltage Vout, which is lower than the input voltage Vin, is output to the both ends of the load RL in a case where the input voltage Vin is input to the input terminal TE1 by repeating the above-described switching operation. In addition, hereinafter, it is handled such that the current flowing to the inductor L is not intermittent.

First, the high-side MOS transistor QH is configured to perform the switching operation at an on period $T_{ON}$ and an off period $T_{OFF}$ according to the control by the control circuit CC. A switching frequency in this case is $f=1/(T_{ON}+T_{OFF})$.

Here, for example, in FIG. 1, the capacitor C inserted in parallel with the load RL has a function of not allowing the output voltage Vout to be greatly varied in a short period of time. In other words, the capacitor C with relatively a large capacitance value is inserted in parallel with the load RL in the step-down DC/DC converter illustrated in FIG. 1, and thus, a ripple voltage included in the output voltage Vout becomes a small value compared to the output voltage Vout in the normal state. Therefore, the variation of the output voltage Vout within one cycle of the switching operation can be ignored.

First, a case in which the high-side MOS transistor QH is turned on is considered. At this time, since it is assumed that the output voltage Vout is not varied within one cycle, it is possible to regard that the voltage to be applied to the inductor L is constant as (Vin−Vout). As a result, when an inductance of the inductor L is set to L1, an increase amount $\Delta I_{on}$ of current in the on-period $T_{ON}$ is given by Formula (1).

$$\Delta I_{on}=(Vin-Vout)/L1 \times T_{ON} \tag{1}$$

Next, a case where the high-side MOS transistor QH is turned off is considered. In this case, since the low-side MOS transistor QL is turned on, the voltage applied to the inductor L is 0−Vout=−Vout. Accordingly, an increase amount $\Delta I_{OFF}$ of current in the off-period $T_{OFF}$ is given by Formula (2).

$$\Delta I_{OFF}=-Vout/L1 \times T_{OFF} \tag{2}$$

At this time, when becoming the normal state, the current flowing to the inductor L does not increase or decrease during one cycle of the switching operation. In other words, when the current flowing in the inductor L increases or decreases during one cycle, it means that the normal state is not formed yet. Accordingly, Formula (3) is established in the normal state.

$$\Delta I_{on}+\Delta I_{OFF}=0 \tag{3}$$

When substituting the relation of Formula (1) and the relation of Formula (2) into Formula (3), it is possible to obtain Formula (4) as described below.

$$Vout=Vin \times T_{ON}/(T_{ON}+T_{OFF}) \tag{4}$$

In Formula (4), since $T_{ON} \geq 0$, and $T_{OFF} \geq 0$, it is understood that Vout<Vin. That is, it is understood that the step-down DC/DC converter illustrated in FIG. 1 is a circuit that outputs the output voltage Vout which is lower than the input voltage Vin. Further, it is understood that an optional output voltage Vout, lower than the input voltage Vin, can be obtained by varying the on-period $T_{ON}$ and the off-period $T_{OFF}$ through the switching operation controlled by the control circuit CC from Formula (4). In particular, if the control is performed such that the on-period $T_{ON}$ and the off-period $T_{OFF}$ are constant, it is possible to obtain the constant output voltage Vout.

As described above, according to the step-down DC/DC converter illustrated in FIG. 1, it is understood that the output voltage Vout, lower than the input voltage Vin, can be output by controlling the on/off operation of the high-side MOS transistor QH and the on/off operation of the low-side MOS transistor QL by the control circuit CC.

Figure 2:
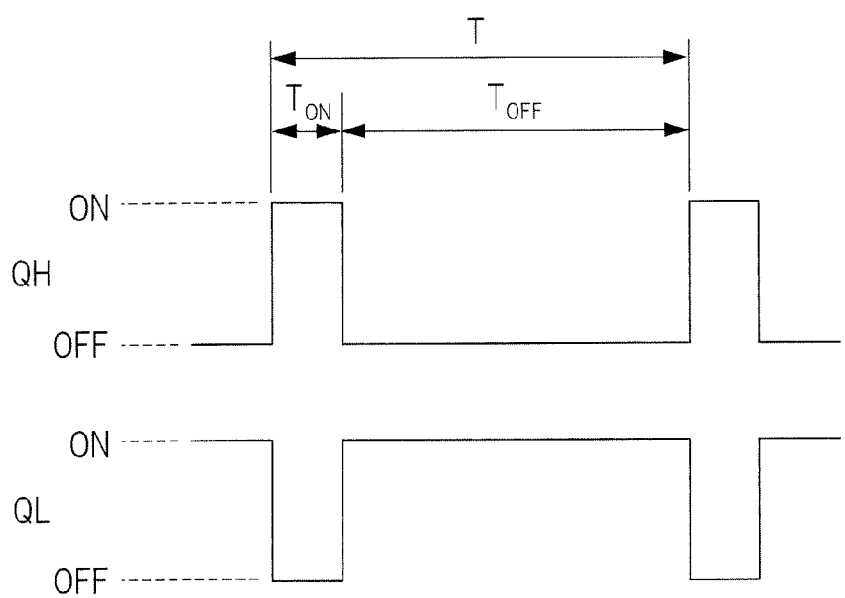
FIG. 2 is a diagram illustrating a timing chart of a high-side MOS transistor QH and a low-side MOS transistor QL.

FIG. 2 is a diagram illustrating a timing chart of the high-side MOS transistor QH and the low-side MOS transistor QL. In FIG. 2, the on-period $T_{on}$ represents a time for which the high-side MOS transistor QH is turned on, and the off-period $T_{OFF}$ represents a time for which the high-side MOS transistor QH is turned off. At this time, as illustrated in FIG. 2, it is understood that the low-side MOS transistor QL is turned off in a case where the high-side MOS transistor QH is turned on, and the low-side MOS transistor QL is turned on in a case where the high-side MOS transistor QH is turned off. Accordingly, it is also possible to state that the on-period $T_{on}$ represents a time for which the low-side MOS transistor QL is turned off, and the off-period $T_{OFF}$ represents a time for which the low-side MOS transistor QL is turned on.

Here, as represented in the above-described Formula (4), in a case where the output voltage Vout is sufficiently lowered with respect to the input voltage Vin, the on-period $T_{on}$ becomes shorter. In other words, in a case where the output voltage Vout is sufficiently lowered with respect to the input voltage Vin, there is a need for extending the off-period $T_{OFF}$. As a result, when it is considered that the output voltage Vout is sufficiently lowered with respect to the input voltage Vin, it is necessary to perform the control by the control circuit CC such that the off-period $T_{OFF}$ for which the high-side MOS transistor QH is turned off becomes long. In other words, the fact that the off-period $T_{OFF}$ for which the high-side MOS transistor QH is turned off becomes long means that the on-period of the low-side MOS transistor QL becomes long. Accordingly, particularly in a case where the output voltage Vout is sufficiently lowered, the on-period of the low-side MOS transistor QL becomes long, so that it is understood that there is a need for sufficiently reducing an on-resistance of the low-side MOS transistor QL in consideration of a view point of improving efficiency of the DC/DC converter.

<Schematic Relationship of Planar Size>

In general, the DC/DC converter adopts a configuration in which a semiconductor chip forming the high-side MOS transistor QH, a semiconductor chip forming the low-side MOS transistor QL and a semiconductor chip forming the control circuit CC are separately provided.

Here, as described above, there is a need for sufficiently considering the reduction of the on-resistance in the low-side MOS transistor QL, and as a result, the relationship that will be described below is typically established regarding a planar size (external dimension) of each of the semiconductor chips configuring the DC/DC converter.

That is, in general, in the DC/DC converter, a planar size of the semiconductor chip in which the low-side MOS transistor QL is formed is set to be larger than a planar size of the semiconductor chip in which the high-side MOS transistor QH is formed. The reason is because it is possible to increase the parallel number of unit transistors in the low-side MOS transistor QL by increasing the planar size of the semiconductor chip, and accordingly, it is possible to sufficiently reduce the on-resistance of the low-side MOS transistor QL.

In this manner, particularly in a DC/DC converter which sufficiently lowers the output voltage Vout compared to the input voltage Vin, the planar size of the semiconductor chip forming the low-side MOS transistor QL is set to be larger than the planar size of the semiconductor chip forming the high-side MOS transistor QH. On the other hand, a large current does not flow in the semiconductor chip forming the control circuit CC, unlike the semiconductor chip forming the high-side MOS transistor QH and the semiconductor chip forming the low-side MOS transistor QL. In other words, an integrated circuit configuring the control circuit CC controls the on/off operation of the high-side MOS transistor QH and the on/off operation of the low-side MOS transistor QL. Thus, a planar size of the semiconductor chip forming the control circuit CC is set to be smaller than the planar size of the semiconductor chip forming the high-side MOS transistor QH and the planar size of the semiconductor chip forming the low-side MOS transistor QL.

As described above, in the DC/DC converter, the planar size of the semiconductor chip forming the low-side MOS transistor QL is the largest, subsequently, the planar size of the semiconductor chip forming the high-side MOS transistor QH is the second largest, and the planar size of the semiconductor chip forming the control circuit CC is the smallest.

<Mounting Configuration of DC/DC Converter>

Hereinafter, to be specific, a description will be made in detail regarding a mounting configuration of the DC/DC converter.

The control circuit CC, the low-side MOS transistor QL and the high-side MOS transistor QH, included in the DC/DC converter described above, are commercialized as a semiconductor device provided in one package. The semiconductor device provided in one package does not include the inductor L and the capacitor C as illustrated in FIG. 1, and thus, is a semiconductor device configuring a part of the DC/DC converter, but is referred to as the semiconductor device configuring the DC/DC converter in some cases, for convenience. In addition, the semiconductor device to be described in the present specification will be also referred to as a semiconductor package in some cases, but these terms are used in the same meaning.

The semiconductor device (semiconductor package) includes a semiconductor chip forming a semiconductor element such as a MOSFET (Metal Oxide Semiconductor Field Effect Transistor) (in the present specification, the MOSFET will be also referred to as the MOS transistor in some cases). The semiconductor device (semiconductor package) has (1) a function of electrically connecting the semiconductor element formed in the semiconductor chip with an external circuit and (2) a function of protecting the semiconductor chip from an external environment such as humidity and temperature, and preventing damage due to vibration or an impact and deterioration in characteristics of the semiconductor chip. Further, the package also has (3) a function of facilitating handling of the semiconductor chip, and (4) a function of dissipating heat generation during the operation of the semiconductor chip, and exerting the function of the semiconductor element maximally.

There are various types, for example, a BGA (Ball Grid Array), a QFP (Quad Flat Package), a QFN (Quad Flat Non-leaded Package) and the like as a structure (form) of the semiconductor device (semiconductor package). Among such various package forms, the semiconductor device forming the part of the DC/DC converter described above is configured to be mounted, for example, with the QFN package. Thus, hereinafter, a description will be made regarding the mounting configuration of the semiconductor device formed of the QFN forming a part of the DC/DC converter.

Figure 3:
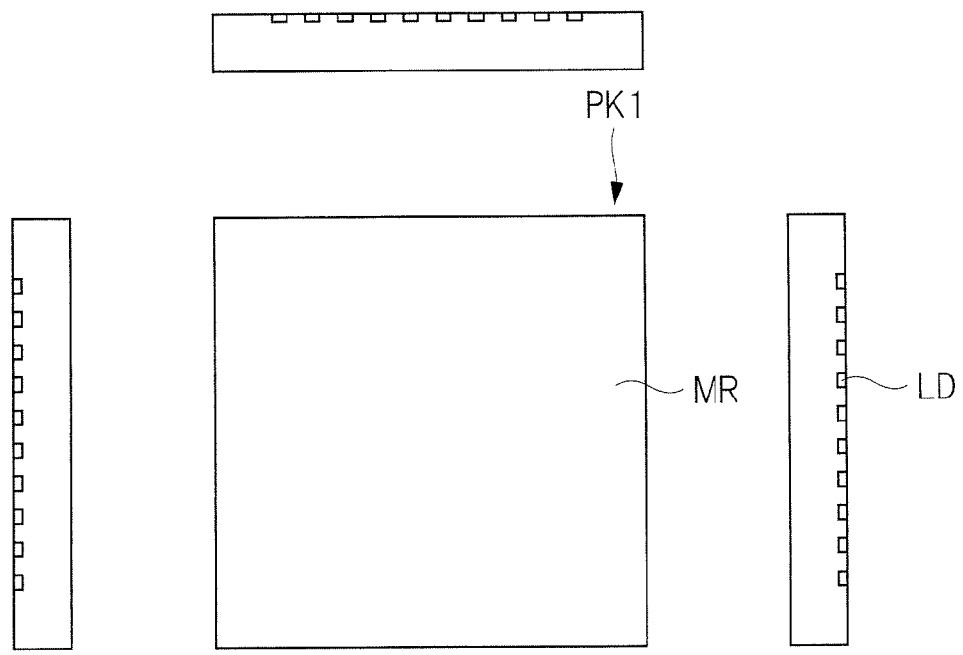
FIG. 3 is a diagram illustrating a mounting configuration of a semiconductor device according to an embodiment.

FIG. 3 is a diagram illustrating a mounting configuration of a semiconductor device PK1 according to a present embodiment. In FIG. 3, a diagram illustrated in the center is a plan view of the semiconductor device PK1 seen from an upper surface (top surface), and side views are illustrated in the respective four sides. As illustrated in FIG. 3, the semiconductor device PK1 according to the present embodiment is covered by a resin MR having a rectangular shape. Further, as understood from the side view, it is understood that a lead LD is exposed from the resin MR in a side surface of the semiconductor device PK1. Here, in the present specification, the lead will be referred to as an external terminal in some cases.

In addition, in the present embodiment, a description will be made regarding a so-called batch-molded product in which a shape of the semiconductor device PK1 is a rectangle, that is, a side surface of the resin (the sealing body) MR is the same plane (surface) as the exposed surface (cut surface) of the lead LD, which is exposed from the side surface of the resin MR, but the present invention is not limited thereto. That is, the shape of the resin MR may be a so-called individually molded product in which not only the cut surface of the lead LD and a lower surface (mounting surface) of the lead LD, but also a part of an upper surface (surface opposite to the lower surface) of the lead LD is also exposed from the resin MR.

Figure 4:
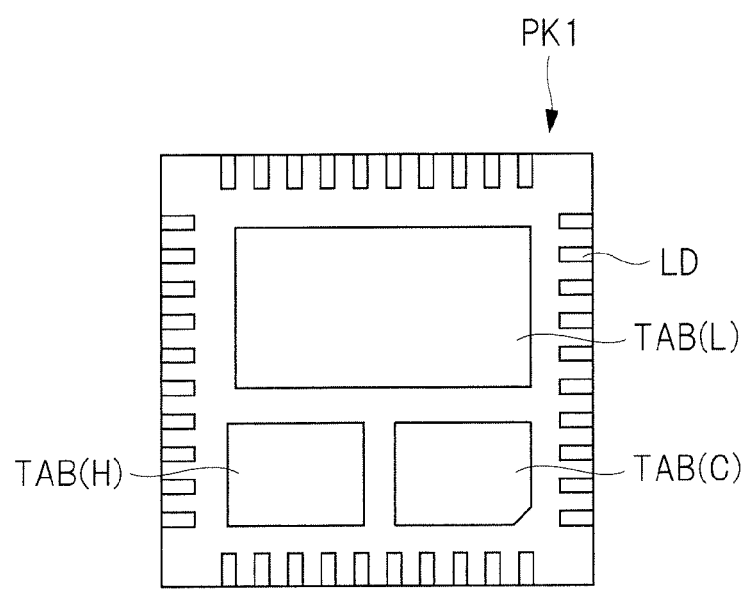
FIG. 4 is a plan view of a semiconductor device according to an embodiment seen from a lower surface (rear surface).

Next, FIG. 4 is a plan view of the semiconductor device PK1 according to the present embodiment seen from a lower surface (rear surface). As illustrated in FIG. 4, the rear surface of the semiconductor device PK1 is also covered by the resin MR, but a chip mounting portion TAB (L), a chip mounting portion TAB (H) and a chip mounting portion TAB (C) are exposed from the resin MR. In this manner, it is possible to improve heat dissipation efficiency of the semiconductor device PK1 by exposing the chip mounting portion TAB (L), the chip mounting portion TAB (H) and the chip mounting portion TAB (C) from the rear surface of the semiconductor device PK1. In addition, some (the lower surface and the mounting surface) of a plurality of the leads LD are exposed in an outer peripheral region (outer peripheral portion) of the semiconductor device PK1 having the rectangular shape.

Figure 5:
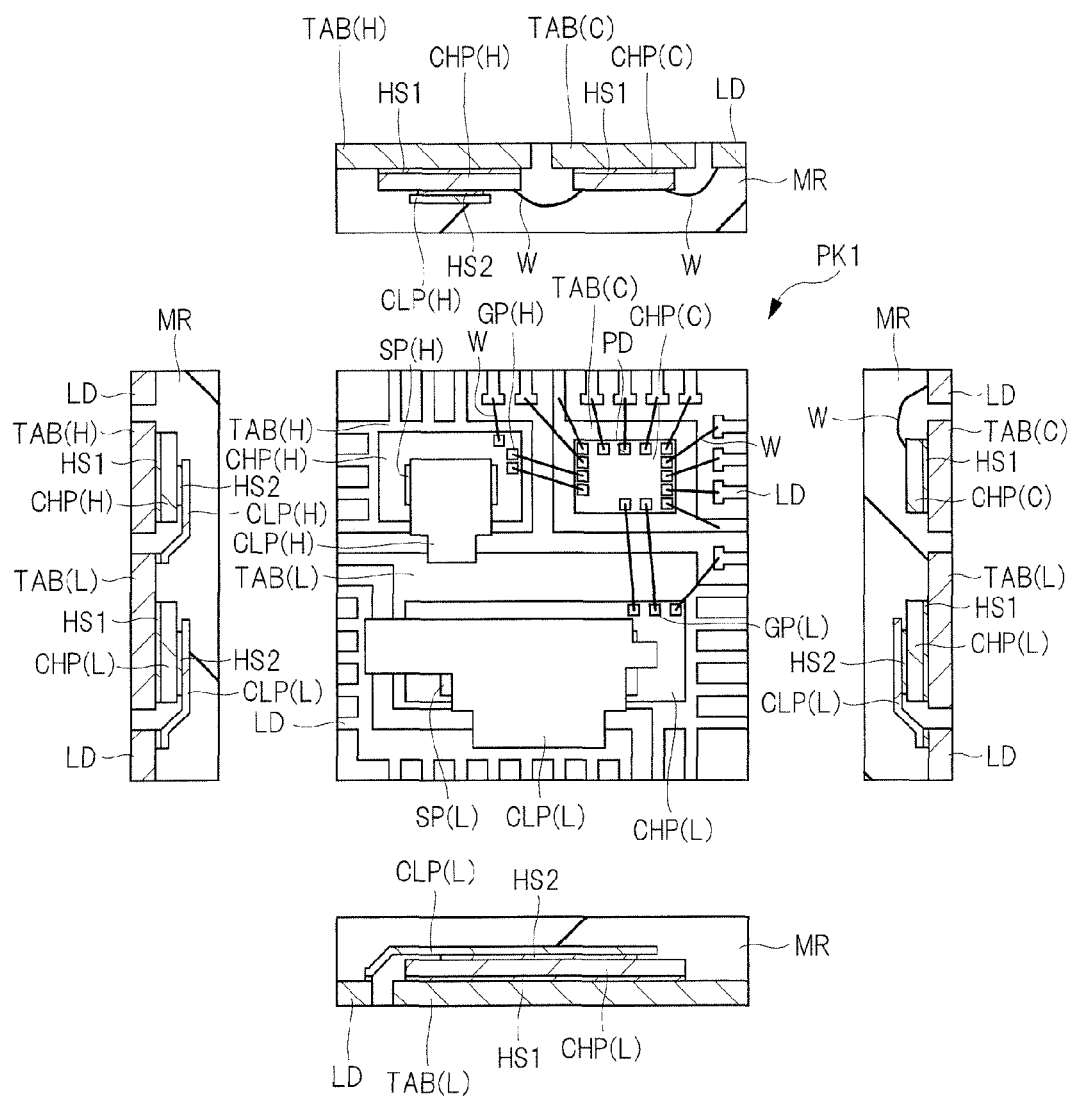
FIG. 5 is a diagram illustrating an internal structure of a semiconductor device according to an embodiment.

Subsequently, a description will be made regarding an internal structure of the semiconductor device PK1. FIG. 5 is a diagram illustrating the internal structure of the semiconductor device PK1 according to the present embodiment. In FIG. 5, a diagram illustrated in the center is a plan view of inside of the semiconductor device PK1 seen from the top surface side seen through the resin MR, and cross-sectional views are illustrated in the respective four sides.

In the diagram illustrated in the center of FIG. 5, a low-side MOS chip CHP(L) containing silicon as a main component, for example, is mounted on the chip mounting portion TAB (L). Further, a source electrode pad SP(L) and a gate electrode pad GP (L), each of which is made of an aluminum film, for example, are formed on a top surface of the low-side MOS chip CHP(L).

In addition, herein, a nickel/gold (Ni/Au) film is formed on the source electrode pad SP(L) in order to electrically connect a low-side MOS clip CLP (L), made of a conductive member, to be described later onto the source electrode pad SP(L) via a high melting point solder HS2.

The lead LD is disposed in a part on an outer side of the chip mounting portion TAB (L), and this lead LD and the source electrode pad SP(L) of the low-side MOS chip CHP(L) are electrically connected to each other through the low-side MOS clip CLP (L). In other words, the low-side MOS clip CLP (L), made of a steel material, for example, is mounted onto the source electrode pad SP(L) of the low-side MOS chip CHP(L), and an end portion of the low-side MOS clip CLP (L) is connected to the lead LD. To be specific, as illustrated in the cross-sectional view at the lower side of FIG. 5, the low-side MOS chip CHP(L) is mounted onto the chip mounting portion TAB (L) via a high melting point solder HS1, and the low-side MOS clip CLP (L) is mounted, via the high melting point solder HS2, so as to stride between the low-side MOS chip CHP(L) and the lead LD.

Next, in the drawing illustrated in the center of FIG. 5, a high-side MOS chip CHP(H) containing silicon as a main component, for example, is mounted onto the chip mounting portion TAB (H). Further, a source electrode pad SP(H) and a gate electrode pad GP (H), each of which is made of an aluminum film, for example, are formed on a top surface of the high-side MOS chip CHP(H).

In addition, herein, a nickel/gold (Ni/Au) film is formed on the source electrode pad SP(H) in order to electrically connect a high-side MOS clip CLP (H), made of a conductive member, to be described later onto the source electrode pad SP(H) via a high melting point solder HS2.

The chip mounting portion TAB (L) is disposed so as to be adjacent to the chip mounting portion TAB (H), and the chip mounting portion TAB (L) and the source electrode pad SP(H) of the high-side MOS chip CHP(H) are electrically connected to each other through the high-side MOS clip CLP (H). In other words, the high-side MOS clip CLP (H), made of a steel material, for example, is mounted onto the source electrode pad SP(H) of the high-side MOS chip CHP(H), and an end portion of the high-side MOS clip CLP (H) is connected to the chip mounting portion TAB (L). To be specific, as illustrated in the cross-sectional view at the left side of FIG. 5, the high-side MOS chip CHP(H) is mounted onto the chip mounting portion TAB (H) via the high melting point solder HS1, and the high-side MOS clip CLP (H) is mounted, via the high melting point solder HS2, so as to stride between the high-side MOS chip CHP(H) and the chip mounting portion TAB (L).

Subsequently, in the drawing illustrated in the center of FIG. 5, a driver IC chip CHP(C) containing silicon as a main component, for example, is mounted onto the chip mounting portion TAB (C). To be specific, as illustrated in the cross-sectional view on the right side or the top side of FIG. 5, the driver IC chip CHP(C) is mounted onto the chip mounting portion TAB (C) via the high melting point solder HS1. The control circuit CC illustrated in FIG. 1 is formed inside the driver IC chip CHP(C). Further, an electrode pad PD, made of an aluminum film, for example, is formed on a top surface of the driver IC chip CHP(C). The lead LD is disposed in a part of an outer side of the chip mounting portion TAB (C), and this lead LD and the electrode pad PD formed on the top surface of the driver IC chip CHP(C) are electrically connected to each other through a wire W made of a conductive member, for example. In addition, the material forming the wire W in the present embodiment include a material containing gold (Au) as a main component, for example.

In addition, as illustrated in FIG. 5, the gate electrode pad GP (L) formed on the low-side MOS chip CHP(L) and the electrode pad PD formed on the driver IC chip CHP(C) are connected to each other through the wire W. In the same manner, the gate electrode pad GP (H) formed on the high-side MOS chip CHP(H) and the electrode pad PD formed on the driver IC chip CHP(C) are connected to each other through the wire W.

A description will be made regarding how the semiconductor device PK1 according to the present embodiment configured as above configures the part of the DC/DC converter. In the drawing illustrated in the center of FIG. 5, the low-side MOS transistor QL illustrated in FIG. 1 is formed inside the low-side MOS chip CHP(L) mounted onto the chip mounting portion TAB (L). Further, the source electrode pad SP(L) is formed on the top surface of the low-side MOS chip CHP(L), and the source electrode pad SP(L) is electrically connected to a source region of the low-side MOS transistor QL formed inside the low-side MOS chip CHP(L). In addition, the gate electrode pad GP (L) is formed on the top surface of the low-side MOS chip CHP(L), and the gate electrode pad GP (L) is electrically connected to the gate electrode of the low-side MOS transistor QL formed inside the low-side MOS chip CHP(L). Further, a rear surface of the low-side MOS chip CHP(L) is provided as a drain region (drain electrode) of the low-side MOS transistor QL.

In the same manner, in the drawing illustrated in the center of FIG. 5, the high-side MOS transistor QH illustrated in FIG. 1 is formed inside the high-side MOS chip CHP(H) mounted onto the chip mounting portion TAB (H). Further, the source electrode pad SP(H) is formed on the top surface of the high-side MOS chip CHP(H), and the source electrode pad SP(H) is electrically connected to a source region of the high-side MOS transistor QH formed inside the high-side MOS chip CHP(H). In addition, the gate electrode pad GP (H) is formed on the top surface of the high-side MOS chip CHP(H), and the gate electrode pad GP (H) is electrically connected to a gate electrode of the high-side MOS transistor QH formed inside the high-side MOS chip CHP(H).

Further, a rear surface of the high-side MOS chip CHP(H) is provided as a drain region (drain electrode) of the high-side MOS transistor QH.

Here, as illustrated in FIG. 5, the rear surface (the drain electrode) of the low-side MOS chip CHP(L) is electrically connected to the chip mounting portion TAB (L). Further, the chip mounting portion TAB (L) and the source electrode pad SP(H) formed on the high-side MOS chip CHP(H) are connected to each other through the high-side MOS clip CLP (H). As a result, the drain electrode of the low-side MOS chip CHP(L) and the source electrode pad SP(H) of the high-side MOS chip CHP(H) are electrically connected to each other, and it is understood that the serial connection between the high-side MOS transistor QH and the low-side MOS transistor QL illustrated in FIG. 1 is realized.

Further, the source electrode pad SP(L) formed on the top surface of the low-side MOS chip CHP(L) is electrically connected to the lead LD via the low-side MOS clip CLP (L). Thus, it is possible to connect the source region of the low-side MOS transistor QL illustrated in FIG. 1 to the ground GND by connecting the lead LD, which is electrically connected to the low-side MOS clip CLP (L), to the ground.

On the other hand, the rear surface (the drain electrode) of the high-side MOS chip CHP(H) is electrically connected to the chip mounting portion TAB (H) via the high melting point solder HS1. Accordingly, it is possible to connect the drain region (drain electrode) of the high-side MOS transistor QH illustrated in FIG. 1 to the input terminal TE1 by electrically connecting the chip mounting portion TAB (H) to the input terminal TE1. As described above, it is understood that the semiconductor device PK1 according to the present embodiment illustrated in FIG. 5 configures a part of the DC/DC converter.

In the semiconductor device PK1 according to the present embodiment, for example, as illustrated in FIG. 5, the electrical connection between the low-side MOS chip CHP (L) and the lead LD is formed by using the low-side MOS clip CLP (L), but not using a wire. In the same manner, in the present embodiment, the electrical connection between the high-side MOS chip CHP(H) and the chip mounting portion TAB (L) is also formed by using the high-side MOS clip CLP (H) but not using a wire.

The reason for such a configuration is because there is a need for reducing the on-resistance as much as possible since the semiconductor device PK1 according to the present embodiment is used as a component of the DC/DC converter, and a large current flows in a current path to be connected by the low-side MOS clip CLP (L) and the high-side MOS chip CHP(H). That is, the low-side MOS transistor QL and the high-side MOS transistor QH in which a large current flows are formed in the low-side MOS chip CHP(L) and the high-side MOS chip CHP(H), respectively, and the low-side MOS clip CLP (L) and the high-side MOS chip CHP(H) are used without using the wire in order to sufficiently bring out characteristics of these transistors (power transistors). In particular, it is possible to use the steel material having low resistivity and increase a contact area when using the low-side MOS clip CLP (L) and the high-side MOS chip CHP(H), and thus, it is possible to reduce the on-resistance of the low-side MOS transistor QL and the high-side MOS transistor QH.

Further, from the viewpoint of reducing the on-resistance, not a silver paste but a solder is used for the connection between the chip mounting portion TAB (L) and the low-side MOS chip CHP(L) to be mounted onto the chip mounting portion TAB (L), and the connection between the low-side MOS chip CHP(L) and the low-side MOS clip CHP(L). From the same viewpoint, not a silver paste but a solder is used for the connection between the chip mounting portion TAB (H) and the high-side MOS chip CHP(H) to be mounted onto the chip mounting portion TAB (H), and the connection between the high-side MOS chip CHP(H) and the high-side MOS clip CLP (H). In other words, the silver paste is configured to disperse a silver filler inside a thermosetting resin, and electric conductivity and thermal conductivity thereof become low as compared to those of the solder as a metal material. As a result, in the semiconductor device PK1 to be used in the DC/DC converter which requires the reduction of the on-resistance, the solder having higher electric conductivity than the silver paste is used, and accordingly, the on-resistance of the low-side MOS transistor QL and the high-side MOS transistor QH is reduced. In particular, since the current is also caused to flow to the rear surface of the low-side MOS chip CHP(L) and the rear surface of the high-side MOS chip CHP(H) in the semiconductor device PK1 according to the present embodiment, it is important to reduce a connection resistance by replacing the silver paste with the solder from the viewpoint of reducing the on-resistance.

Meanwhile, the semiconductor device PK1 according to the present embodiment after being completed as a product is mounted onto a circuit board (mounting board). In this case, a solder is used for the connection between the semiconductor device PK1 and the mounting board. In the case of connection using the solder, the connection is formed by melting the solder, and thus, a heating process (reflow) is required.

Here, in a case where the solder used for the connection between the semiconductor device PK1 and the mounting board, and the solder used inside the semiconductor device PK1 described above are the same material, the solder used inside the semiconductor device PK1 is also melted by the heat process (reflow) to be applied in the connection between the semiconductor device PK1 and the mounting board. In this case, there occurs a problem that a crack is generated in the resin sealing the semiconductor device PK1 due to volume expansion caused by the melting of the solder, or the melted solder leaks to the outside.

As a result, the high melting point solder HS1 and the high melting point solder HS2 are used for the connection between the chip mounting portion TAB (L) and the low-side MOS chip CHP(L) to be mounted onto the chip mounting portion TAB (L), and the connection between the low-side MOS chip CHP(L) and the low-side MOS clip CLP (L). In the same manner, the high melting point solder HS1 and the high melting point solder HS2 are used for the connection between the chip mounting portion TAB (H) and the high-side MOS chip CHP(H) to be mounted onto the chip mounting portion TAB (H), and the connection between the high-side MOS chip CHP(H) and the high-side MOS clip CLP (H). In this case, the high melting point solder HS1 and the high melting point solder HS2 to be used inside the semiconductor device PK1 are not melted due to the heat process (reflow) to be applied in the connection between the semiconductor device PK1 and the mounting board. Accordingly, it is possible to prevent the problem that the crack is generated in the resin sealing the semiconductor device PK1 due to the volume expansion caused by melting of the high melting point solder HS1 and the high melting point solder HS2, or the melted solder leaks to the outside.

Here, a solder having a melting point of about 220° C., typified by Sn (tin), silver (Ag) and copper (Cu), is used as the solder to be used in the connection between the semiconductor device PK1 and the mounting board, and the semiconductor device PK1 is heated to about 260° C. at the time of the reflow. Accordingly, for example, the high melting point solder in the present specification indicates a solder that is not melted even when heated to about 260° C. Representative examples thereof includes a solder having a melting point of equal to or higher than 300° C., and a reflow temperature of about 350° C., and containing Pb (lead) by equal to or more than 90% by weight.

In addition, in the present embodiment, for example, the high melting point solder HS1 is present which is used for the connection between the chip mounting portion TAB (L) and the low-side MOS chip CHP(L), and the connection between the chip mounting portion TAB (H) and the high-side MOS chip CHP(H). Further, the high melting point solder HS2 is present which is used for the connection between the low-side MOS chip CHP(L) and the low-side MOS clip CLP (L), and the connection between the high-side MOS chip CHP(H) and the high-side MOS clip CLP (H). Basically, it is assumed that the above-described high melting point solder HS1 and high melting point solder HS2 have the same material component in the present embodiment, but it is also possible to configure the high melting point solder HS1 and the high melting point solder HS2 using different material components for example.

<Method of Manufacturing Semiconductor Device (Device to be Inspected) According to Embodiment>

The semiconductor device (device to be inspected) according to the present embodiment is, for example, the semiconductor device PK1 configuring a part of the DC/DC converter as illustrated in FIG. 5, and is configured to be mounted with the QFN package. Thus, hereinafter, a description will be made regarding a technical idea according to the present embodiment by exemplifying a method of manufacturing the semiconductor device PK1, formed of the QFN package, which configures the part of the DC/DC converter.

1. Base Material (Lead Frame) Preparing Step

First, as illustrated in FIG. 6, a lead frame LF1 is prepared. FIG. 6(A) schematically illustrates an entire configuration of the lead frame LF1, and FIG. 6(B) enlarges and illustrates a part of the lead frame LF1 illustrated in FIG. 6(A). Further, FIG. 6(C) further enlarges and illustrates the part of the lead frame LF1 illustrated in FIG. 6(B).

As illustrated in FIG. 6(C), it is understood that a plurality of product regions PR, each of which is provided with the chip mounting portion TAB (C), the chip mounting portion TAB (H), the chip mounting portion TAB (L) and the lead LD, are disposed in a matrix in the lead frame LF1 according to the present embodiment.

2. Chip Mounting Step

Next, as illustrated in FIG. 7, the high melting point solder HS1 is formed on the chip mounting portion TAB (C), the chip mounting portion TAB (H) and the chip mounting portion TAB (L) in each of the plurality of product regions PR formed in the lead frame LF1. To be specific, for example, the high melting point solder HS1 is printed, using a solder printing method, on the chip mounting portion TAB (C), the chip mounting portion TAB (H) and the chip mounting portion TAB (L).

Here, the high melting point solder HS1 indicates the solder that is not melted even when heated to about 260° C., and for example, a Pb-rich high melting point solder having a melting point of equal to or higher than 300° C., and a reflow temperature of about 350° C., and containing a lot of Pb (lead) can be exemplified.

Subsequently, as illustrated in FIG. 8, first, the driver IC chip CHP(C) is mounted onto the chip mounting portion TAB (C) in each of the plurality of product regions PR formed in the lead frame LF1. Further, the high-side MOS chip CHP(H) is mounted onto the chip mounting portion TAB (H), and thereafter, the low-side MOS chip CHP(L) is mounted onto the chip mounting portion TAB (L). In addition, a mounting order of the driver IC chip CHP(C), the high-side MOS chip CHP(H) and the low-side MOS chip CHP(L) is not limited thereto, and can be optionally changed.

3. Electrical Connection Step

Next, as illustrated in FIG. 9, the high melting point solder HS2 is formed on the high-side MOS chip CHP(H) in each of the plurality of product regions PR formed in the lead frame LF1. Thereafter, the high melting point solder HS2 is formed on the low-side MOS chip CHP(L). In detail, the high melting point solder HS2 is formed on the source electrode pad (not illustrated) formed on the high-side MOS chip CHP(H), and further, the high melting point solder HS2 is formed on the source electrode pad (not illustrated) formed on the low-side MOS chip CHP(L). Further, as illustrated in FIG. 9, the high melting point solder HS2 is formed also on a partial region of the chip mounting portion TAB (L) and a partial region of the lead.

To be specific, the high melting point solder HS2 is coated onto the high-side MOS chip CHP(H), the low-side MOS chip CHP(L), a partial region of the chip mounting portion TAB (L) and a partial region of the lead using a coating method, for example. The high melting point solder HS2 to be formed at this time may have the same material component as the high melting point solder HS1 described above, and may have a different material component therefrom.

Thereafter, as illustrated in FIG. 10, the high-side MOS clip CLP (H) is mounted so as to stride between the high-side MOS chip CHP(H) and the chip mounting portion TAB (L) in each of the plurality of product regions PR formed in the lead frame LF1. As a result, the source electrode pad formed on the high-side MOS chip CHP(H) and the chip mounting portion TAB (L) are electrically connected to each other by the high-side MOS clip CLP (H). In addition, the low-side MOS clip CLP (L) is mounted so as to stride between the low-side MOS chip CHP(L) and the lead to which the reference potential (GND potential) is supplied. As a result, the source electrode pad formed on the low-side MOS chip CHP(L) and the lead to which the reference potential is supplied are electrically connected to each other by the low-side MOS clip CLP (L).

In addition, the mounting order of the high-side MOS clip CLP (H) and the low-side MOS clip CLP (L) is not limited thereto, and can be optionally changed.

Subsequently, the reflow is performed with respect to the high melting point solder HS1 and the high melting point solder HS2. To be specific, the lead frame LF1 including the high melting point solder HS1 and the high melting point solder HS2 is heated at, for example, a temperature of about 350° C. As a result, it is possible to melt the high melting point solder HS1 and the high melting point solder HS2.

Thereafter, a flux cleaning is performed in order to remove a flux included in the high melting point solder HS1 and the high melting point solder HS2. Further, from a viewpoint of improving a bonding characteristic of a wire in a wire bonding process to be performed in the subsequent step, a plasma processing is performed with respect to the top surface of the lead frame LF1 thereby cleaning the top surface of the lead frame LF1.

Subsequently, as illustrated in FIGS. 11(A) and 11(B), the wire bonding process is performed. FIG. 11(A) is a diagram illustrating the lead frame LF1 when performing the wire bonding process. Meanwhile, in FIG. 11(A), a component (wire) actually formed by performing the wire bonding process is not illustrated, and the component (wire) is illustrated in FIG. 11(B), which is a diagram enlarging one of the product regions PR illustrated in FIG. 11(A).

In FIG. 11(B), it is understood that a plurality of the electrode pads PD and a plurality of the leads LD, which are formed in the driver IC chip CHP(C), are connected to each other by a plurality of the wires W. Further, as illustrated in FIG. 11(B), the gate electrode pad GP (H) formed on the high-side MOS chip CHP(H) and the electrode pad PD formed on the driver IC chip CHP(C) are connected to each other by the wire W. In the same manner, the gate electrode pad. GP (L) formed on the low-side MOS chip CHP(L) and the electrode pad PD formed on the driver IC chip CHP(C) are connected to each other by the wire W. In this manner, according to the present embodiment, it is understood that the high-side MOS transistor QH (see FIG. 1) formed on the high-side MOS chip CHP(H) and the low-side MOS transistor QL (see FIG. 1) formed on the low-side MOS chip CHP(L) are electrically controlled by the control circuit CC (see FIG. 1) formed in the driver IC chip CHP(C).

4. Sealing (Molding) Step

Next, as illustrated in FIG. 12, the product region formed in the lead frame LF1 is collectively sealed (molded) by the resin MR. In other words, the plurality of product regions PR inside the lead frame LF1 are collectively sealed by the resin MR so as to cover the driver IC chip CHP(C), the high-side MOS chip CHP(H) and the low-side MOS chip CHP(L), illustrated in FIG. 11(B), thereby forming a sealing body. In other words, in the present embodiment, a so-called MAP molding technique (MAP: Matrix Array Package, a batch molding technique) in which the plurality of product regions PR are enclosed in cavities and the plurality of product regions PR are collectively sealed by the resin, is adopted as a technique of sealing the semiconductor chip by the resin. According to the MAP molding technique, it is not necessary to provide a path for injecting the resin for each of the product regions PR, and thus, it is possible to tightly dispose the plurality of product regions PR. As a result, according to the MAP molding technique, it is possible to improve the number of products to be acquired, and accordingly, it is possible to obtain cost reduction of the product.

5. Outer Plating Step

Thereafter, as illustrated in FIG. 13, a plating film (solder film), which is a conductive film, is formed on a top surface of a part of the chip mounting portion TAB (C), the chip mounting portion TAB (H), the chip mounting portion TAB (L) and the lead LD, which are exposed from the rear surface of the resin MR (the sealing body). In addition, the plating film to be formed in this step is formed of a so-called lead-free solder (solder material), which practically does not include lead (Pb), and made of, for example, only tin (Sn), or tin-bismuth (Sn—Bi). Here, the lead-free solder means a solder having a lead content of equal to or less than 0.1% by weight, and this content is defined as a reference of RoHS (Restriction of Hazardous Substances) instruction.

6. Marking Step

Thereafter, information (mark) such as a product name and a model number is formed on a top surface of the sealing body formed of the resin MR. In addition, it is possible to use a method of printing using a printing scheme and a method of engraving by irradiating the top surface of the sealing body with laser as the method of forming the mark.

7. Step of Cutting into Individual Pieces

Subsequently, as illustrated in FIGS. 14(A) and 14(B), a dicing tape DT is attached to the top surface of the sealing body formed of the resin MR. Further, as illustrated in FIGS. 15(A) and 15(B), the sealing body formed of the resin MR is cut for each of the product regions PR (package dicing). To be specific, a partition region (boundary region) that partitions the plurality of product regions PR formed in the lead frame LF1 is cut by a dicing blade which is a disk-shaped rotary cutting blade, thereby cutting the respective product regions PR into individual pieces. As a result, for example, it is possible to acquire a device to be inspected (assembly) TD1 according to the present embodiment as illustrated in FIG. 15(C).

<Overview of Test Process>

Next, a test process is performed with respect to the acquired device to be inspected TD1. The test process includes various types of electrical characteristic of the device to be inspected TD1, for example, and a description will be made focusing on a test process for measuring a thermal resistance of the device to be inspected TD1 hereinafter.

For example, since a relatively large current is caused to flow in the device to be inspected configuring the DC/DC converter, there is a characteristic that the device to be inspected easily generates heat. Accordingly, from a viewpoint of improving operational reliability of the DC/DC converter, a heat dissipation characteristic of the device to be inspected becomes important. That is, when the heat dissipation characteristic of the device to be inspected deteriorates, the heat generated in the device to be inspected is hardly dissipated to the outside, and as a result, an internal temperature of the device to be inspected increases. When the internal temperature of the device to be inspected increases as above, characteristics of the semiconductor element formed inside the device to be inspected deteriorate, and further, a possibility that the semiconductor element malfunctions increases, so that it is not desirable from the viewpoint of improving the reliability of the device to be inspected. Thus, there exists the test process of inspecting whether the acquired device to be inspected has the heat dissipation characteristic within an allowable range.

To be specific, a concept of the thermal resistance is used as an indicator for inspecting the heat dissipation characteristic of the device to be inspected. The thermal resistance is the indicator, for example, that expresses a difficulty in transmission of heat from the semiconductor chip, and can be calculated from a temperature change (temperature difference) of the semiconductor chip when a certain amount of heat (power) is supplied. In other words, when the power to be supplied is set to P, and the temperature difference of the semiconductor chip is set to $\Delta T$, it is possible to express a thermal resistance $\theta = \Delta T/P (° C./W)$. Qualitatively, a low thermal resistance means that the heat is easily transmitted, and corresponds to high heat dissipation efficiency. On the contrary, a high thermal resistance means that the heat is hardly transmitted, and means low heat dissipation efficiency. Accordingly, it is possible to inspect the heat dissipation characteristic of the device to be inspected by measuring the thermal resistance of the semiconductor chip. In other words, it is possible to evaluate the heat dissipation characteristic of the device to be inspected by measuring whether a value of the thermal resistance is included in the allowable range, and accordingly, it is possible to sort the device to be inspected having a favorable heat dissipation characteristic, and the device to be inspected of which a heat dissipation characteristic does not satisfy the reference.

Meanwhile, it is difficult to directly measure the temperature of the semiconductor chip sealed by the sealing body. Thus, the temperature measurement of the semiconductor chip is performed by indirectly measuring a physical quantity. To be specific, the temperature of the semiconductor chip is indirectly measured by measuring a forward voltage drop of a PN junction, which is proportional to the temperature. In addition, in the present specification, the above-described forward voltage drop will be referred to simply as VF, in some cases.

For example, the device to be inspected according to the present embodiment configuring the DC/DC converter includes the high-side MOS transistor QH and the low-side MOS transistor QL. At this time, when the DC/DC converter is operated, the current flows to the high-side MOS transistor QH and the low-side MOS transistor QL, and the heat is generated from the high-side MOS transistor QH and the low-side MOS transistor QL. Accordingly, in the device to be inspected according to the present embodiment, it is necessary to measure mainly the temperature in the high-side MOS chip CHP(H) forming the high-side MOS transistor QH and in the low-side MOS chip CHP(L) forming the low-side MOS transistor QL.

At this time, each of the high-side MOS transistor QH and the low-side MOS transistor QL is configured using a so-called power transistor, and a PN junction diode is parasitically formed in the power transistor. In the present specification, the PN junction diode parasitically formed is referred to as a body diode. Accordingly, for example, it is possible to indirectly measure the temperature of the high-side MOS transistor QH by measuring the forward voltage drop of the body diode that is parasitically present in the high-side MOS transistor QH. In the same manner, it is possible to indirectly measure the temperature of the low-side MOS transistor QL by measuring the forward voltage drop of the body diode that is parasitically present in the low-side MOS transistor QL.

Hereinafter, a description will be made regarding a point that the body diode is parasitically formed according to a power MOS transistor with reference to a device structure of the power MOS transistor, and thereafter, a description will be made regarding details of the test process in which the thermal resistance of the semiconductor chip can be evaluated by measuring the forward voltage drop of the body diode in the present embodiment.

FIG. 16 is a diagram illustrating a cross-sectional configuration example of the power MOS transistor. In FIG. 16, for example, an epitaxial layer EP, which is an n-type semiconductor layer, is formed on a semiconductor substrate 1S made of silicon to which an n-type impurity is added, and a drain region DR of the power MOS transistor is configured by the semiconductor substrate 1S and the epitaxial layer EP. Further, a channel layer CH made of a p-type semiconductor layer is formed on the epitaxial layer EP, and a source region SR made of an n-type semiconductor layer is formed on the channel layer CH. Further, a trench TR is formed so as to penetrate through the source region SR and the channel layer CH and reaches the epitaxial layer EP. A gate insulating film GOX, made of a silicon oxide film, for example, is formed on an inner wall of the trench TR, and a gate electrode GE, made of a polysilicon film, for example, is formed to cause the trench TR to be embedded therein by the gate insulating film GOX.

Next, an insulating film IF is formed so as to cover the gate electrode GE in which the trench TR is embedded, and a trench TR2 is formed so as to penetrate through the insulating film IF and the source region SR and reaches the channel layer CH. As a result, the source region SR is configured to be interposed between the trench TR and the trench TR2. Further, a body contact region BC, made of a p-type semiconductor layer with a higher impurity concentration than the channel layer CH, is formed on a bottom portion of the trench TR2. In addition, a source wiring SL is formed from the inside of the trench TR2 across the insulating film IF. In the power MOS transistor configured as above, the source region SR and the channel layer CH are electrically connected to each other by the source wiring SL embedded in the trench TR2.

Here, for example, the channel layer CH is formed using the p-type semiconductor layer while the epitaxial layer EP is formed using the n-type semiconductor layer. Accordingly, a boundary between the channel layer CH and the epitaxial layer EP becomes the pn junction, so that the body diode BD, which is the pn junction diode, is formed by the channel layer CH as the p-type semiconductor layer, and the epitaxial layer EP as the n-type semiconductor layer. In other words, the body diode BD is parasitically formed in the power MOS transistor. In this case, a plurality of operation modes to be described hereinafter are present in the power MOS transistor.

First, in a first operation mode, a voltage equal to or higher than a threshold voltage is supplied to the gate electrode GE in a state where a positive voltage is supplied to the drain region DR, and a negative voltage is supplied to the source region SR. In this case, a channel is formed in a region in contact with a side surface region of the trench TR in the channel layer CH, and the source region SR and the drain region DR are made conductive by the channel, and the current flows from the drain region DR toward the source region SR. At this time, in the body diode BD, a positive voltage is supplied to the epitaxial layer EP as the n-type semiconductor layer, and a negative voltage is supplied to the channel layer CH as the p-type semiconductor layer that is electrically connected to the source region SR. As a result, a reverse bias is supplied to the body diode BD, and thus, the current does not flow to the body diode BD. Accordingly, in the first operation mode, the current flows from the drain region DR to the source region SR via the channel regardless of the body diode BD that is parasitically formed.

Meanwhile, when a voltage lower than the threshold voltage is supplied to the gate electrode GE to turn off the power MOS transistor in the first operation mode, the channel is not formed in the region in contact with the side surface region of the trench TR, and the reverse bias is supplied to the body diode BD. Thus, the current does not flow between the drain region DR and the source region SR.

Subsequently, in a second operation mode, a voltage of equal to or higher than a threshold value is supplied to the gate electrode GE in a state where the negative voltage is supplied to the drain region DR, and the positive voltage is supplied to the source region SR. In this case, a channel is formed in a region in contact with a side surface region of the trench TR in the channel layer CH, and the source region SR and the drain region DR are made conductive by the channel, and the current flows from the source region SR toward the drain region DR. At this time, in the body diode BD, a negative voltage is supplied to the epitaxial layer EP as the n-type semiconductor layer, and a positive voltage is supplied to the channel layer CH as the p-type semiconductor layer that is electrically connected to the source region SR. As a result, a forward bias is applied to the body diode BD. Thus, superficially, it is considered that the current flows to the body diode BD, but the current does not flow to the body diode BD which is forward-biased since the on-resistance due to the channel is sufficiently low, and the current flows from the source region SR to the drain region DR via the channel having a low resistance. Accordingly, in the second operation mode, the forward bias is supplied to the body diode BD that is parasitically formed, but the current flows from the source region SR to the drain region DR via the channel having the lower on-resistance than the body diode BD.

Next, in a third operation mode, a voltage lower than the threshold voltage is supplied to the gate electrode GE in a state where the negative voltage is supplied to the drain region DR, and the positive voltage is supplied to the source region SR. In this case, the channel is not formed in the region in contact with the side surface region of the trench TR. Thus, it is considered that the source region SR and the drain region DR are not made conductive. Meanwhile, in the body diode BD, the negative voltage is supplied to the epitaxial layer EP as the n-type semiconductor layer, and the positive voltage is supplied to the channel layer CH as the p-type semiconductor layer that is electrically connected to the source region SR. As a result, the forward bias is supplied to the body diode BD, and as a result, the current flows from the source region SR to the drain region DR via the body diode BD.

As described above, it is understood that the current flows from the source region SR to the drain region DR regardless of an on-operation or an off-operation of the power MOS transistor in a case where the negative voltage is supplied to the drain region DR and the positive voltage is supplied to the source region SR in the power MOS transistor. That is, in the above-described second operation mode, the channel is formed by turning on the power MOS transistor, and the current flows from the source region SR to the drain region DR via the channel. On the other hand, in the above-described third operation mode, the current flows from the source region SR to the drain region DR via the body diode BD by supplying the forward bias to the body diode BD that is parasitically formed even in a state where the power MOS transistor is turned off.

<Details of Test Process>

Hereinafter, a description will be made regarding the test process in which the forward voltage drop of the body diode, which corresponds to the temperature of the semiconductor chip, is measured by using the second operation mode and the third operation mode of the power MOS transistor described above, and accordingly, the thermal resistance of the semiconductor chip is evaluated.

FIG. 17 is a flowchart illustrating a flow of the test process in which the thermal resistance of the high-side MOS chip configuring the DC/DC converter is evaluated. In addition, FIG. 18 is a circuit block diagram including the high-side MOS transistor QH, the low-side MOS transistor QL, and the control circuit CC, which are the components of the DC/DC converter.

In FIG. 18, the drain region of the high-side MOS transistor QH is connected to a lead VIN, and the source region thereof is connected to a lead VSWH. In addition, the gate electrode of the high-side MOS transistor QH is connected to a lead GH. On the other hand, the drain region of the low-side MOS transistor QL is connected to the lead VSWH, and the source region thereof is connected to a lead PGND. In addition, the gate electrode of the low-side MOS transistor QL is connected to a lead GL.

Here, first, the high-side MOS transistor QH is focused. In FIG. 18, the positive voltage is supplied to the lead VSWH that is electrically connected to the source region of the high-side MOS transistor QH, and the negative voltage is supplied to the lead VIN that is electrically connected to the drain region of the high-side MOS transistor QH. Further, the voltage lower than the threshold voltage is supplied to the lead GH electrically connected to the gate electrode of the high-side MOS transistor QH. In this case, the high-side MOS transistor QH operates in the third operation mode described above. That is, as illustrated in FIG. 18, a reference current $I_M$ is caused to flow to the lead VIN from the lead VSWH via the body diode BD1. At this time, a potential difference between the lead VSWH and the lead VIN becomes a forward voltage drop of the body diode BD1. At this time, when it is assumed that the high-side MOS chip is placed at the room temperature, VF of the body diode BD1 becomes a value corresponding to the room temperature, and this value is set as an initial value VF1(H) (S101 in FIG. 17).

Subsequently, as illustrated in FIG. 19, the positive voltage is supplied to the lead VSWH, the negative voltage is supplied to the lead VIN, and the voltage equal to or higher than the threshold voltage is supplied to the lead GH. In this case, the high-side MOS transistor QH operates in the second operation mode described above. That is, as illustrated in FIG. 19, a current $I_H$ is caused to flow to the lead VIN from the lead VSWH via the high-side MOS transistor QH that is turned on. To be specific, for example, a current of $I_H$=14.2 A is caused to flow to the high-side MOS transistor QH for a time $T_H$=20 ms (S102 in FIG. 17). In this manner, the heat amount is supplied to the high-side MOS transistor QH, and the high-side MOS transistor QH generates heat. As a result, the temperature of the high-side MOS chip increases from the room temperature.

Next, as illustrated in FIG. 20, the positive voltage is supplied to the lead VSWH, the negative voltage is supplied to the lead VIN, and the voltage smaller than the threshold voltage is supplied to the lead GH. In this case, the high-side MOS transistor QH is turned off, and operates in the third operation mode described above. That is, as illustrated in FIG. 20, the reference current $I_M$ is caused to flow to the lead VIN from the lead VSWH via the body diode BD1. At this time, the potential difference between the lead VSWH and the lead VIN becomes a forward voltage drop of the body diode BD1. At this time, since the temperature of the high-side MOS chip increases, VF of the body diode BD1 becomes a value corresponding to the increased temperature, and the value is set as VF2(H) (S103 in FIG. 17).

In this manner, it is possible to acquire the initial value VF1(H) corresponding to the room temperature, and the value VF2(H) corresponding to the increased temperature. Thereafter, a difference between the initial value VF1(H) and the value VF2(H) is obtained, thereby calculating ΔVF(H)=VF1(H)−VF2(H) (S104 in FIG. 17). As a result, it is possible to evaluate the thermal resistance of the high-side MOS chip based on ΔVF(H).

Subsequently, the low-side MOS transistor QL is focused. FIG. 21 is a flowchart illustrating a flow of the test process in which the thermal resistance of the low-side MOS chip configuring the DC/DC converter is evaluated. In addition, FIG. 22 is a circuit block diagram including the high-side MOS transistor QH, the low-side MOS transistor QL and the control circuit CC, which are the components of the DC/DC converter.

In FIG. 22, the positive voltage is supplied to the lead PGND that is electrically connected to the source region of the low-side MOS transistor QL, and the negative voltage is supplied to the lead VSWH that is electrically connected to the drain region of the low-side MOS transistor QL. Further, the voltage smaller than the threshold voltage is supplied to the lead GL that is electrically connected to the gate electrode of the low-side MOS transistor QL. In this case, the low-side MOS transistor QL operates in the third operation mode described above. That is, as illustrated in FIG. 22, the reference current $I_M$ is caused to flow to the lead VSWH from the lead PGND via a body diode BD2. At this time, a potential difference between the lead PGND and the lead VSWH becomes a forward voltage drop of the body diode BD2. At this time, when it is assumed that the low-side MOS chip is placed at the room temperature, VF of the body diode BD2 becomes a value corresponding to the room temperature, and this value is set as an initial value VF1(L) (S201 in FIG. 21).

Subsequently, as illustrated in FIG. 23, the positive voltage is supplied to the lead PGND, the negative voltage is supplied to the lead VSWH, and the voltage equal to or higher than the threshold voltage is supplied to the lead GL. In this case, the low-side MOS transistor QL operates in the second operation mode described above. That is, as illustrated in FIG. 23, a current $I_L$ is caused to flow to the lead VSWH from the lead PGND via the low-side MOS transistor QL that is turned on. To be specific, for example, a current of $I_L$=42.8 A is caused to flow to the low-side MOS transistor QL for a time $T_L$=20 ms (S202 in FIG. 21). In this manner, the heat amount is supplied to the low-side MOS transistor QL, and the low-side MOS transistor QL generates heat. As a result, the temperature of the low-side MOS chip increases from the room temperature. In addition, when the time $T_L$ is called a first time, and the time $T_H$ is called a second time, the first time and the second time are the same because the both are 20 ms, but the first time and the second time may be set to be different from each other.

Next, as illustrated in FIG. 24, the positive voltage is supplied to the lead PGND, the negative voltage is supplied to the lead VSWH, and the voltage smaller than the threshold voltage is supplied to the lead GL. In this case, the low-side MOS transistor QL is turned off, and operates in the third operation mode described above. That is, as illustrated in FIG. 24, the reference current $I_M$ is caused to flow to the lead VSWH from the lead PGND via the body diode BD2. At this time, the potential difference between the lead PGND and the lead VSWH becomes a forward voltage drop of the body diode BD2. At this time, since the temperature of the low-side MOS chip increases, VF of the body diode BD2 becomes a value corresponding to the increased temperature, and this value is set as VF2(L) (S203 in FIG. 21).

In this manner, it is possible to acquire the initial value VF1(L) corresponding to the room temperature, and the value VF2(L) corresponding to the increased temperature. Thereafter, a difference between the initial value VF1(L) and the value VF2(L) is obtained, thereby calculating ΔVF(L)=VF1(L)−VF2(L) (S204 in FIG. 21). As a result, it is possible to evaluate the thermal resistance of the low-side MOS chip based on ΔVF(L). As described above, the test process in which the thermal resistance of the high-side MOS chip and the thermal resistance of the low-side MOS chip are evaluated is performed.

<Room for Improvement in Test Process>

It has been found out that there is a room for improvement as follows in the above-described test process according to a study of the present inventors, and a description will be made regarding such a point.

For example, in the test process, the current is caused to flow from a socket terminal to the lead by contacting the socket terminal with the lead provided in the device to be inspected.

Here, since the low-side MOS chip has a larger planar size than the high-side MOS chip, the heat amount to be supplied to the low-side MOS chip is greater than the heat amount to be supplied to the high-side MOS chip. Further, in the low-side MOS chip having the large planar size, the large current is caused to flow in a short period of time in order to improve measurement accuracy of the thermal resistance.

To be specific, when the heat amount is supplied to the high-side MOS transistor QH, the current of $I_H$=14.2 A is caused to flow for the time $T_H$=20 ms. On the other hand, when the heat amount is supplied to the low-side MOS transistor QL, the current of $I_L$=42.8 A is caused to flow for the time $T_L$=20 ms.

Accordingly, when the heat amount is supplied to the low-side MOS transistor QL, for example, the large current flows to the lead PGND and the lead VSWH as illustrated in FIG. 23. Further, the current flows in the lead VSWH, for example, as illustrated in FIG. 19, when the heat amount is supplied to the high-side MOS transistor QH.

At this time, according to the study of the present inventors, it has been found out that reduction in yield typified by defective appearance of the lead, and reduction in service life of the socket terminal in contact with the lead PGND and the lead VSWH become obvious in the lead PGND and the lead VSWH in which the large current flows.

A description will be made in more detail regarding such a point. First, there are various types of the socket terminal to be used in the test process of the device to be inspected. For example, there is a socket terminal called a pogo pin in which a rod-shaped terminal with a sharp end portion is displaced in a vertical direction. In addition, there is a socket terminal having a so-called leaf spring structure which is provided with a main body portion including a support portion and a plate-like portion connected to the support portion, and having an end portion projected toward the device to be inspected, and secures the contact between the device to be inspected and the end portion by deflection of the plate-like portion when the device to be inspected is pressed against the end portion.

At this time, it is considered that the socket terminal having the leaf spring structure, which can easily secure the contact area formed in the device to be inspected with the lead and obtain space saving, is more effective than the pogo pin when considering the large current is caused to flow to the socket terminal. As a result, in the test process in which the large current is caused to flow, the socket terminal having the leaf spring structure is relatively frequently used.

FIG. 25 is a cross-sectional view illustrating a schematic embodiment of the test process. As illustrated in FIG. 25, in the test process of the device to be inspected TD1, the current is caused to flow from a socket terminal STE to the lead LD by contacting the socket terminal STE with the lead LD formed in the device to be inspected TD1. As a result, the test of the device to be inspected TD1 is performed.

Here, in the test illustrated in FIG. 25, the socket terminal STE having the leaf spring structure is used. The socket terminal STE is provided with a main body portion BY including a support portion SPT and a plate-like portion BU to be connected to the support portion SPT, for example, as illustrated in FIG. 25. Further, an end portion PU that projects to an upper side, which is the side on which the device to be inspected TD1 is disposed, is provided in the plate-like portion BU, and the end portion PU is configured to be in contact with the lead LD.

Meanwhile, the lead LD exposed from the resin MR is formed in the device to be inspected TD1, and a solder film SF is formed on a top surface of the lead LD. The reason why the solder film SF is formed on the top surface of the lead LD in such a manner is as follows. That is, for example, when the semiconductor device, formed using the device to be inspected TD1 as a non-defective product, is mounted onto the mounting board, an electrode of the mounting board and the lead LD of the semiconductor device are connected to each other by the solder material, and the solder film SF is formed in advance on the top surface of the lead LD in order to improve wettability of the solder material at this time.

Accordingly, in the test process of the device to be inspected TD1, the socket terminal STE is directly contacted with the solder film SF formed on the top surface of the lead LD.

When the test process is performed using the socket terminal STE having the leaf spring structure as above, in particular, the defective appearance of the lead in which the large current is caused to flow, and the reduction in service life of the socket terminal STE in contact with an external terminal in which the large current is caused to flow become obvious. A description will be made regarding such a mechanism.

FIG. 26 is a flowchart that describes a mechanism that causes the defective appearance of the lead and the reduction in service life of the socket terminal. First, as illustrated in FIG. 26, when the large current is caused to flow between the lead and the socket terminal, the temperature of a contact portion between the lead and the socket terminal increases (S301). Further, when the temperature of the contact portion increases, the solder film formed in the lead is softened (S302), the solder material adheres to the socket terminal (S303). Thereafter, the solder material adhering to the socket terminal is oxidized (S304). As a result, a contact resistance between the lead and the socket terminal increases (S305). At this time, in a plurality of the socket terminals, each adhesion amount of the solder materials is different, and further, there is a variation in the oxidized state of the solders. Thus, a variation occurs in the contact resistance between the lead and the socket terminal. As a result, the current flows preferentially to the socket terminal having a low contact resistance. That is, a current value flowing to each pin increases (S306), and accordingly, the temperature of the contact portion between the lead and the socket terminal further increases (S307).

By repeating such processes, the solder film formed in the lead is melted, and the melted solder material is excluded by the socket terminal in contact with the lead. In particular, in the case of adopting the socket terminal having the leaf spring structure, the contact area between the lead and the socket terminal is large, and thus, an exclusion amount of the melted solder material is also large. As a result, for example, as illustrated in FIG. 27, the solder material sticks out from a lead LD1, and a so-called solder whisker SW occurs, thereby causing the defective appearance of the lead LD1. Further, when a distance between the lead LD1 and the lead LD2, illustrated in FIG. 27, for example, is decreased in accordance with downsize of the semiconductor device, a possibility that the lead LD1 and the lead LD2 are short-circuited via the solder whisker SW is also increased.

Meanwhile, the solder material adheres to the socket terminal, and the adhering solder material is oxidized, so that the top surface of the socket terminal becomes close to the state of being covered by an insulating film. Further, when the current flowing to the socket terminal increases in this state, it is considered that a dielectric breakdown occurs in the insulating film, and a spark is generated. It is estimated that the end portion of the socket terminal is lost due to such generation of the spark and accordingly, it is considered that the service life of the socket terminal is reduced.

According to the mechanism described above, it is understood that the defective appearance of the device to be inspected, and the reduction in service life of the socket terminal easily become obvious in the test process in which the large current is caused to flow. As a result, there is a room for further improvement in the test process in which the large current is caused to flow. Thus, the present embodiment is devised with respect to the room for the improvement described above. Hereinafter, a description will be made regarding a technical idea according to the present embodiment devised in such a manner.

<Test Process in Embodiment>

FIG. 28 is a plan view illustrating a configuration of a test socket TS to be used in the test process according to the present embodiment. As illustrated in FIG. 28, the test socket TS according to the present embodiment has a rectangular shape, and has a housing portion RU in which the device to be inspected TD1 is disposed in a center portion thereof. In the test socket TS illustrated in FIG. 28, a state where the device to be inspected TD1 is disposed in the housing portion RU is illustrated. Further, in the test socket TS according to the present embodiment, a plurality of socket terminals STE1 and a plurality of the socket terminals STE are disposed so as to surround the housing portion RU in which the device to be inspected TD1 is disposed.

Further, in FIG. 28, the socket terminal STE1, which is diagonally shaded, is a characteristic socket terminal in the present embodiment, and the socket terminal STE, which is not diagonally shaded, is a general socket terminal illustrated in FIG. 25, for example. In other words, the socket terminal STE1 and the socket terminal STE having different structures from each other are provided in the test socket TS according to the present embodiment. In addition, the structure of the characteristic socket terminal STE1 in the present embodiment will be described later.

The plurality of leads are provided in the device to be inspected TD1 disposed in the housing portion RU of the test socket TS, and in FIG. 28, the plurality of leads include the lead VSWH, the lead PGND and the lead VIN. Further, the socket terminal corresponding to the lead VSWH and the lead PGND is configured using the socket terminal STE1. On the other hand, the socket terminal corresponding to other external terminals including the lead VIN is configured using the socket terminal STE. That is, in the present embodiment, the characteristic socket terminal STE1 in the present embodiment is applied at least to the socket terminal in contact with the lead PGND or the lead VSWH in which the large current is caused to flow.

In addition, the lead formed in the device to be inspected TD1 is exposed from a lower surface of the semiconductor device PK1, but the lead is drawn by a solid line to be easy to understand in FIG. 28.

In addition, the chip mounting portion TAB (L), the chip mounting portion TAB (H) and the chip mounting portion TAB (C) are exposed to the lower surface of the device to be inspected TD1. Further, a pogo pin PG1 is in contact with the chip mounting portion TAB (L), and a pogo pin PG2 is in contact with the chip mounting portion TAB (H). In the same manner, a pogo pin PG3 is in contact with the chip mounting portion TAB (C).

Next, FIG. 29 is a cross-sectional view illustrating a state where the device to be inspected TD1 is disposed in the test socket TS. As illustrated in FIG. 29, the device to be inspected TD1 is disposed in the test socket TS, for example, using a handler HD. At this time, in FIG. 29, the lead PGND is exposed from the lower surface of the device to be inspected TD1, and the lead PGND is contacted with the socket terminal STE1. In the same manner, the lead VIN is also exposed from the lower surface of the device to be inspected TD1, and the lead VIN is contacted with the socket terminal STE.

In addition, the chip mounting portion TAB (L) and the chip mounting portion TAB (H) are also exposed from the lower surface of the device to be inspected TD1, and the pogo pin PG1 is in contact with the chip mounting portion TAB (L), and the pogo pin PG2 is in contact with the chip mounting portion TAB (H). That is, as illustrated in FIG. 29, the low-side MOS chip CHP(L) is disposed onto the chip mounting portion TAB (L), and a rear surface of the chip mounting portion TAB (L) is exposed from the sealing body formed of the resin MR. Further, the pogo pin PG1, which is a test terminal different from the socket terminal, is in contact with the exposed rear surface of the chip mounting portion TAB (L). In the same manner, the high-side MOS chip CHP(H) is disposed onto the chip mounting portion TAB (H), and a rear surface of the chip mounting portion TAB (H) is exposed from the sealing body formed of the resin MR. Further, the pogo pin PG2, which is a test terminal different from the socket terminal, is in contact with the exposed rear surface of the chip mounting portion TAB (H).

Here, the socket terminal STE1 in contact with the lead PGND is the characteristic socket terminal in the present embodiment, and the structure thereof will be described hereinafter.

FIG. 30 is a cross-sectional view illustrating a configuration of the socket terminal STE1 according to the present embodiment. In FIG. 30, the socket terminal STE1 according to the present embodiment has the main body portion BY including the support portion SPT, and the plate-like portion BU is provided so as to be connected to the support portion SPT. Further, the end portion PU projected toward the upper side is formed in the plate-like portion BU, and a projecting portion PJ1 and a projecting portion PJ2 are integrally provided in the end portion PU.

In particular, in the socket terminal STE1, the plate-like portion BU extends in a horizontal direction, which is a direction parallel to a top surface of the main body portion BY, and the socket terminal STE1 including the plate-like portion BU configured as above has a so-called leaf spring structure. From this point, it may be said that the socket terminal STE1 has the different structure from the pogo pins PG1 and PG2 illustrated in FIG. 29. In other words, each of the pogo pins PG1 and PG2 illustrated in FIG. 29 has a configuration in which the end portion thereof slides in the vertical direction, and does not include the plate-like portion BU, which extends in the horizontal direction parallel to the top surface of the main body portion BY, unlike the leaf spring structure, and accordingly, the socket terminal STE1 of the present embodiment assuming the leaf spring structure is different from the pogo pins PG1 and PG2 illustrated in FIG. 29.

Here, a first characteristic point according to the present embodiment is that the projecting portion PJ1 and the projecting portion PJ2 are provided in the end portion PU of the socket terminal STE1. In this manner, it is possible to enable contact, for example, between the lead PGND and the socket terminal STE1 in which a large current is caused to flow at the two points by a contact using the projecting portion PJ1 and by a contact using the projecting portion PJ2. As a result, the current flowing from the socket terminal STE1 to the lead PGND flows by being dispersed into a path flowing in the projecting portion PJ1 and a path flowing in the projecting portion PJ2. Accordingly, even in a case where the large current is caused to flow between the socket terminal STE1 and the lead PGND, it is possible to suppress an increase in the temperature of the contact portion between the socket terminal STE1 and the lead PGND. In this manner, according to the present embodiment, the mechanism illustrated in the flowchart of FIG. 26 hardly occurs, and accordingly, it is possible to suppress the generation of the defective appearance of the device to be inspected and the reduction in service life of the socket terminal STE1.

In addition, in the present embodiment, the description has been made regarding the example in which the two projecting portion PJ1 and projecting portion PJ2 are provided in the end portion PU, but the present invention is not limited thereto, and for example, it may be configured such that three or more projecting portions are provided in the end portion PU. In this case, it is possible to further increase the current dispersion effect, and accordingly, it is possible to effectively suppress an increase in the temperature of the contact portion.

Subsequently, a second characteristic point according to the present embodiment is that a height of the projecting portion PJ1 is higher than a height of the projecting portion PJ2 as illustrated in FIG. 30, for example. That is to say, the height of the projecting portion P31 on a side separated from the support portion SPT is higher than the height of the height of the projecting portion PJ2 on a side close to the support portion SPT. In other words, it is also possible to say that the height of the projecting portion PJ2 on the side close to the support portion SPT is lower than the height of the projecting portion PJ1 on the side separated from the support portion SPT. In this manner, as will be described later, the projecting portion PJ1 and the projecting portion PJ2 provided in the end portion PU have the same height when the plate-like portion BU of the socket terminal STE1 is deflected by pressing the lead PGND against the socket terminal STE1. As a result, according to the present embodiment, it is possible to reliably enable contact between the lead PGND and the socket terminal STE1 using both the projecting portion PJ1 and the projecting portion PJ2. In this manner, it is possible to improve the reliability of the two-point contact using the projecting portion PJ1 and the projecting portion PJ2, and it is possible to improve stability of the contact resistance.

Further, a description will be made regarding a third characteristic point according to the present embodiment. FIG. 31(A) is a diagram enlarging and illustrating a region AR of FIG. 30, and FIG. 31(B) is a diagram of FIG. 31(A) seen from an upper surface. As illustrated in FIGS. 31(A) and 31(B), the third characteristic point according to the present embodiment is that a shape of each top surface of the projecting portion PJ1 and the projecting portion PJ2 is a concavo-convex shape. That is, a plurality of microprojections MPJ are formed on each top surface of the projecting portion PJ1 and the projecting portion PJ2. In other words, it is possible to say that the top surface of the projecting portion PJ1 and the projecting portion PJ2 is subjected to a surface roughening treatment. In this manner, according to the present embodiment, it is possible to secure the plurality of contact points, and thus, it is possible to further stabilize the contact resistance to be low. In addition, it is possible to obtain the current dispersion effect by the multiple-point contact, and an effect of reducing Joule heat by increasing the contact area.

Further, the socket terminal STE1 according to the present embodiment is configured as above, and it is possible to form the socket terminal STE1 using, for example, a wire-cut electric discharge machining or an etching technique.

Here, the socket terminal STE1 to be connected to the lead PGND to be used in the test process of the low-side MOS chip will be called a first socket terminal, and the socket terminal STE1 to be connected to the lead VSWH will be called a second socket terminal. In this case, the first socket terminal functions as an input terminal and the second socket terminal functions as an output terminal.

Here, as illustrated in FIG. 30, each of the first socket terminal and the second socket terminal has the main body portion BY including the support portion SPT, the plate-like portion BU, which is connected to the support portion SPT and further includes the end portion PU projected toward the device to be inspected, and the projecting portion PJ1 and the projecting portion PJ2 which are integrally provided in the end portion PU.

In addition, the socket terminal STE1 to be connected to the lead VSWH to be used in the test process of the high-side MOS chip will be called a third socket terminal, and the socket terminal STE to be connected to the lead VIN will be called a fourth socket terminal. In this case, the third socket terminal functions as the input terminal, and the fourth socket terminal functions as the output terminal.

Here, as illustrated in FIG. 30, the third socket terminal has the main body portion BY including the support portion SPT, the plate-like portion BU, which is connected to the support portion SPT and further includes the end portion PU projected toward the device to be inspected, and the projecting portion PJ1 and the projecting portion PJ2 which are integrally provided in the end portion PU. On the other hand, as illustrated in FIG. 25, the fourth socket terminal has the main body portion BY including the support portion SPT, and the plate-like portion BU, which is connected to the support portion SPT and further includes the end portion PU projected toward the device to be inspected TD1, but the projecting portion is not formed in the end portion PU.

At this time, the second socket terminal and the third socket terminal are connected to the same lead VSWH (external terminal), and thus, it is possible to say that the third socket terminal is the same as the second socket terminal. In addition, the lead VSWH (external terminal) to be used to cause the current to flow out in the test process of the low-side MOS chip is used to cause the current to flow in (be supplied) in the test process of the high-side MOS chip. That is, the lead VSWH (external terminal) to be used for causing the current to flow in (be supplied) in the test process of the high-side MOS chip is used for causing the current to be flow out in the test process of the low-side MOS chip.

Further, the socket terminal STE illustrated in FIG. 25 is in contact with a lead to be connected to the driver IC chip having a smaller planar size than the low-side MOS chip and the high-side MOS chip. When the socket terminal STE is called a fifth socket terminal, as illustrated in FIG. 25, the fifth socket terminal has the main body portion BY including the support portion SPT, and the plate-like portion BU, which is connected to the support portion SPT and further includes the end portion PU projected toward the device to be inspected TD1, and the projecting portion is not formed in the end portion PU.

In this manner, it is possible to perform a test process of the driver IC chip in addition to the test process of the high-side MOS chip and the test process of the low-side MOS chip. In other words, in the present embodiment, the description has been made mainly regarding the test process of the high-side MOS chip and the test process of the low-side MOS chip, and it is possible to further include the test process of the driver IC chip in the present embodiment.

Next, FIG. 32 is a diagram enlarging and illustrating a connection mode between the lead and the socket terminal. FIG. 32 illustrates the connection mode between the socket terminal, and each of the lead VSWH and the lead VIN to be used in the test process of the high-side MOS chip.

As illustrated in FIG. 32, the characteristic socket terminal STE1 in the present embodiment is in contact with the lead VSWH exposed from the resin MR, and in particular, it is understood that the solder film SF formed on the top surface of the lead VSWH is in contact with the projecting portion PJ1 having the higher height than the projecting portion PJ2. Meanwhile, the socket terminal STE illustrated in FIG. 25 is in contact with the lead VIN exposed from the resin MR.

On the other hand, FIG. 33 illustrates a connection mode between the socket terminal and each of the lead VSWH and the lead PGND to be used in the test process of the low-side MOS chip.

As illustrated in FIG. 33, the characteristic socket terminal STE1 in the present embodiment is in contact with the lead VSWH exposed from the resin MR, and in particular, it is understood that the solder film SF formed on the top surface of the lead VSWH is in contact with the projecting portion PJ1 having the higher height than the projecting portion PJ2. In the same manner, the characteristic socket terminal STE1 in the present embodiment is in contact also with the lead PGND exposed from the resin MR, and in particular, it is understood that the solder film SF formed on the top surface of the lead PGND is in contact with the projecting portion PJ1 having the higher height than the projecting portion PJ2.

Subsequently, FIG. 34 is a cross-sectional view illustrating the state of pressing the device to be inspected TD1. As illustrated in FIG. 34, in the test process according to the present embodiment, a vertical load is applied to press the device to be inspected TD1, for example, by using the handler HD after disposing the device to be inspected TD1 inside the test socket TS. As a result, the socket terminal STE1 is deflected and the lead PGND and the socket terminal STE1 are reliably contacted with each other. In the same manner, the socket terminal STE is deflected, and the lead VIN and the socket terminal STE are reliably contacted with each other.

In addition, in the present embodiment, the device to be inspected TD1 is pressed using the handler HD, but in a case where the test socket TS is provided with a lid, for example, the device to be inspected TD1 may be pressed using this lid.

FIG. 35 is a diagram enlarging and illustrating the connection mode between the lead and the socket terminal at the time of pressing. FIG. 35 illustrates the connection mode between the socket terminal and each of the lead VSWH and the lead VIN to be used in the test process of the high-side MOS chip.

As illustrated in FIG. 35, the characteristic socket terminal STE1 in the present embodiment is in contact with the lead VSWH exposed from the resin MR, and in particular, the socket terminal STE1 is deflected by the vertical load at the time of pressing, and glides on the exposed surface of the lead VSWH along an extending direction of the lead VSWH. In the present specification, such a motion will be called wiping. As a result, in the present embodiment, the lead VSWH and the socket terminal STE1 are contacted with each other by the projecting portion PJ1 and the projecting portion PJ2. In other words, the projecting portion PJ1 and the projecting portion PJ2 formed in the socket terminal STE1 are contacted with the solder film SF formed on the top surface of the lead VSWH after being pressed. Meanwhile, the socket terminal STE illustrated in FIG. 25, for example, is in contact with the lead VIN exposed from the resin MR. Even in the socket terminal STE, the socket terminal STE is deflected and causes wiping by the vertical load at the time of pressing.

On the other hand, FIG. 36 illustrates a connection mode between the socket terminal and each of the lead VSWH and the lead PGND to be used in the test process of the low-side MOS chip.

As illustrated in FIG. 36, the characteristic socket terminal STE1 in the present embodiment is in contact with the lead VSWH exposed from the resin MR, and in particular, the socket terminal STE1 is deflected and causes wiping by the vertical load at the time of pressing. As a result, in the present embodiment, the lead VSWH and the socket terminal STE1 are contacted with each other by the projecting portion PJ1 and the projecting portion PJ2. In other words, the projecting portion PJ1 and the projecting portion PJ2 formed in the socket terminal STE1 are contacted with the solder film SF formed on the top surface of the lead VSWH after being pressed. In the same manner, the characteristic socket terminal STE1 in the present embodiment is also in contact with the lead PGND exposed from the resin MR, and in particular, the socket terminal STE1 is deflected and causes wiping by the vertical load at the time of pressing. As a result, in the present embodiment, the lead PGND and the socket terminal STE1 are contacted with each other by the projecting portion PJ1 and the projecting portion PJ2. In other words, the projecting portion PJ1 and the projecting portion PJ2 formed in the socket terminal STE1 are contacted with the solder film SF formed on the top surface of the lead PGND after being pressed.

As described above, the device to be inspected TD1 is fixed to the test socket TS and then the test process of evaluating the thermal resistance of the high-side MOS chip configuring the DC/DC converter is performed. To be specific, the test process of evaluating the thermal resistance of the high-side MOS chip is performed, for example, in accordance with the flowchart illustrated in FIG. 17.

FIG. 37 is a diagram illustrating a current path in the test process of evaluating the thermal resistance of the high-side MOS chip. In FIG. 37, the test process of evaluating the thermal resistance of the high-side MOS chip is performed by causing current to flow into the high-side MOS chip (not illustrated) from a force terminal HS-F provided in the test socket TS, via the lead VSWH of the device to be inspected TD1, and then causing the current to flow out from a force terminal HD-F via the lead VIN of the device to be inspected TD1. At this time, in FIG. 37, the chip mounting portion TAB (H) is electrically connected to the lead VIN, and the chip mounting portion TAB (H) is connected to a sense terminal HD-S of the test socket TS by the pogo pin PG2. Meanwhile, some leads VSWH among the plurality of leads VSWH are leads in which the current does not flow, and the some leads VSWH in which the current does not flow are connected to a sense terminal HS-S of the test socket TS. Further, the electrical characteristic of the high-side MOS chip is inspected based on a voltage signal between the sense terminal HD-S and the sense terminal HS-S. To be specific, VF of the body diode formed in the high-side MOS chip is measured.

Thereafter, the test process of evaluating the thermal resistance of the low-side MOS chip configuring the DC/DC converter is performed. To be specific, the test process of evaluating the thermal resistance of the low-side MOS chip is performed in accordance with the flowchart illustrated in FIG. 21, for example.

FIG. 38 is a diagram illustrating a current path in the test process of evaluating the thermal resistance of the low-side MOS chip. In FIG. 38, the test process of evaluating the thermal resistance of the low-side MOS chip is performed by causing current to flow into the low-side MOS chip (not illustrated) from a force terminal LS-F provided in the test socket TS, via the lead PGND of the device to be inspected TD1, and then causing the current to flow out from a force terminal LD-F via the lead VSWH of the device to be inspected TD1. At this time, in FIG. 38, the chip mounting portion TAB (L) is electrically connected to the lead VSWH, and the chip mounting portion TAB (L) is connected to a sense terminal LD-S of the test socket TS by the pogo pin PG1. Meanwhile, some leads PGND among the plurality of leads PGND are leads in which the current does not flow, and the some leads PGND in which the current does not flow are connected to a sense terminal LS-S of the test socket TS. Further, the electrical characteristic of the low-side MOS chip is inspected based on a voltage signal between the sense terminal LD-S and the sense terminal LS-S. To be specific, VF of the body diode formed in the low-side MOS chip is measured.

As described above, the test process according to the present embodiment is performed, so that it is possible to sort a non-defective device to be inspected having a favorable heat dissipation characteristic, and a defective device to be inspected of which the heat dissipation characteristic does not satisfy the reference. Further, the non-defective device to be inspected having passed the test process according to the present embodiment is shipped as a product (the semiconductor device PK1). In this manner, it is possible to manufacture the semiconductor device according to the present embodiment.

<Representative Effect According to Embodiment>

According to the present embodiment, it is possible to obtain the effects as follows.

(1) According to the present embodiment, the projecting portion PJ1 and the projecting portion PJ2 are provided in the end portion PU of the socket terminal STE1, as illustrated in FIG. 39, for example. In this manner, for example, it is possible to enable contact between the lead LD and the socket terminal STE1 in which the large current flows at the two points by the contact using the projecting portion PJ1 and by the contact using the projecting portion PJ2. As a result, the current flowing from the socket terminal STE1 to the lead LD flows by being dispersed into the path flowing in the projecting portion PJ1 and the path flowing in the projecting portion PJ2. Accordingly, even in a case where the large current is caused to flow between the socket terminal STE1 and the lead LD, it is possible to suppress the increase in the temperature of the contact portion between the socket terminal STE1 and the lead LD. In this manner, according to the present embodiment, the mechanism illustrated in the flowchart of FIG. 26 hardly occurs, and accordingly, it is possible to suppress the generation of the defective appearance of the semiconductor device and the reduction in service life of the socket terminal STE1.

For example, it is considered that the contact resistance and the Joule heat are also stabilized to be lower as the contact area of the lead and the socket terminal becomes larger. In this regard, in the case of the socket terminal STE illustrated in FIG. 25, it is difficult to entirely contact the socket terminal with the lead to be parallel to the lead, and it is considered that the socket terminal is in the state of being in local contact with the lead in practice. In this case, it is considered that the contact area decreases, superiority in area of the socket terminal becomes low, and conversely, the contact resistance increases, and the Joule heat increases. In addition, even if a state close to the entire contact is formed, it is easy to receive influence of the insulating film or the like to be formed in the contact portion, so that there is a concern on deterioration in the contact. On the contrary, in a case where the projecting portion PJ1 and the projecting portion PJ2 are provided in the end portion PU like the present embodiment, since the two-point contact is secured although the contact area is not increased so much, the contact resistance is stabilized to a relatively low value. Further, since the current dispersion effect is also obtained according to the two-point contact, it is also possible to suppress the generation of the Joule heat.

(2) According to the present embodiment, the height of the projecting portion PJ1 is higher than the height of the projecting portion PJ2 as illustrated in FIG. 30, for example. In this manner, the projecting portion PJ1 and the projecting portion PJ2 provided in the end portion PU becomes exactly the same height when the socket terminal STE1 is deflected by pressing the lead PGND against the socket terminal STE1. As a result, according to the present embodiment, it is possible to reliably enable contact between the lead LD and the socket terminal STE1 using both the projecting portion PJ1 and the projecting portion PJ2. In this manner, it is possible to improve the reliability of the two-point contact using the projecting portion PJ1 and the projecting portion PJ2, and it is possible to improve stability of the contact resistance.

(3) In addition, according to the present embodiment, the top surface of the projecting portion PJ1 and the projecting portion PJ2 is subjected to the surface roughening treatment, and the concavo-convex shape is formed on the top surface as illustrated in FIG. 31, for example. Thus, it is possible to secure the plurality of contact points through the concavo-convex shape. As a result, the contact resistance is further stabilized to a lower value. Further, since the current dispersion effect and the effect of increasing the contact area by the multiple-point contact are also obtained, it is possible to obtain the effect of further reducing the Joule heat.

(4) Further, according to the present embodiment, the contact is caused by a plurality of small concavo-convex shapes, and thus, a particle diameter of a solder scrap thus generated is smaller as compared to a case of a smooth plate-shaped contact. In this manner, it is considered that the excluded solder scraps, which drop without adhering to the socket terminal STE1, increase when the particle diameter of the excluded solder scrap decreases, and accordingly, deposition of the solder material to the socket terminal STE1 due to the repeated contact is also suppressed. As a result, it is possible to improve the reduction in service life of the socket terminal STE1.

(5) In addition, the structure of the socket terminal STE1 according to the present embodiment in which the projecting portion PJ1 and the projecting portion PJ2 are provided in the end portion PU is not a complicated structure but a simple structure, and further, is excellent from the viewpoint of the space saving in a socket size or the like.

For example, although the projecting portion PJ1 and the projecting portion PJ2 are provided in the end portion PU of the socket terminal STE1 in the present embodiment, a configuration in which two socket terminals having a single projecting portion are contacted with one lead may be considered, as a configuration by which the same effect can be obtained. However, in such a configuration, it is difficult to obtain the space saving since the two socket terminals are necessary for the one lead, and further, it is difficult to adopt a configuration of increasing a thickness of each of the socket terminals in order to lower a resistance value of the socket terminal. On the contrary, since the two projecting portion PJ1 and projecting portion PJ2 are provided in the one socket terminal STE1 in the socket terminal STE1 according to the present embodiment, it is easy to obtain the space saving. Further, it is also easy to adjust the thickness of the socket terminal STE1 (in particular, the plate-like portion BU and the end portion PU) in order to lower the resistance value of the socket terminal STE1. Accordingly, it is said that the socket terminal STE1 according to the present embodiment has superiority from such a viewpoint.

(6) Further, according to the socket terminal STE1 in the present embodiment, the existing test socket can be replaced by exchanging the socket terminal without requiring remanufacturing of a change kit such as a test board and a fixing jig. As a result, there is also superiority in terms of the cost. Further, it is possible to obtain the increase in service life according to the socket terminal STE1 in the present embodiment, and thus, it is also possible to obtain the effect of cost reduction. In addition, since there is no need for preparing two socket terminals with respect to one lead unlike a Kelvin type, for example, but it is only necessary to prepare one socket terminal STE1 with respect to one lead regarding a unit price of the socket terminal STE1, there is superiority in terms of the cost from such a viewpoint.

(7) The socket terminal STE1 according to the present embodiment is effective when being adopted for a test process of a product in which a large current equal to or greater than 2 A is caused to flow, in particular. However, since it is possible to obtain the effect of stabilizing the contact resistance by the multiple-point contact, the present invention can be applied widely to the test process of the device to be inspected without being limited to the test process of the product in which the large current equal to or greater than 2 A is caused to flow as described above.

<Trace According to Test Process in Embodiment>

Finally, a description will be made regarding a trace left in the semiconductor device when performing the test process according to the present embodiment to the device to be inspected. FIG. 40 is a diagram illustrating the rear surface of the semiconductor device PK1 after performing the test process according to the present embodiment. In FIG. 40, the trace, which is caused by performing the test process according to the present embodiment, is left, for example, in some of the leads LD (leads LD that are diagonally shaded). Hereinafter, such a point will be described.

FIG. 41 is a diagram illustrating a state of the top surface of the lead LD1 and the lead LD2 exposed from the resin MR. As illustrated in FIG. 41, it is understood that a trace TRC1A and a trace TRC2A are formed, respectively, in the lead LD1 and the lead LD2.

Here, the trace TRC1A illustrated in FIG. 41 is a trace caused by wiping of the projecting portion PJ1 provided in the end portion PU of the socket terminal STE1 illustrated in FIG. 30. On the other hand, a trace TRC2A illustrated in FIG. 41 is a trace caused by wiping of the projecting portion PJ2 provided in the end portion PU of the socket terminal STE1 illustrated in FIG. 30. In addition, FIG. 41 is the trace under a condition in which the surface roughening treatment is not performed with respect to the top surface of the projecting portion PJ1 and the projecting portion PJ2.

As illustrated in FIG. 41, it is understood that a length L1 of the trace TRC1A caused by the wiping of the projecting portion PJ1 is longer than a length L2 of the trace TRC2A caused by the wiping of the projecting portion PJ2. This is because the height of the projecting portion PJ1 is higher than the height of the projecting portion PJ2, and the projecting portion PJ1 is in contact with the lead from the step of disposing the device to be inspected on the test socket, and accordingly, the length of wiping thereof becomes long. On the other hand, the projecting portion PJ2 is not in contact with the lead in the step of disposing the device to be inspected on the test socket (see FIGS. 32 and 33), but is in contact with the lead for the first time in a state where the socket terminal is deflected in the step of supplying the vertical load to the semiconductor device (see FIGS. 35 and 36). Thus, the length of the wiping of the projecting portion PJ2 having the low height is shorter than the length of the wiping of the projecting portion PJ1 described above. As a result, the length L1 of the trace TRC1A caused by the wiping of the projecting portion PJ1 is longer than the length L2 of the trace TRC2A caused by the wiping of the projecting portion PJ2. In other words, the length L2 of the trace TRC2A caused by the wiping of the projecting portion PJ2 is shorter than the length L1 of the trace TRC1A caused by the wiping of the projecting portion PJ1.

FIG. 42 is a diagram illustrating a state of the top surface of the lead LD1 and the lead LD2 exposed from the resin MR. As illustrated in FIG. 42, it is understood that a trace TRC1B and a trace TRC2B are formed, respectively, in the lead LD1 and the lead LD2.

Here, the trace TRC1B illustrated in FIG. 42 is a trace caused by wiping of the projecting portion PJ1 provided in the end portion PU of the socket terminal STE1 illustrated in FIG. 30. On the other hand, the trace TRC2B illustrated in FIG. 42 is a trace caused by wiping of the projecting portion PJ2 provided in the end portion PU of the socket terminal STE1 illustrated in FIG. 30. In addition, FIG. 42 is the trace under a condition in which the roughening surface treatment is performed with respect to the top surface of the projecting portion PJ1 and the projecting portion PJ2 to form the concavo-convex shape.

As illustrated in FIG. 42, it is understood that a plurality of the traces parallel to each other in a linear shape are formed reflecting the concavo-convex shape formed on the top surface of the projecting portion PJ1 and the projecting portion PJ2, differently from the case of FIG. 41. In addition, similarly to the case of FIG. 41, in the case of FIG. 42, it is understood that the length L1 of the trace TRC1B caused by the wiping of the projecting portion PJ1 is longer than the length L2 of the trace TRC2B caused by the wiping of the projecting portion PJ2.

As described above, in a case where the traces illustrated in FIGS. 41 and 42 are confirmed at least in apart of the top surface of the lead in the semiconductor device, which has been shipped as the product, for example, the trace becomes a positive evidence that the test process according to the present embodiment has been performed. That is, at least in a case where the traces having different lengths are formed in line along a long-side direction of the lead, it is possible to consider that the test process according to the present embodiment has been performed on the semiconductor device.

In the foregoing, the invention made by the inventors of the present invention has been concretely described based on the embodiments. However, it is needless to say that the present invention is not limited to the foregoing embodiments and various modifications and alterations can be made within the scope of the present invention.

Modification Example 1

For example, the embodiment has been described exemplifying the semiconductor device in which the high-side MOS chip, the low-side MOS chip and the driver IC chip are mounted thereon, but the present invention is not limited thereto, and other semiconductor chips may not be mounted as long as the low-side MOS chip is mounted onto the semiconductor device. It is possible to apply the technical idea according to the embodiment also to the semiconductor device on which only the high-side MOS chip and the low-side MOS chip are mounted as illustrated in FIG. 43, and to the semiconductor device on which only the low-side MOS chip is mounted as illustrated in FIG. 44, for example.

In addition, for example, in a case where the semiconductor device is a product in which a large current equal to or greater than 2 A is caused to flow, it is possible to apply the technical idea according to the embodiment without being limited to the semiconductor device on which the low-side MOS chip is mounted.

Further, the package structure of the semiconductor device is not limited to the QFN (Quad Flat Non-Leaded package), and may be a QFP (Quad Flat Package), an SON (Small Outline Non-Leaded package) or an SOP (Small Outline Package).

Modification Example 2

The embodiment has been described regarding the example in which the technical idea according to the embodiment is applied to the socket terminal in contact with the lead PGND and the lead VSWH as illustrated in FIG. 28, for example, but it is also possible to apply the socket terminal according to the embodiment to the socket terminal in contact with the lead VIN or another lead (for example, the lead to be connected to the driver IC chip).

Modification Example 3

The socket terminal according to the embodiment has been described regarding the example in which a plurality of the projecting portions are respectively subjected to the surface roughening treatment to form the concavo-convex shape, but the surface roughening treatment may not be performed onto the top surface of the projecting portion as long as at least the plurality of projecting portions are provided.

Modification Example 4

In the embodiment, for example, as illustrated in FIG. 5, the low-side MOS clip CLP (L) is used for the electrical connection between the low-side MOS chip CHP(L) and the lead LD, and the high-side MOS clip CLP (H) is used for the electrical connection between the high-side MOS chip CHP (H) and the chip mounting portion TAB (L). However, the present invention is not limited thereto, and a wire may be used instead of the low-side MOS clip CLP (L) and the high-side MOS clip CLP (H). However, from the viewpoint of reducing on-resistance, it is desirable to use the low-side MOS clip CLP (L) and the high-side MOS clip CLP (H) as compared to the wire.

Modification Example 5

In the embodiment, the solder is used for the connection between the chip mounting portion TAB (L) and the low-side MOS chip CHP(L) to be mounted onto the chip mounting portion TAB (L), and the connection between the low-side MOS chip CHP(L) and the low-side MOS clip CLP (L). In the same manner, the solder is used for the connection between the chip mounting portion TAB (H) and the high-side MOS chip CHP(H) to be mounted onto the chip mounting portion TAB (H), and the connection between the high-side MOS chip CHP(H) and the high-side MOS clip CLP (H). However, the present invention is not limited thereto, and the silver paste may be used instead of the solder. But, from the viewpoint of reducing the on-resistance, it is desirable to use the solder than the silver paste.

Modification Example 6

The embodiment has been described regarding the example in which the plurality of leads PGND and the plurality of leads VSWH are present, for example, and the test process of the device to be inspected TD1 is performed by contacting the socket terminal STE1 with each of the leads. However, the technical idea according to the embodiment is not limited thereto, and even in a device to be inspected where only a single lead PGND and a single lead VSWH are present, for example, it is possible to perform the test process by contacting the socket terminal according to the embodiment with the lead.

Modification Example 7

The embodiment has been described regarding the example in which the test process of the low-side MOS chip and the test process of the high-side MOS chip are performed by one common test socket, but, for example, a test socket to be used in the test process of the low-side MOS chip and a test socket to be used in the test process of the high-side MOS chip may be prepared separately. In this case, the first socket terminal and the second socket terminal to be used in the test process of the low-side MOS chip and the third socket terminal and the fourth socket terminal to be used in the test process of the high-side MOS chip are all different components.

Modification Example 8

The embodiment has been described regarding the example in which the test process of the low-side MOS chip and the test process of the high-side MOS chip are performed in the one common test socket. At this time, in the embodiment, the lead VSWH as the external terminal of the device to be inspected is used to be shared in both the test process of the low-side MOS chip and the test process of the high-side MOS chip. In other words, the lead VSWH is used as the output terminal of current in the test process of the low-side MOS chip, and is used as the input terminal of current in the test process of the high-side MOS chip.

However, it is possible to apply the technical idea according to the embodiment to another mode, for example, in which the test process of the low-side MOS chip and the test process of the high-side MOS chip are performed in one common test socket. To be specific, it is possible to apply the technical idea of the present invention also to a case where the lead VSWH (for convenience, referred to as VSWH1) for testing the low-side MOS chip, and the lead VSWH (for convenience, referred to as VSWH2) for testing the high-side MOS chip are configured using different leads among the plurality of leads VSWH. In this case, a socket terminal which is contacted with the lead VSWH1 for testing the low-side MOS chip becomes the second socket terminal, and a socket terminal which is contacted with the lead VSWH2 for testing the high-side MOS chip becomes the third socket terminal. Further, the second socket terminal and the third socket terminal become different components.

Further, a combination of the modification examples can be applied without departing from the gist of the technical ideas described in the embodiments.

EXPLANATION OF REFERENCE NUMERALS 1S semiconductor substrate
AR Region
BC body contact region
BD body diode
BD1 body diode
BD2 body diode
BU plate-like portion
BY main body portion
C capacitor
CC control circuit
CH channel layer
CHP(C) driver IC chip
CHP(H) high-side MOS chip
CHP(L) low-side MOS chip
CLP (H) high-side MOS clip (conductive member)
CLP (L) low-side MOS clip (conductive member)
DR drain region
DT dicing tape
EP epitaxial layer
GE gate electrode
GH lead (external terminal)
GL lead (external terminal)
GND ground (reference potential)
GOX gate insulating film
GP (H) gate electrode pad
GP (L) gate electrode pad
HD handler
HD-F force terminal
HD-S sense terminal
HS-F force terminal
HS-S sense terminal
HS1 high melting point solder
HS2 high melting point solder
IF insulating film
$I_H$ current
$I_L$ current
$I_M$ reference current
L inductor
L1 length
L2 length
LD lead (external terminal)
LD1 lead (external terminal)
LD2 lead (external terminal)
LD-F force terminal
LD-S sense terminal
LS-F force terminal
LS-S sense terminal
LF1 lead frame
MPJ microprojection
MR resin
NA node
PD electrode pad
PG1 pogo pin
PG2 pogo pin
PG3 pogo pin
PGND lead (external terminal)
PJ1 projecting portion
PJ2 projecting portion
PK1 semiconductor device (semiconductor package)

PR product region
PU end portion
RL load
RU housing portion
QH high-side MOS transistor
QL low-side MOS transistor
SF solder film
SL source wiring
SP(H) source electrode pad
SP(L) source electrode pad
SPT support portion
SR source region
STE socket terminal
STE1 socket terminal
SW solder whisker
TAB (C) chip mounting portion
TAB (H) chip mounting portion
TAB (L) chip mounting portion
TD1 device to be inspected (assembly)
TE1 input terminal
$T_H$ time
$T_L$ time
$T_{OFF}$ off-period
$T_{ON}$ on-period
TR trench
TR2 trench
TRC1A trace
TRC1B trace
TRC2A trace
TRC2B trace
TS test socket
VIN lead (external terminal)
Vin input voltage
Vout output voltage
VSWH lead (external terminal)
W wire (conductive member)

The invention claimed is:

1. A method of manufacturing a semiconductor device, comprising:
(a) electrically connecting a first semiconductor chip with a first external terminal, and electrically connecting the first semiconductor chip with a second external terminal;
(b) after (a), sealing the first semiconductor chip such that a part of each of the first external terminal and the second external terminal is exposed, and forming a sealing body;
(c) after (b), forming a first conductive film on the part of the first external terminal exposed from the sealing body, and forming a second conductive film on the part of the second external terminal exposed from the sealing body;
(d) after (c), disposing a device to be inspected, which has been manufactured according to (a) through (c), in a housing portion of a socket, contacting a first socket terminal provided in the socket with the first external terminal via the first conductive film, and contacting a second socket terminal provided in the socket with the second external terminal via the second conductive film; and
(e) after (d), supplying a first current value to between the first socket terminal and the second socket terminal for a first time duration, and inspecting an electrical characteristic of the first semiconductor chip,
wherein each of the first socket terminal and the second socket terminal includes:
a main body portion including a support portion,
a plate-like portion connected to the support portion, and including an end portion projected toward the device, and
a plurality of projecting portions integrally provided in the end portion,
wherein the first semiconductor chip is disposed on a first chip mounting portion,
wherein a rear surface of the first chip mounting portion is exposed from the sealing body, and
wherein, in the inspecting the electrical characteristic of the first semiconductor chip, a test terminal, different from a plurality of the socket terminals, is contacted with the rear surface of the first chip mounting portion.

2. The method of manufacturing the semiconductor device according to claim 1,
wherein the device to be inspected further includes:
a second semiconductor chip having a smaller planar size than a planar size of the first semiconductor chip;
a third external terminal and a fourth external terminal which are electrically connected to the second semiconductor chip;
the sealing body that seals the second semiconductor chip such that a part of each of the third external terminal and the fourth external terminal is exposed;
a third conductive film formed on the part of the third external terminal; and
a fourth conductive film formed on the part of the fourth external terminal,
wherein, in inspecting an electrical characteristic of the second semiconductor chip, a third socket terminal provided in the socket is contacted with the third external terminal via the third conductive film, a fourth socket terminal provided in the socket is contacted with the fourth external terminal via the fourth conductive film, and further, a second current value, which is smaller than the first current value, is supplied to between the third socket terminal and the fourth socket terminal for a second time duration, thereby inspecting the electrical characteristic of the second semiconductor chip.

3. The method of manufacturing the semiconductor device according to claim 2,
wherein, in the inspecting the electrical characteristic of the first semiconductor chip, the first socket terminal functions as an input terminal, and the second socket terminal functions as an output terminal, and
wherein, in the inspecting the electrical characteristic of the second semiconductor chip, the third socket terminal functions as an input terminal, and the fourth socket terminal functions as an output terminal.

4. The method of manufacturing the semiconductor device according to claim 2,
wherein the second time duration is the same as the first time duration.

5. The method of manufacturing the semiconductor device according to claim 2,
wherein the device to be inspected further includes:
a third semiconductor chip having a smaller planar size than a planar size of the first semiconductor chip;
a fifth external terminal electrically connected to the third semiconductor chip;
the sealing body that seals the third semiconductor chip such that a part of the fifth external terminal is exposed; and a fifth conductive film formed on the part of the fifth external terminal, wherein, in inspecting an electrical characteristic of the third semiconductor chip, a fifth socket terminal provided in the socket is contacted with the fifth external terminal via the fifth conductive film, wherein the fifth socket terminal includes:

the main body portion including the support portion, and the plate-like portion connected to the support portion, and including an end portion projected toward the device.

6. The method of manufacturing the semiconductor device according to claim 5, wherein the plurality of projecting portions are not formed in the end portion of the plate-like portion provided in the fifth socket terminal.

7. The method of manufacturing the semiconductor device according to claim 5, wherein the device to be inspected includes a component of a DC/DC converter.

8. The method of manufacturing the semiconductor device according to claim 7, wherein a low-side MOSFET, which is a component of the DC/DC converter, is formed in the first semiconductor chip, a high-side MOSFET, which is a component of the DC/DC converter, is formed in the second semiconductor chip, and a control circuit, which performs an on/off control of the low-side MOSFET and an on/off control of the high-side MOSFET, is formed in the third semiconductor chip.

9. The method of manufacturing the semiconductor device according to claim 1, wherein each top surface of the plurality of projecting portions has a concavo-convex shape.

10. The method of manufacturing the semiconductor device according to claim 1, wherein the plurality of projecting portions includes:

a first projecting portion; and a second projecting portion formed closer to a side of the support portion than the first projecting portion, wherein a height of the first projecting portion is higher than a height of the second projecting portion.

11. The method of manufacturing the semiconductor device according to claim 1, wherein the first chip mounting portion is electrically connected to the second socket terminal by disposing the device to be inspected in the socket, wherein the test terminal is a voltage sense terminal, and wherein, in (e), the electrical characteristic of the first semiconductor chip is inspected based on a voltage signal acquired from the test terminal which is contacted with the rear surface of the first chip mounting portion.

12. The method of manufacturing the semiconductor device according to claim 11, wherein the test terminal is configured using a pogo pin.

13. The method of manufacturing the semiconductor device according to claim 1, wherein the first current value is equal to or higher than 2 A.

14. The method of manufacturing the semiconductor device according to claim 1, wherein the first conductive film and the second conductive film are solder films.

15. The method of manufacturing the semiconductor device according to claim 1, wherein the first external terminal is connected to the first semiconductor chip via a clip.

* * * * *